United States Patent
Song et al.

(10) Patent No.: US 12,490,437 B2
(45) Date of Patent: Dec. 2, 2025

(54) NON-VOLATILE MEMORY DEVICE AND METHOD OF MANUFACTURING THE SAME

(71) Applicant: SAMSUNG ELECTRONICS CO., LTD., Suwon-si (KR)

(72) Inventors: Younggul Song, Hwaseong-si (KR); Junyeong Seok, Seoul (KR); Eun chu Oh, Hwaseong-si (KR); Minho Kim, Seongnam-si (KR); Byungchul Jang, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 522 days.

(21) Appl. No.: 18/047,270

(22) Filed: Oct. 17, 2022

(65) Prior Publication Data
US 2023/0118956 A1 Apr. 20, 2023

(30) Foreign Application Priority Data

Oct. 18, 2021 (KR) .................. 10-2021-0138836
Jan. 27, 2022 (KR) .................. 10-2022-0012579

(51) Int. Cl.
*H10B 43/27* (2023.01)
*G11C 16/08* (2006.01)
(Continued)

(52) U.S. Cl.
CPC ............. *H10B 43/27* (2023.02); *G11C 16/08* (2013.01); *H01L 23/5226* (2013.01);
(Continued)

(58) Field of Classification Search
CPC ........ H10B 43/10; H10B 41/10; H10B 43/35; H10B 41/50; H10B 43/50; H10B 43/27;
(Continued)

(56) References Cited

U.S. PATENT DOCUMENTS 7,115,493 B2  10/2006  Forbes
7,842,557 B2  11/2010  Motoi et al.
(Continued)

FOREIGN PATENT DOCUMENTS

JP  4476919  6/2010
KR  10-2012-0002750  1/2012
(Continued)

OTHER PUBLICATIONS

J A. Ávila-Niñoa, et al., "A simple method for fabrication of anitfuse Worm memories," Applied Surface Science 454 (2018), pp. 256-261.
(Continued)

*Primary Examiner* — Galina G Yushina
(74) *Attorney, Agent, or Firm* — Morgan, Lewis & Bockius LLP

(57) ABSTRACT

A non-volatile memory device includes a substrate, a stack structure that includes a first gate layer that extends in a horizontal direction and a second gate layer that extends in the horizontal direction and is disposed apart from the first gate layer in a vertical direction, a plurality of first channel structures that penetrate in the vertical direction through a first channel region of the stack structure, a plurality of second channel structures that penetrate in the vertical direction through a second channel region of the stack structure, a first anti-fuse structure and a second anti-fuse structure that each penetrate in the vertical direction through an anti-fuse region of the stack structure, a first anti-fuse transistor that is electrically connected to the first gate layer through the first anti-fuse structure, and a second anti-fuse transistor that is electrically connected to the second gate layer through the second anti-fuse structure.

19 Claims, 32 Drawing Sheets

(51) Int. Cl.
  *H01L 23/522* (2006.01)
  *H01L 23/525* (2006.01)
  *H01L 23/528* (2006.01)
  *H10B 41/10* (2023.01)
  *H10B 41/27* (2023.01)
  *H10B 41/35* (2023.01)
  *H10B 43/10* (2023.01)
  *H10B 43/35* (2023.01)

(52) U.S. Cl.
  CPC ...... *H01L 23/5252* (2013.01); *H01L 23/5283* (2013.01); *H10B 41/10* (2023.02); *H10B 41/27* (2023.02); *H10B 41/35* (2023.02); *H10B 43/10* (2023.02); *H10B 43/35* (2023.02)

(58) Field of Classification Search
  CPC ........ H10B 41/27; H10B 41/35; G11C 16/08; H01L 23/5226; H01L 23/5283; H01L 23/5252
  See application file for complete search history.

(56) References Cited

U.S. PATENT DOCUMENTS

| | | | |
|---|---|---|---|
| 8,158,967 | B2 | 4/2012 | Tang et al. |
| 8,624,331 | B2 | 1/2014 | Kim et al. |
| 8,829,646 | B2 | 9/2014 | Lung et al. |
| 8,836,076 | B2 | 9/2014 | Nagayama |
| 9,842,802 | B2 | 12/2017 | Wang et al. |
| 10,032,791 | B2 | 7/2018 | Lee et al. |
| 10,048,744 | B2 | 8/2018 | Jeong et al. |
| 10,049,744 | B2 | 8/2018 | Jeong et al. |
| 10,236,249 | B2 | 3/2019 | Lee et al. |
| 10,340,279 | B2 | 7/2019 | Shiimoto |
| 10,529,736 | B2 | 1/2020 | Song et al. |
| 10,566,388 | B2 | 2/2020 | Zhang |
| 10,665,606 | B2 | 5/2020 | Baek et al. |
| 10,898,918 | B2 | 1/2021 | Oh et al. |
| 2007/0045708 | A1* | 3/2007 | Lung ........................ H01L 23/50 257/E27.071 |
| 2012/0181701 | A1* | 7/2012 | Chen ................... H01L 23/5226 257/774 |
| 2015/0145012 | A1* | 5/2015 | Chen ..................... H10B 43/20 257/314 |
| 2015/0279479 | A1 | 10/2015 | Li |
| 2018/0102371 | A1* | 4/2018 | Shiimoto ............... H10B 20/25 |
| 2019/0148505 | A1* | 5/2019 | Eom ...................... H10B 43/40 257/324 |
| 2020/0013791 | A1 | 1/2020 | Or-Bach et al. |
| 2021/0013791 | A1 | 1/2021 | Weidermann et al. |
| 2021/0118903 | A1 | 4/2021 | Yun et al. |

FOREIGN PATENT DOCUMENTS

| | | |
|---|---|---|
| KR | 10-2016-0138974 A | 12/2016 |
| KR | 10-2017-0086753 A | 7/2017 |
| KR | 10-2018-0012261 A | 2/2018 |
| KR | 10-2018-0066785 A | 6/2018 |

OTHER PUBLICATIONS

Seung-Eon Ahn, et al., "Stackable All-Oxide-Based Nonvolatile Memory With Al2O3 Antifuse and p-CuOx/n—InZnOx Diode," IEEE Electron Device Letters, vol. 30, No. 6, May 2009, pp. 550-552.

Extended European Search Report for EP Patent Application No. 22201793.1 Dated Mar. 16, 2023.

J.A. Ávila-Niñoa, et al., "A simple method for fabrication of antiluse Worm memories," Applied Surface Science 454 (2018), pp. 256-261.

Seung-Eon Ahn, et al., "Stackable All-Oxide-Based Nonvolatile Memory With Al2O3 Antifuse and p-CuOx/n-InZnOx Diode," IEEE Electron Device Letters, vol. 30, No. 5, May 2009, pp. 550-562.

Office Action dated Aug. 11, 2025 issued in corresponding Korean Patent Application No. 10-2022-0012579.

* cited by examiner

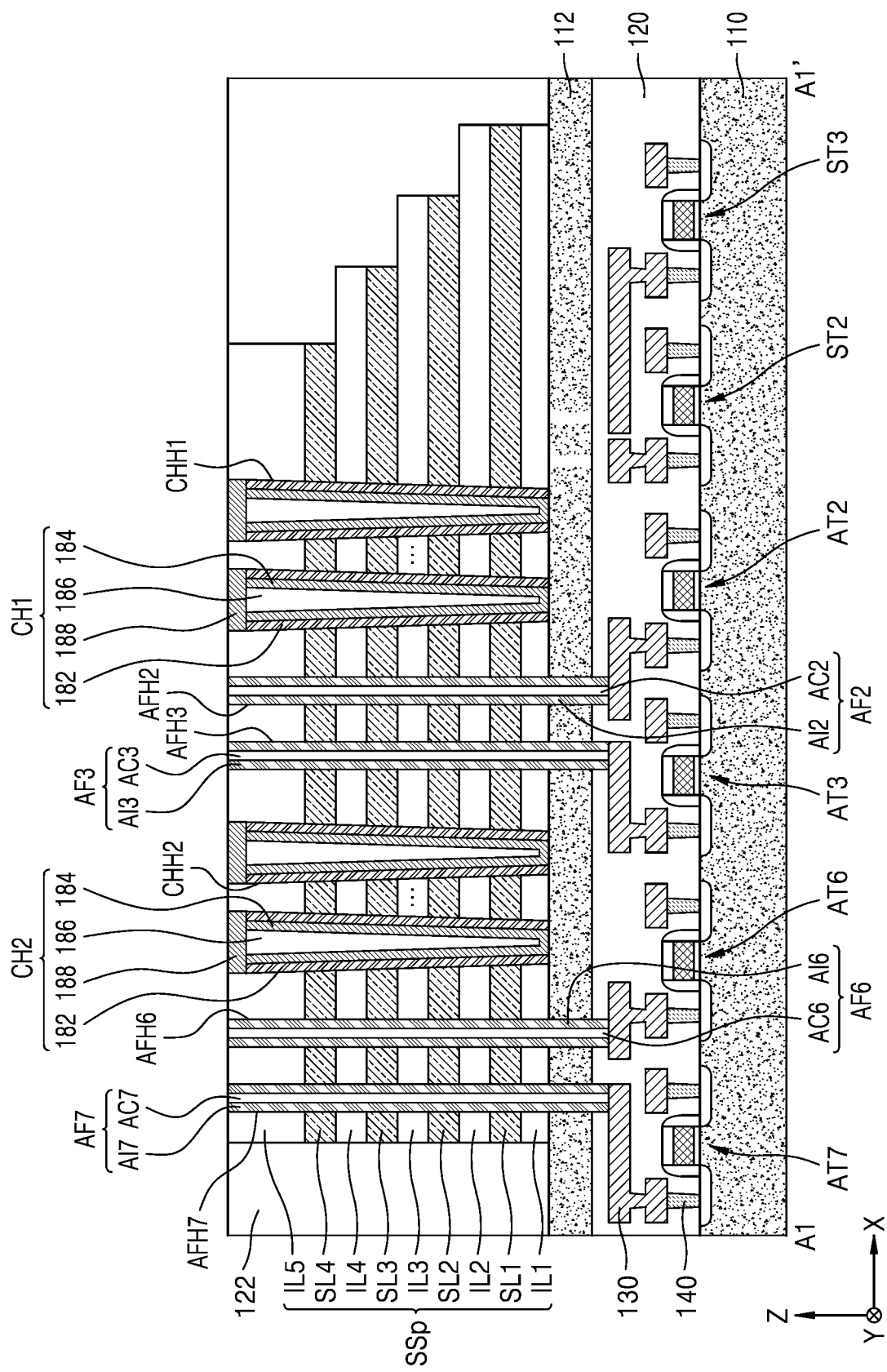

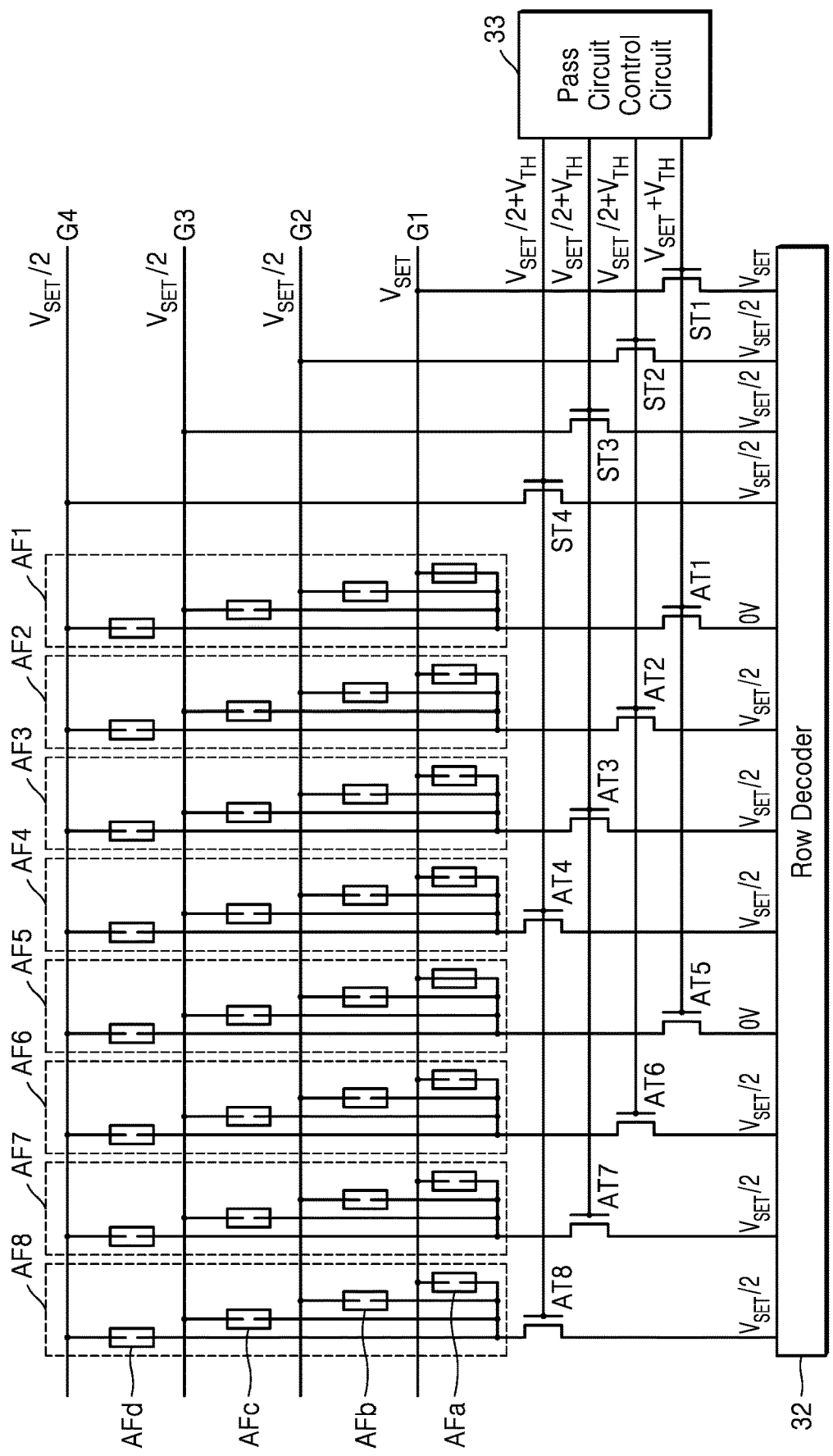

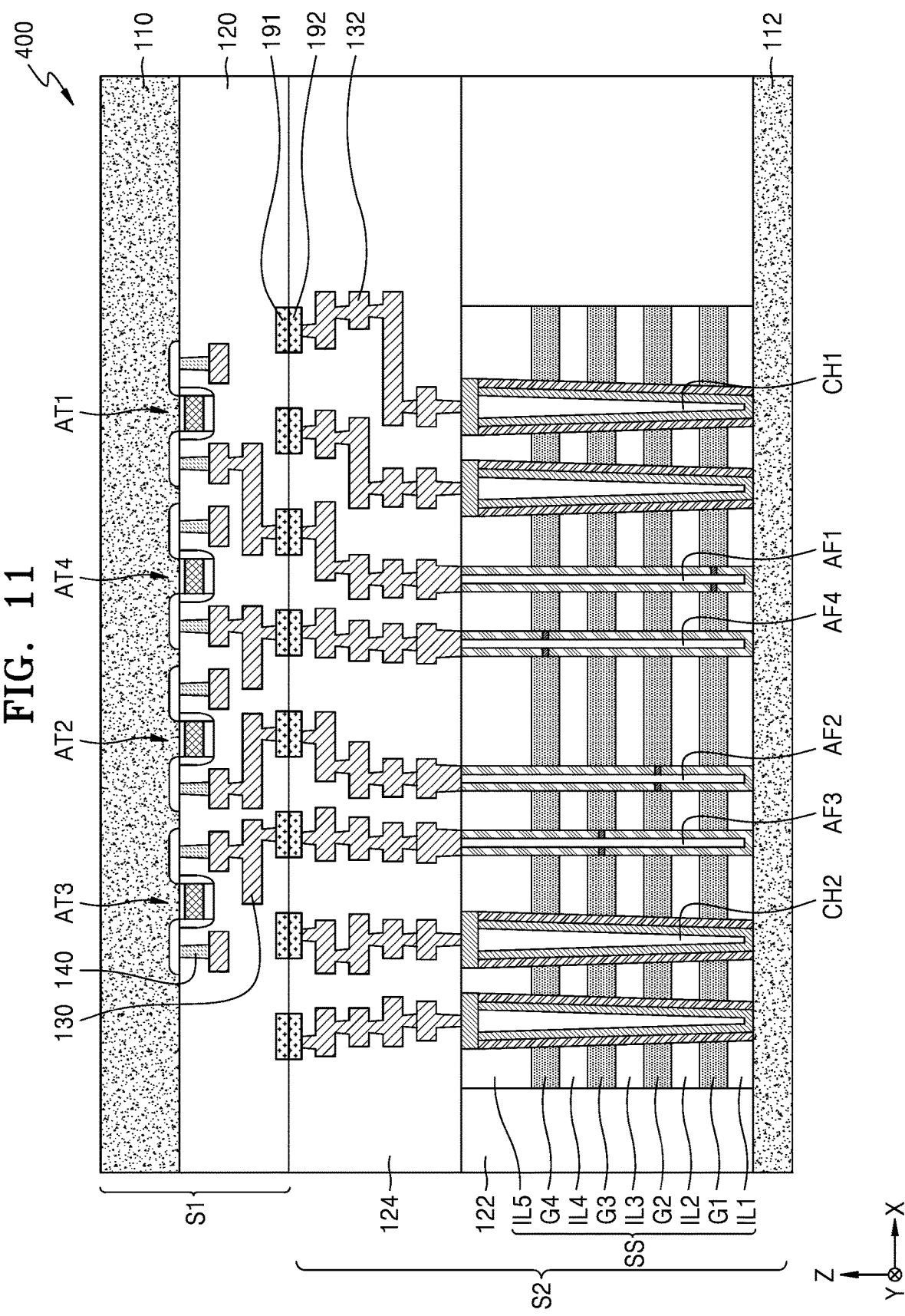

NON-VOLATILE MEMORY DEVICE AND METHOD OF MANUFACTURING THE SAME

CROSS-REFERENCE TO RELATED APPLICATIONS

This application claims priority under 35 U.S.C. § 119 from Korean Patent Application Nos. 10-2021-0138836, filed on Oct. 18, 2021, and 10-2022-0012579, filed on Jan. 27, 2022 in the Korean Intellectual Property Office, the contents of both of which are herein incorporated by reference in their entireties.

TECHNICAL FIELD

Embodiments of the inventive concept are directed to a non-volatile memory device and a method of manufacturing the same, and more particularly, to a three-dimensional flash memory device and a method of manufacturing the same.

DISCUSSION OF THE RELATED ART

In an electronic system that stores data, semiconductor devices that can store massive amounts of data are used. Therefore, methods of increasing the data storage capacity of a semiconductor device are being researched. For example, three-dimensional (3D) flash memory semiconductor devices that each include three-dimensionally arranged memory cells, instead of two-dimensionally arranged memory cells, have been proposed as a method of increasing the data storage capacity of a semiconductor device.

SUMMARY

Embodiments of the inventive concept provide a non-volatile memory device with a high operation speed and a reduced two-dimensional area.

According to an embodiment of the inventive concept, there is provided a non-volatile memory device that includes a substrate, a stack structure that includes a first gate layer that extends in a horizontal direction and a second gate layer that extends in the horizontal direction and is disposed apart from the first gate layer in a vertical direction, a plurality of first channel structures that penetrate in the vertical direction through a first channel region of the stack structure, a plurality of second channel structures that penetrate in the vertical direction through a second channel region of the stack structure, a first anti-fuse structure and a second anti-fuse structure that each penetrates in the vertical direction through an anti-fuse region of the stack structure, a first anti-fuse transistor that is electrically connected to the first gate layer through the first anti-fuse structure, and a second anti-fuse transistor that is electrically connected to the second gate layer through the second anti-fuse structure. The first channel region of the stack structure is spaced apart from the second channel region of the stack structure in the horizontal direction, and the anti-fuse region of the stack structure is disposed between the first channel region and the second channel region of the stack structure.

According to another embodiment of the inventive concept, there is provided a non-volatile memory device that includes a substrate, a stack structure that includes a first gate layer that extends in a horizontal direction on the substrate, a second gate layer that extends in the horizontal direction and is disposed apart from the first gate layer in a vertical direction, an edge portion where ends of the first gate layer and the second gate layer have a staircase shape, a first channel region next to the edge portion, and a first anti-fuse region next to the first channel region, a plurality of first channel structures that penetrate in the vertical direction through the first channel region of the stack structure, a first anti-fuse structure that includes a first anti-fuse conductor that penetrates in the vertical direction through the first anti-fuse region of the stack structure, a first anti-fuse insulator that surrounds the first anti-fuse conductor, and a first conductive path that electrically connects the first anti-fuse conductor to the first gate layer across the first anti-fuse insulator, and a second anti-fuse structure that includes a second anti-fuse conductor that penetrates in the vertical direction through the first anti-fuse region of the stack structure, a second anti-fuse insulator that surrounds the second anti-fuse conductor, and a second conductive path that electrically connects the second anti-fuse conductor to the second gate layer across the second anti-fuse insulator.

According to another embodiment of the inventive concept, there is provided a non-volatile memory device that includes a substrate, a stack structure that includes a first gate layer that extends in a horizontal direction, a second gate layer that extends in the horizontal direction and is disposed apart from the first gate layer in a vertical direction, a first channel region, a second channel region spaced apart from the first channel region in the horizontal direction, and an anti-fuse region disposed between the first channel region and the second channel region, in which a length of the first gate layer in the horizontal direction is equal to a length of the second gate layer in the horizontal direction, a plurality of first channel structures that penetrate in the vertical direction through the first channel region of the stack structure, a plurality of second channel structures that penetrate in the vertical direction through the second channel region of the stack structure, a first anti-fuse structure that includes a first anti-fuse conductor that penetrates in the vertical direction through the anti-fuse region of the stack structure, a first anti-fuse insulator that surrounds the first anti-fuse conductor, and a first conductive path that electrically connects the first anti-fuse conductor to the first gate layer across the first anti-fuse insulator, a second anti-fuse structure that includes a second anti-fuse conductor that penetrates in the vertical direction through the anti-fuse region of the stack structure, a second anti-fuse insulator that surrounds the second anti-fuse conductor, and a second conductive path that electrically connects the second anti-fuse conductor to the second gate layer across the second anti-fuse insulator, a first anti-fuse transistor that is electrically connected to the first gate layer through the first anti-fuse structure, and a second anti-fuse transistor that is electrically connected to the second gate layer through the second anti-fuse structure.

According to another embodiment of the inventive concept, there is provided a method of manufacturing a non-volatile memory device, the method including forming a non-volatile memory device and a resistance structure on a substrate. The non-volatile memory device includes a stack structure that includes a first gate layer that extends in a horizontal direction and a second gate layer that extends in the horizontal direction and is disposed apart from the first gate layer in a vertical direction, a plurality of first channel structures that penetrate in the vertical direction through a first channel region of the stack structure, a first anti-fuse structure that penetrates in the vertical direction through an anti-fuse region of the stack structure, and a second anti-fuse structure that penetrates in the vertical direction through the anti-fuse region of the stack structure The resistance structure penetrates in the vertical direction through a resistance region of the stack structure, and the resistance structure is electrically connected to the first gate layer and the second gate layer. The method further includes electrically connecting the first anti-fuse structure to the first gate layer by using the resistance structure, and electrically connecting the second anti-fuse structure to the second gate layer by using the resistance structure.

According to another embodiment of the inventive concept, there is provided a method of manufacturing a non-volatile memory device, the method including forming a non-volatile memory device, a resistance structure, and a resistance transistor on a substrate. The non-volatile memory device includes a stack structure that includes a first gate layer that extends in a horizontal direction and a second gate layer that extends in the horizontal direction and is disposed apart from the first gate layer in a vertical direction, a plurality of channel structures that penetrate in the vertical direction through a channel region of the stack structure, a first anti-fuse structure that includes a first anti-fuse conductor that penetrates in the vertical direction through the anti-fuse region of the stack structure and a first anti-fuse insulator that surrounds the first anti-fuse conductor, a second anti-fuse structure that includes a second anti-fuse conductor that penetrates in the vertical direction through the anti-fuse region of the stack structure and a second anti-fuse insulator that surrounds the second anti-fuse conductor, a first anti-fuse transistor that is electrically connected to the first gate layer through the first anti-fuse structure, and a second anti-fuse transistor that is electrically connected to the second gate layer through the second anti-fuse structure. The resistance structure penetrates in the vertical direction through a resistance region of the stack structure and is electrically connected to the first gate layer and the second gate layer. The method further includes forming, in the first anti-fuse structure, a first conductive path that electrically connects the first anti-fuse conductor to the first gate layer across the first anti-fuse insulator, and forming, in the second anti-fuse structure, a second conductive path that electrically connects the second anti-fuse conductor to the second gate layer across the second anti-fuse insulator.

According to another embodiment of the inventive concept, there is provided a method of manufacturing a non-volatile memory device, the method including forming a non-volatile memory device, a first partial resistance structure, and a second partial resistance structure. The non-volatile memory device includes a substrate, a stack structure that includes first to fourth gate layers disposed apart from each other in a vertical direction on the substrate, a plurality of channel structures that penetrate in the vertical direction through a channel region of the stack structure, and first to fourth anti-fuse structures that penetrate in the vertical direction through an anti-fuse region of the stack structure. The first partial resistance structure penetrates in the vertical direction through the first gate layer and the second gate layer and is electrically connected to the first gate layer and the second gate layer, and the second partial resistance structure penetrates in the vertical direction through the third gate layer and the fourth gate layer and is electrically connected to the third gate layer and the fourth gate layer. The method further includes electrically connecting the first anti-fuse structure and the second anti-fuse structure to the first gate layer and the second gate layer, respectively, by using the first partial resistance structure, and electrically connecting the third anti-fuse structure and the fourth anti-fuse structure to the third gate layer and the fourth gate layer, respectively, by using the second partial resistance structure.

BRIEF DESCRIPTION OF THE DRAWINGS

FIGS. 7A to 7E are cross-sectional views of a non-volatile memory device according to an embodiment.

FIGS. 7F to 7J are circuit diagrams that illustrate a method of manufacturing a non-volatile memory device, according to an embodiment.

FIG. 11 is a cross-sectional view of a non-volatile memory device according to an embodiment.

DETAILED DESCRIPTION

Figure 1:
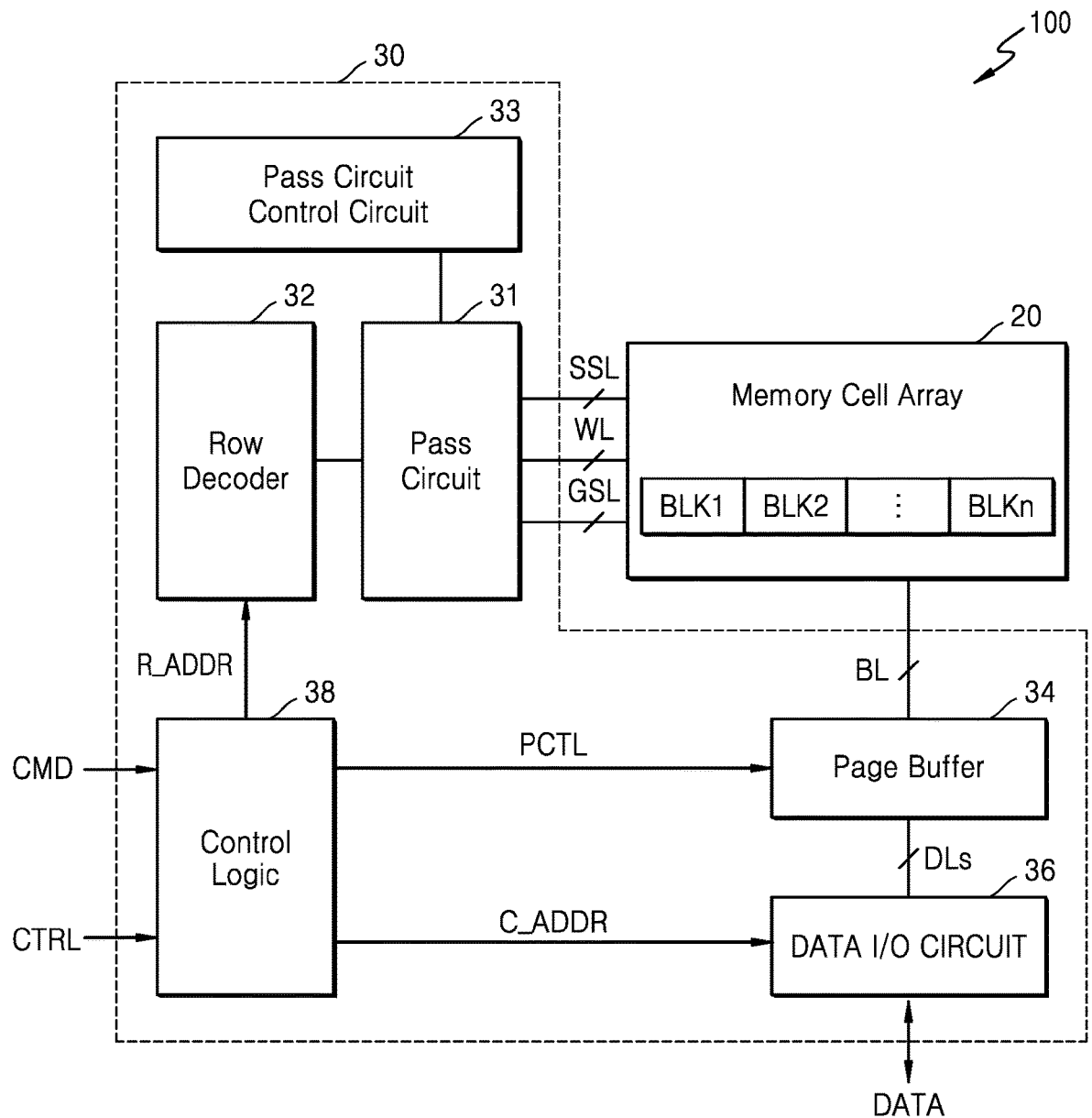
FIG. 1 is a block diagram of a non-volatile memory device according to an embodiment.

FIG. 1 is a block diagram of a non-volatile memory device 100 according to an embodiment.

Referring to FIG. 1, in an embodiment, the non-volatile memory device 100 includes a memory cell array 20 and a peripheral circuit 30. The peripheral circuit 30 includes a row decoder (a decoder circuit) 32, a pass circuit 31, a pass circuit control circuit 33, a page buffer (a buffer circuit) 34, a data input/output (I/O) circuit 36, and a control logic (a logic circuit) 38. In addition, the peripheral circuit 30 further includes a voltage generating circuit that generates various voltages used for an operating the non-volatile memory device 100, and various circuits, such as an error correction circuit that corrects errors in data read from the memory cell array 20.

The memory cell array 20 is connected to the page buffer 34 through a bit line BL and is connected to the row decoder 32 through a word line WL, a string selection line SSL, and a ground selection line GSL. The memory cell array 20 includes a plurality of memory cell blocks BLK1, BLK2, . . . , and BLKn. Each of the plurality of memory cell blocks BLK1, BLK2, . . . , and BLKn includes a plurality of memory cells. Each of the plurality of memory cells may be a flash memory cell. A detailed structure of each of the plurality of memory cell blocks BLK1, BLK2, . . . , and BLKn is described below in more detail with reference to FIG. 2.

The row decoder 32 selectively applies a voltage to the word line WL, the string selection line SSL, and the ground selection line GSL of a memory cell block, in response to a row address R_ADDR received from the control logic 38.

The pass circuit 31 includes a plurality of pass transistors. Each of turned-on pass transistors connects the row decoder 32 to one of the word line WL, the string selection line SSL, and the ground selection line GSL that are each connected to a pass transistor. A plurality of pass transistors may be connected to one word line WL, one string selection line SSL, or one ground selection line GSL. A detailed structure of the pass circuit 31 is described below with reference to FIG. 5.

The pass circuit control circuit 33 selectively turns on or off a plurality of pass transistors of the pass circuit 31. Gates of a plurality of pass transistors connected to one word line WL, one string selection line SSL, or one ground selection line GSL are connected to each other so that the plurality of pass transistors connected to the one word line WL, the one string selection line SSL, or the one ground selection line GSL can be turned on together.

The page buffer 34 is connected to the memory cell array 20 through a bit line BL. The page buffer 34, when performing a write operation, operates as a write driver that applies a voltage based on data that is to be stored in the memory cell array 20 to the bit line BL, and when performing a read operation, the page buffer 34 operates as a sense amplifier that senses the data DATA stored in the memory cell array 20. The page buffer 34 is controlled by a control signal PCTL received from the control logic 38.

The data I/O circuit 36 is connected to the page buffer 34 through a plurality of data lines DLs. The data I/O circuit 36 receives the data DATA from a memory controller when performing a write operation and provides the data DATA to the page buffer 34 on the basis of a column address C_ADDR received from the control logic 38. When performing a read operation, the data I/O circuit 36 provides read data DATA stored in the page buffer 34 to the memory controller on the basis of the column address C_ADDR received from the control logic 38. The data I/O circuit 36 transmits an input address or command to the control logic 38 or the row decoder 32.

The control logic 38 receives a command CMD and a control signal CTRL from the memory controller. The control logic 38 provides the row address R_ADDR to the row decoder 32 and provides the column address C_ADDR to the data I/O circuit 36. The control logic 38 generates various internal control signals used in the semiconductor device 10 in response to the control signal CTRL. For example, the control logic 38 adjusts a voltage level provided to the word line WL and the bit line BL when performing a memory operation, such as a write operation or an erase operation.

Figure 2:
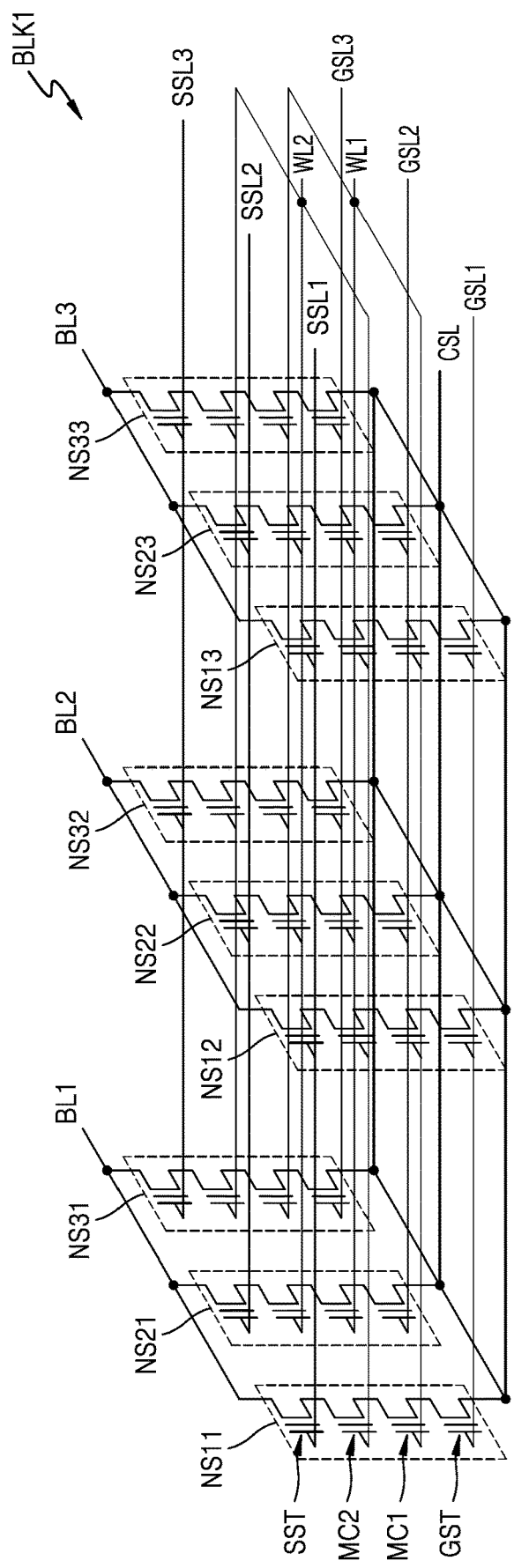
FIG. 2 is a circuit diagram of a first memory block of a non-volatile memory device according to an embodiment illustrated in FIG. 1.

FIG. 2 is a circuit diagram of a first memory block BLK1 in the non-volatile memory device 100 according to an embodiment illustrated in FIG. 1. The other memory blocks BLK2, . . . , and BLKn are the same as the first memory block BLK1.

Referring to FIG. 2, in an embodiment, the first memory block BLK1 includes a plurality of NAND cell strings NS11, NS21, NS31, NS12, NS22, NS32, NS13, NS23, and NS33, a plurality of ground selection lines to GSL1 to GSL3, a plurality of word lines WL1 and WL2, a plurality of string selection lines SSL1 to SSL3, a plurality of bit lines BL1 to BL3, and a common source line CSL. FIG. 2 shows nine NAND cell strings, three ground selection lines, two word lines, three string selection lines, and three bit lines, but the number of NAND cell strings, ground selection lines, word lines, string selection lines, and bit lines is not necessarily limited thereto and inn other embodiments, may be variously changed.

Each of the NAND cell strings NS11, NS21, NS31, NS12, NS22, NS32, NS13, NS23, and NS33 includes a ground selection transistor GST, a plurality of memory cells MC1 and MC2, and a string selection transistor SST that are serially connected to one another. FIG. 2 shows that each of the NAND cell strings NS11, NS21, NS31, NS12, NS22, NS32, NS13, NS23, and NS33 includes one ground selection transistor, two memory cells, and one string selection transistor, but the number of ground selection transistors, memory cells, and string selection transistors of each of the NAND cell strings NS11, NS21, NS31, NS12, NS22, NS32, NS13, NS23, and NS33 is not necessarily limited thereto and in other embodiments, may be variously changed.

A gate of each ground transistor GST is connected to one of the plurality of ground selection lines to GSL1 to GSL3. A gate of each first memory cell MC1 is connected to the first word line WL1. A gate of each second memory cell MC2 is connected to the second word line WL2. A gate of the string selection transistor SST is connected to one of the plurality of string selection lines to SSL1 to SSL3.

First to third NAND cell strings NS11, NS21, and NS31 are connected between a first bit line BL1 and the common source line CSL. Fourth to sixth NAND cell strings NS12, NS22, and NS32 are connected between a second bit line BL2 and the common source line CSL. Seventh to ninth NAND cell strings NS13, NS23, and NS33 are connected between a third bit line BL3 and the common source line CSL.

NAND cell strings connected to one bit line in common configure one column. For example, the first to third NAND cell strings NS11, NS21, and NS31 connected to the first bit line BL1 configure a first column. The fourth to sixth NAND cell strings NS12, NS22, and NS32 connected to the second bit line BL2 configure a second column. The seventh to ninth NAND cell strings NS13, NS23, and NS33 connected to the third bit line BL3 configure a third column.

NAND cell strings connected to one string selection line configure one row. For example, the first, fourth, and seventh NAND cell strings NS11, NS12, and NS13 connected to the first string selection line SSL1 configure a first row. The second, fifth, and eighth NAND cell strings NS21, NS22, and NS23 connected to the second string selection line SSL2 configure a second row. The third, sixth, and ninth NAND cell strings NS31, NS32, and NS33 connected to the third string selection line SSL3 configure a third row.

Figure 3:
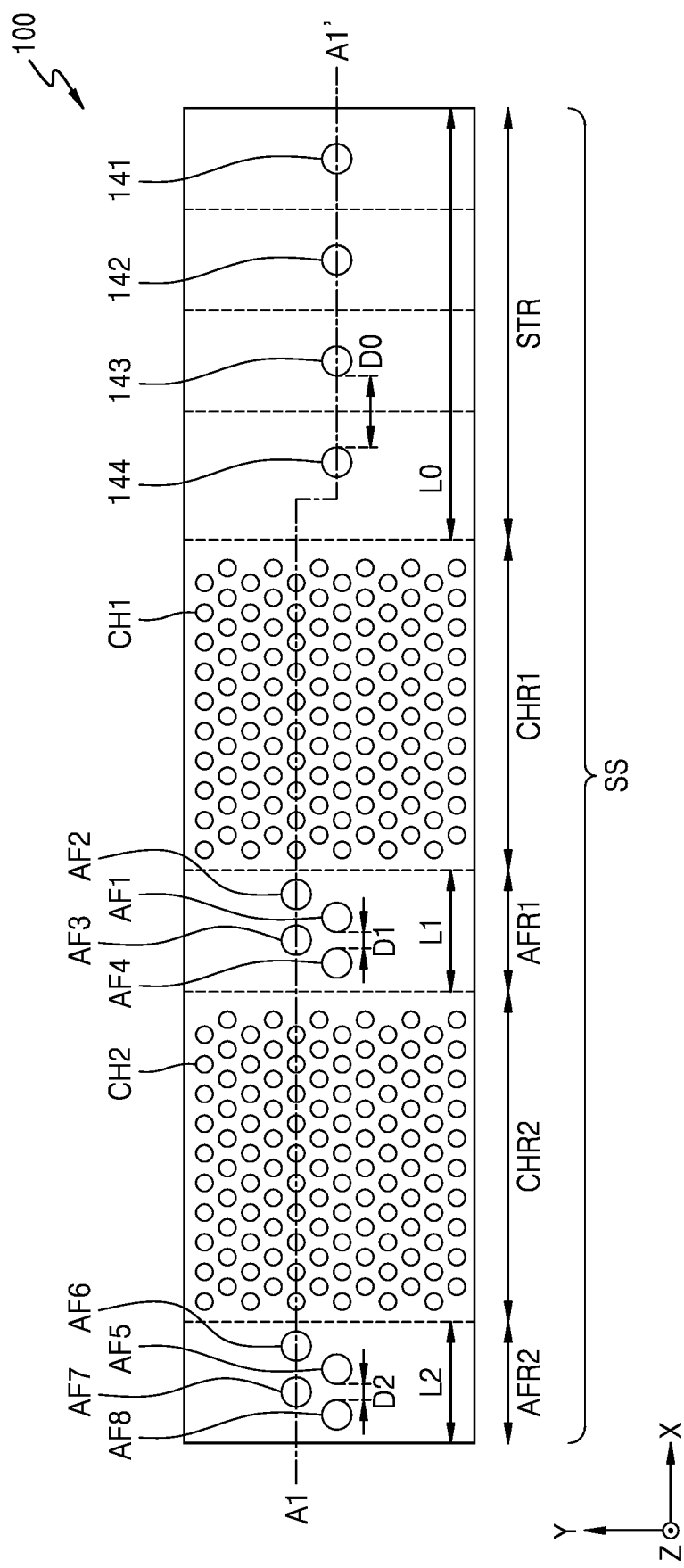
FIG. 3 is a plan view of a non-volatile memory device according to an embodiment.
Figure 4:
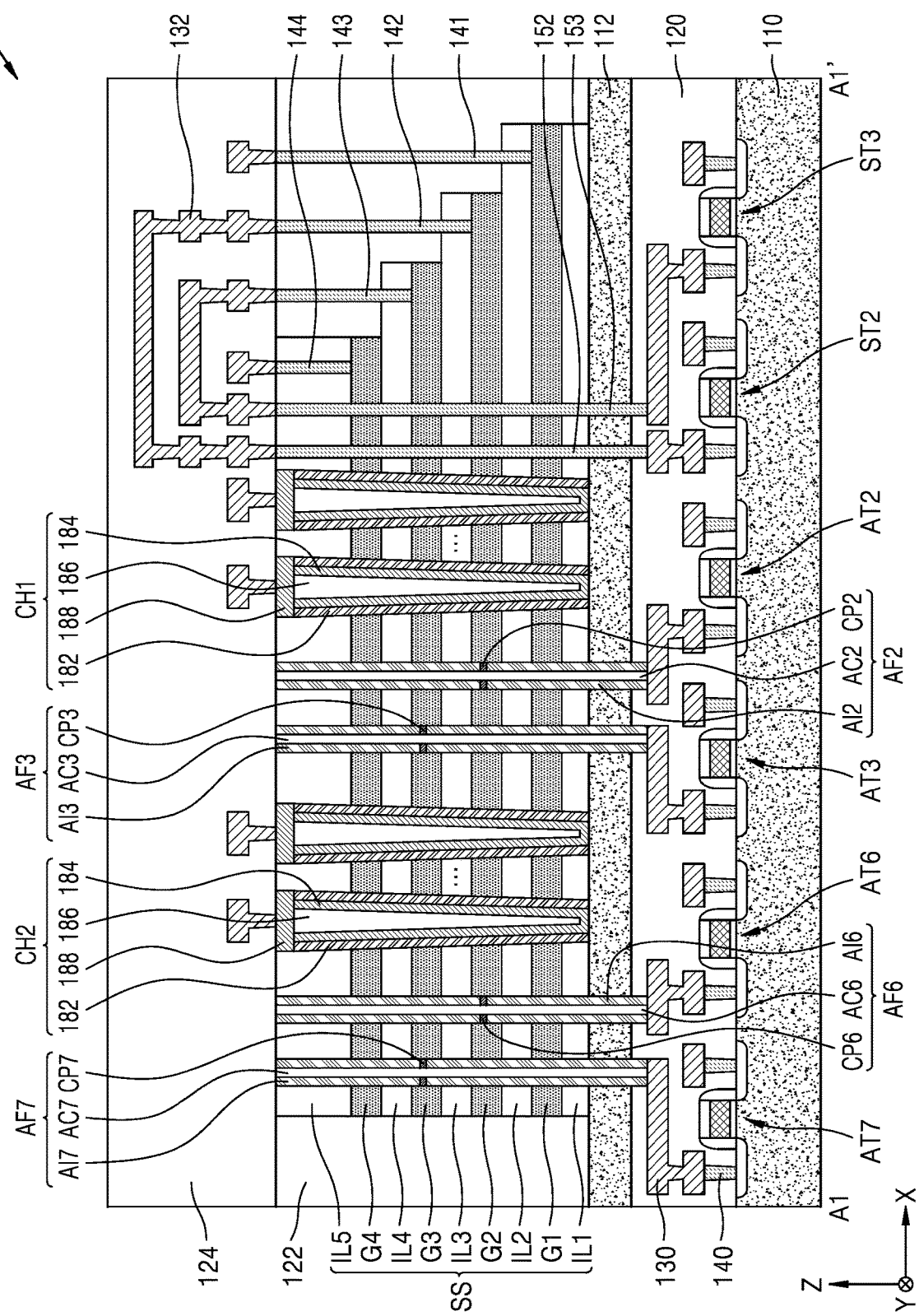
FIG. 4 is a cross-sectional view, taken along line A1-A1' of FIG. 3 of a non-volatile memory device according to an embodiment.
Figure 5:
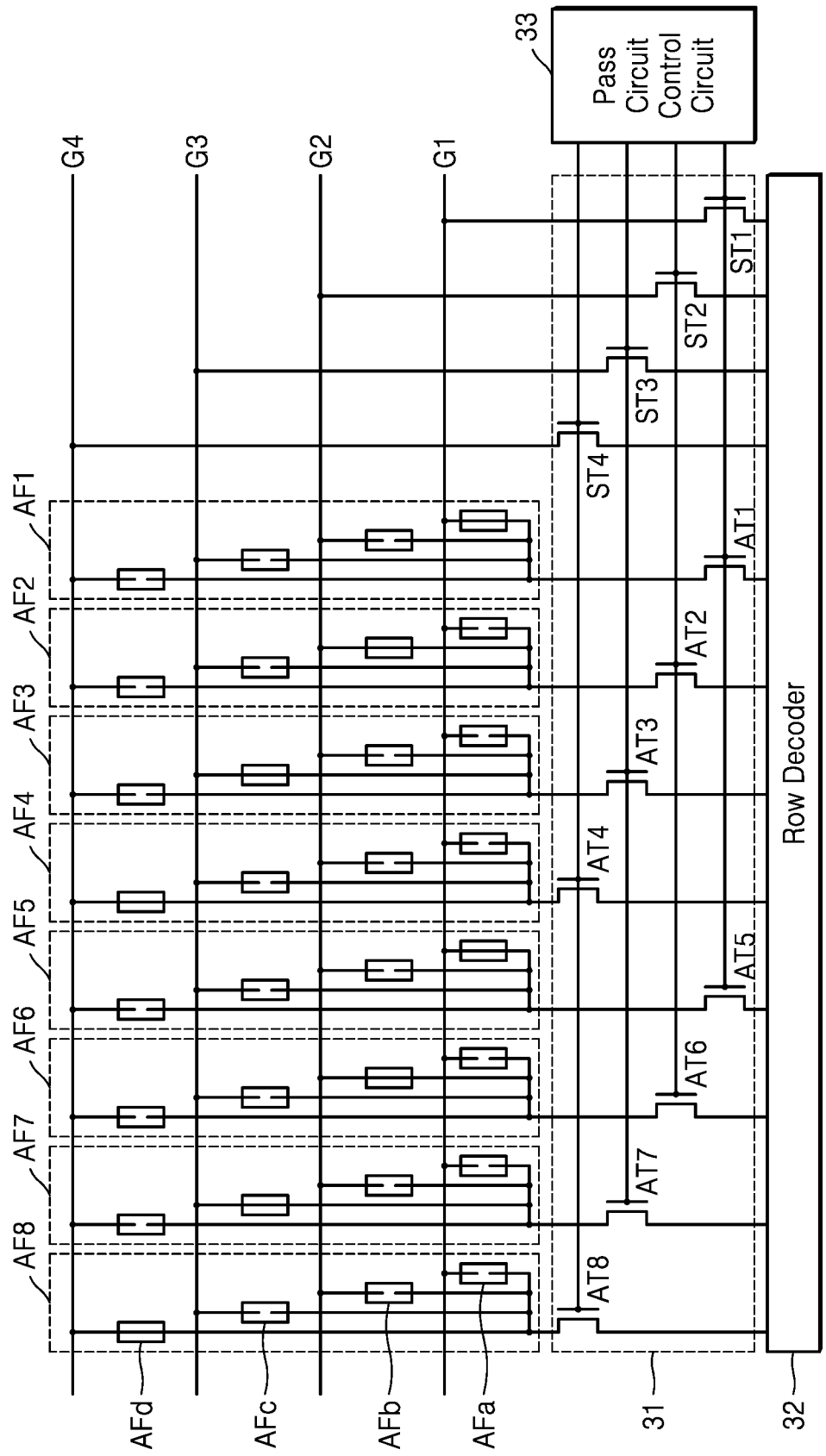
FIG. 5 is a circuit diagram of a portion of a non-volatile memory device according to an embodiment.

FIG. 3 is a plan view of a non-volatile memory device 100 according to an embodiment. FIG. 4 is a cross-sectional view taken along line A1-A1' of FIG. 3 of the non-volatile memory device 100 according to an embodiment. FIG. 5 is a circuit diagram of a portion of the non-volatile memory device 100 according to an embodiment.

Referring to FIGS. 3 to 5, in an embodiment, the non-volatile memory device 100 includes a first substrate 110. The first substrate 110 includes a semiconductor material, such as silicon (Si), germanium (Ge), or a combination thereof.

The non-volatile memory device 100 furthers include the peripheral circuit 30 (see FIG. 1) on the first substrate 110. For example, the pass circuit 31, the row decoder 32, the pass circuit control circuit 33, the page buffer 34, the data I/O circuit 36, and the control logic 38 are disposed on the first substrate 110. The pass circuit 31, as illustrated in FIG. 5, includes first to fourth step transistors ST1 to ST4 and first to eighth anti-fuse transistors AT1 to AT8. FIG. 5 shows that the pass circuit 31 includes four step transistors and eight anti-fuse transistors, but the number of step transistors and the number of anti-fuse transistors in the pass circuit 31 is not necessarily limited thereto and in other embodiments, may be variously changed. FIG. 4 shows that the second step transistor ST2, the third step transistor ST3, the second anti-fuse transistor AT2, the third anti-fuse transistor AT3, the sixth anti-fuse transistor AT6, and the seventh anti-fuse transistor AT7 are disposed on the first substrate 110.

The non-volatile memory device 100 further includes a first interconnect structure 130 that connects to the peripheral circuit 30 (see FIG. 1). The first interconnect structure 130 includes a plurality of conductive lines and a plurality of conductive vias. The plurality of conductive lines and the plurality of conductive vias include, for example, at least one of copper (Cu), tungsten (W), aluminum (Al), gold (Au), silver (Ag), nickel (Ni), tantalum (Ta), titanium (Ti), tantalum nitride (TaN), titanium nitride (TiN), or a combination thereof.

The non-volatile memory device 100 further includes a contact 140 that connects the peripheral circuit 30 to the interconnect structure 130. The contact 140 includes, for example, at least one of Cu, W, Al, Au, Ag, Ni, Ta, Ti, TaN, TiN, or a combination thereof.

The non-volatile memory device 100 further includes a first insulation layer 120 that surrounds the first interconnect structure 130 and the contacts 140. The first insulation layer 120 covers the first substrate 110 and a peripheral circuit, such as the second step transistor ST2, the third step transistor ST3, the second anti-fuse transistor AT2, the third anti-fuse transistor AT3, the sixth anti-fuse transistor AT6, and the seventh anti-fuse transistor AT7. The first insulation layer 120 includes at least one of silicon oxide, silicon nitride, a low-k material, or a combination thereof.

The non-volatile memory device 100 further includes a second substrate 112 on the first insulation layer 120. The second substrate 112 includes a semiconductor material, such as at least one of Si, Ge, or a combination thereof.

The non-volatile memory device 100 furthers include a stack structure SS disposed on the second substrate 112. The stack structure SS includes first to fifth interlayer insulation layers IL1 to IL5 and first to fourth gate layers G1 to G4 that are alternately stacked one-by-one. For example, the first to fourth gate layers G1 to G4 are spaced apart from each other in a vertical direction (a Z direction) by the first to fifth interlayer insulation layers IL1 to IL5. The first to fifth interlayer insulation layers IL1 to IL5 and the first to fourth gate layers G1 to G4 extend in a first horizontal direction (an X direction). The first to fifth interlayer insulation layers IL1 to IL5 include at least one of silicon oxide, silicon nitride, or a combination thereof. The first to fourth gate layers G1 to G4 include a conductive material, such as at least one of W, Ni, cobalt (Co), Ta, tungsten nitride (WN), TiN, TaN, or a combination thereof.

The stack structure SS, as illustrated in FIG. 3, includes a step region STR, a first channel region CHR1, a first anti-fuse region AFR1, a second channel region CHR2, and a second anti-fuse region AFR2. FIG. 3 shows the stack structure SS as including one step region, two channel regions, and two anti-fuse regions, but the numbers of step regions, channel regions, and anti-fuse regions included in the stack structure SS are not necessarily limited thereto and in other embodiments, may be variously changed.

The step region STR of the stack structure SS, as illustrated in FIG. 4, includes end portions of the first to fourth gate layers G1 to G4 and the first to fifth interlayer insulation layers IL1 to IL5, and the end portions of the first to fourth gate layers G1 to G4 and the first to fifth interlayer insulation layers IL1 to IL5 have a staircase shape. The second anti-fuse region AFR2 of the stack structure SS, as illustrated in FIG. 4, includes opposite end portions of the first to fourth gate layers G1 to G4 and the first to fifth interlayer insulation layers IL1 to IL5, and edges of the opposite end portions of the first to fourth gate layers G1 to G4 and the first to fifth interlayer insulation layers IL1 to IL5 are aligned in a vertical direction (a Z direction).

The first channel region CHR1 is located between the step region STR1 and the first anti-fuse region AFR1. The first anti-fuse region AFR1 is located between the first channel region CHR1 and the second channel region CHR2. The second channel region CHR2 is located between the first anti-fuse region AFR1 and the second anti-fuse region AFR2.

A plurality of first channel structures CH1 penetrate through the first channel region CHR1 of the stack structure SS in the vertical direction (the Z direction). A plurality of second channel structures CH2 penetrate through the second channel region CHR2 of the stack structure SS in the vertical direction (the Z direction). Each of the plurality of first channel structures CH1 and the plurality of second channel structures CH2 includes a gate dielectric layer 182, a channel layer 184, a buried insulation layer 186, and a pad 188.

The channel layer 184 contacts the second substrate 112 and penetrates through the stack structure SS in the vertical direction (the Z direction). The channel layer 184 has a hollow cylinder shape. The channel layer 184 includes one of polysilicon or poly-germanium. A space surrounded by the channel layer 184 is filled with the buried insulation layer 186. The buried insulation layer 186 includes, for example, an insulating material, such as one of silicon oxide, silicon nitride, or a combination thereof. In some embodiments, the buried insulation layer 186 is omitted. For example, the channel layer 184 has a pillar shape. The pad 188 is disposed on the buried insulation layer 186 and contacts the channel layer 184. The pad 188 includes one of polysilicon, a metal, a metal nitride, or a combination thereof. The metal includes, for example, one of W, Ni, Co, or Ta.

The gate dielectric layer 182 extends between the channel layer 184 and the stack structure SS. The gate dielectric layer 182 includes a tunneling dielectric layer, a charge storage layer, and a blocking dielectric layer that are sequentially stacked on the channel layer 184. The tunneling dielectric layer includes one of silicon oxide ($SiO_2$), hafnium oxide ($HfO_2$), aluminum oxide ($Al_2O_3$), zirconium oxide ($ZrO_2$), tantalum oxide ($Ta_2O_5$), or a combination thereof. The charge storage layer includes one of SiN, boron nitride (BN), or polysilicon. The blocking dielectric layer includes one of $SiO_2$, SiN, $HfO_2$, $Al_2O_3$, $ZrO_2$, $Ta_2O_5$, or a combination thereof.

Each of the plurality of first channel structures CH1, the plurality of second channel structures CH2 and the first to fourth gate layers G1 to G4 configure one of the plurality of NAND strings NS11, NS21, NS31, NS12, NS22, NS32, NS13, NS23, and NS33 illustrated in FIG. 2. Each of the plurality of first channel structures CH1, the plurality of second channel structures CH2 and the first gate layer G1 configure the ground selection transistor GST illustrated in FIG. 2. Each of the plurality of first channel structures CH1, the plurality of second channel structures CH2 and the second gate layer G2 configure the first memory cell MC1 illustrated in FIG. 2. Each of the plurality of first channel structures CH1, the plurality of second channel structures CH2 and the third gate layer G3 configure the second memory cell MC2 illustrated in FIG. 2. Each of the plurality of first channel structures CH1, the plurality of second channel structures CH2 and the fourth gate layer G4 configure the string selection transistor SST illustrated in FIG. 2.

In addition, the first gate layer G1 includes a plurality of portions that are spaced apart from each other in a second horizontal direction (a Y direction), and the plurality of portions of the first gate layer G1 respectively correspond to the plurality of ground selection lines GSL1 to GSL3 illustrated in FIG. 2. The second gate layer G2 corresponds to the first word line WL1 illustrated in FIG. 2. The third gate layer G3 corresponds to the second word line WL2 illustrated in FIG. 2. The fourth gate layer G4 includes a plurality of portions that are spaced apart from each an in the second horizontal direction (the Y direction), and the plurality of portions of the fourth gate layer G4 respectively correspond to the plurality of string selection lines SSL1 to SSL3 illustrated in FIG. 2.

In some embodiments, the non-volatile memory device 100 further includes a common source line layer interposed between the second substrate 112 and the stack structure SS. The common source line layer corresponds to the common source line CSL illustrated in FIG. 2. In other embodiments, the common source line CSL is formed in the second substrate 112.

The non-volatile memory device 100 further includes first to fourth contact plugs 141 to 144. The first to fourth contact plugs 141 to 144 extend in the vertical direction (the Z direction) and respectively contact end portions of the first to fourth gate layers G1 to G4. The first to fourth contact plugs 141 to 144 each include, for example, one of Cu, W, Al, Au, Ag, Ni, Ta, Ti, TaN, TiN, or a combination thereof.

The non-volatile memory device 100 further includes a second interconnect structure 132 that connects between the plurality of first channel structures CH1, the plurality of second channel structures CH2, the first to fourth contact plugs 141 to 144, the first to eighth anti-fuse structures AF1 to AF8, and the plurality of connection vias 152 and 153. The second interconnect structure 132 includes a plurality of conductive lines and a plurality of conductive vias. The plurality of conductive lines and the plurality of conductive vias include, for example, one of Cu, W, Al, Au, Ag, Ni, Ta, Ti, TaN, TiN, or a combination thereof.

The non-volatile memory device 100 further includes a plurality of connection vias 153 and 152 that extend in the vertical direction (the Z direction) and to electrically connect the second interconnect structure 132 to the first interconnect structure 130. The plurality of connection vias 152 and 153 connect the plurality of contact plugs 142 and 143 to the plurality of step transistors ST2 and ST3. The plurality of connection vias 153 and 152 include, for example, one of Cu, W, Al, Au, Ag, Ni, Ta, Ti, TaN, TiN, or a combination thereof.

FIG. 4 shows the second connection via 152 that connect the second contact plug 142 to the second step transistor ST2 and the third connection via 153 that connect the third contact plug 143 to the third step transistor ST3, but the non-volatile memory device 100 further includes a first connection via that connects the first contact plug 141 to the first step transistor ST1 and a fourth connection via that connects the fourth contact plug 144 to the fourth step transistor ST4.

FIG. 4 shows that the second step transistor ST2 and the third step transistor ST3 are disposed under a staircase region of the stack structure SS, and the second connection via 152 and the third connection via 153 penetrate through the stack structure SS. However, in other embodiments, the second step transistor ST2 and the third step transistor ST3 are not be disposed under the staircase region of the stack structure SS, and the second connection via 152 and the third connection via 153 do not penetrate through the stack structure SS but penetrate through a second insulation layer 122.

The non-volatile memory device 100 further includes a second insulation layer 122 that covers side surfaces of the stack structure SS and the second substrate 112. The second insulation layer 122 includes one of silicon oxide, silicon nitride, a low-k material, or a combination thereof. The non-volatile memory device 100 further includes a third insulation layer 124 disposed on the second insulation layer 122. The third insulation layer 124 surrounds the second interconnect structure 132 and covers the stack structure SS, the plurality of first channel structures CH1, the plurality of second channel structures CH2, and a plurality of anti-fuse structures, such as the second, third, sixth, and seventh anti-fuse structures AF2, AF3, AF6, and AF7). The third insulation layer 124 includes one of silicon oxide, silicon nitride, a low-k material, or a combination thereof.

Each of the first to fourth anti-fuse structures AF1 to AF4 penetrates through the first anti-fuse region AFR1 of the stack structure SS in the vertical direction (the Z direction). Each of the fifth to eighth anti-fuse structures AF5 to AF8 penetrates through the second anti-fuse region AFR2 of the stack structure SS in the vertical direction (the Z direction). The first to eighth anti-fuse structures AF1 to AF8 further penetrate through the second substrate 112 and into the first insulation layer 120, and contact the first interconnect structure 130.

In addition, the first anti-fuse structure AF1 includes a first anti-fuse conductor that penetrates through the first anti-fuse region AFR1 of the stack structure SS in the vertical direction (the Z direction) and is connected to the first anti-fuse transistor AT1, a first anti-fuse insulator that surrounds the first anti-fuse conductor, and a first conductive path that electrically connects the first anti-fuse conductor to the first gate layer G1 across the first anti-fuse insulator. The first anti-fuse conductor includes one of Al, Cu, or a combination thereof. In some embodiments, the first conductive path includes the same material as at least one of the first anti-fuse conductor or the first gate layer G1. In some embodiments, the first conductive path includes an oxygen vacancy filament. The first anti-fuse insulator includes one of aluminum oxide, silicon oxide, silicon nitride, tantalum oxide, or a combination thereof.

The second anti-fuse structure AF2 includes a second anti-fuse conductor AC2 that penetrates through the first anti-fuse region AFR1 of the stack structure SS in the vertical direction (the Z direction) and is connected to the second anti-fuse transistor AT2, a second anti-fuse insulator AI2 that surrounds the second anti-fuse conductor AC2, and a second conductive path CP2 that electrically connects the second anti-fuse conductor AC2 to the second gate layer G2 across the second anti-fuse insulator AI2. The second anti-fuse conductor AC2 includes one of Al, Cu, or a combination thereof. In some embodiments, the second conductive path CP2 includes the same material as at least one of the second anti-fuse conductor AC2 or the second gate layer G2. In some embodiments, the second conductive path CP2 includes an oxygen vacancy filament. The second anti-fuse insulator AI2 includes one of aluminum oxide, silicon oxide, silicon nitride, tantalum oxide, or a combination thereof.

The third anti-fuse structure AF3 includes a third anti-fuse conductor AC3 that penetrates through the first anti-fuse region AFR1 of the stack structure SS in the vertical direction (the Z direction) and is connected to the third anti-fuse transistor AT3, a third anti-fuse insulator AI3 that surrounds the third anti-fuse conductor AC3, and a third conductive path CP3 that electrically connects the third anti-fuse conductor AC3 to the third gate layer G3 across the third anti-fuse insulator AI3. The third anti-fuse conductor AC3 includes one of Al, Cu, or a combination thereof. In some embodiments, the third conductive path CP3 includes the same material as at least one of the third anti-fuse conductor AC3 or the third gate layer G3. In some embodiments, the third conductive path CP3 includes an oxygen vacancy filament. The third anti-fuse insulator AI3 includes one of aluminum oxide, silicon oxide, silicon nitride, tantalum oxide, or a combination thereof.

In addition, the fourth anti-fuse structure AF4 includes a fourth anti-fuse conductor that penetrates through the first anti-fuse region AFR1 of the stack structure SS in the vertical direction (the Z direction) and is connected to the fourth anti-fuse transistor AT4, a fourth anti-fuse insulator that surrounds the fourth anti-fuse conductor, and a fourth conductive path that electrically connects the fourth anti-fuse conductor to the fourth gate layer G4 across the fourth anti-fuse insulator. The fourth anti-fuse conductor includes one of Al, Cu, or a combination thereof. In some embodiments, the fourth conductive path includes the same material as at least one of the fourth anti-fuse conductor or the fourth gate layer G4. In some embodiments, the fourth conductive path includes an oxygen vacancy filament. The fourth anti-fuse insulator includes one of aluminum oxide, silicon oxide, silicon nitride, tantalum oxide, or a combination thereof.

In addition, the fifth anti-fuse structure AF5 includes a fifth anti-fuse conductor that penetrates through the second anti-fuse region AFR2 of the stack structure SS in the vertical direction (the Z direction) and is connected to the fifth anti-fuse transistor AT5, a fifth anti-fuse insulator that surrounds the fifth anti-fuse conductor, and a fifth conductive path that electrically connects the fifth anti-fuse conductor to the first gate layer G1 across the fifth anti-fuse insulator. The fifth anti-fuse conductor includes one of Al, Cu, or a combination thereof. In some embodiments, the fifth conductive path includes the same material as at least one of the fifth anti-fuse conductor or the first gate layer G1.

In some embodiments, the fifth conductive path includes an oxygen vacancy filament. The fifth anti-fuse insulator includes one of aluminum oxide, silicon oxide, silicon nitride, tantalum oxide, or a combination thereof.

The sixth anti-fuse structure AF6 includes a sixth anti-fuse conductor AC6 that penetrates through the second anti-fuse region AFR2 of the stack structure SS in the vertical direction (the Z direction) and is connected to the sixth anti-fuse transistor AT6, a sixth anti-fuse insulator AI6 that surrounds the sixth anti-fuse conductor AC6, and a sixth conductive path CP6 that electrically connects the sixth anti-fuse conductor AC6 to the sixth gate layer G6 across the sixth anti-fuse insulator AI6. The sixth anti-fuse conductor AC6 includes one of Al, Cu, or a combination thereof. In some embodiments, the sixth conductive path CP6 includes the same material as at least one of the sixth anti-fuse conductor AC6 or the second gate layer G2. In some embodiments, the sixth conductive path CP6 includes an oxygen vacancy filament. The sixth anti-fuse insulator AI6 includes one of aluminum oxide, silicon oxide, silicon nitride, tantalum oxide, or a combination thereof.

The seventh anti-fuse structure AF7 includes a seventh anti-fuse conductor AC7 that penetrates through the second anti-fuse region AFR2 of the stack structure SS in the vertical direction (the Z direction) and is connected to the seventh anti-fuse transistor AT7, a seventh anti-fuse insulator AI7 that surrounds the seventh anti-fuse conductor AC7, and a seventh conductive path CP7 that electrically connects the seventh anti-fuse conductor AC7 to the third gate layer G3 across the seventh anti-fuse insulator AI7. The seventh anti-fuse conductor AC7 includes one of Al, Cu, or a combination thereof. In some embodiments, the seventh conductive path CP7 includes the same material as at least one of the seventh anti-fuse conductor AC7 or the third gate layer G3. In some embodiments, the seventh conductive path CP7 includes an oxygen vacancy filament. The seventh anti-fuse insulator AI7 includes one of aluminum oxide, silicon oxide, silicon nitride, tantalum oxide, or a combination thereof.

In addition, the eighth anti-fuse structure AF8 includes an eighth anti-fuse conductor that penetrates through the second anti-fuse region AFR2 of the stack structure SS in the vertical direction (the Z direction) and is connected to the eighth anti-fuse transistor AT8, an eighth anti-fuse insulator that surrounds the eighth anti-fuse conductor, and an eighth conductive path that electrically connects the eighth anti-fuse conductor to the fourth gate layer G4 across the eighth anti-fuse insulator. The eighth anti-fuse conductor may include Al, Cu, or a combination thereof. In some embodiments, the eighth conductive path includes the same material as at least one of the eighth anti-fuse conductor and the fourth gate layer G4. In some embodiments, the eighth conductive path includes an oxygen vacancy filament. The eighth anti-fuse insulator includes one of aluminum oxide, silicon oxide, silicon nitride, tantalum oxide, or a combination thereof.

As illustrated in FIG. 5, the first anti-fuse structure AF1 connects the first anti-fuse transistor AT1 to the first gate layer G1. For example, the first anti-fuse structure AF1 includes first to fourth anti-fuses AFa to AFd that are respectively connected between the first anti-fuse transistor AT1 and the first to fourth gate layers G1 to G4. The first anti-fuse AFa of the first anti-fuse structure AF1 is in a state in which writing is performed and connects the first anti-fuse transistor AT1 to the first gate layer G1. The second to fourth anti-fuses AFb to AFd of the first anti-fuse structure AF1 are in a state in which writing is not performed, and thus, the first anti-fuse transistor AT1 is not connected to the second to fourth gate layers G2 to G4.

The second anti-fuse structure AF2 connects the second anti-fuse transistor AT2 to the second gate layer G2. In detail, the second anti-fuse structure AF2 includes first to fourth anti-fuses AFa to AFd respectively connected between the second anti-fuse transistor AT2 and the first to fourth gate layers G1 to G4. The second anti-fuse AFb of the second anti-fuse structure AF2 is in a state in which writing is performed and connects the second anti-fuse transistor AT2 to the second gate layer G2. The first, third, and fourth anti-fuses AFa, AFc, and AFd of the second anti-fuse structure AF2 are in a state in which writing is not performed, and thus, the second anti-fuse transistor AT2 is not connected to the first, third, and fourth gate layers G1, G3, and G4.

The third anti-fuse structure AF3 connects the third anti-fuse transistor AT3 to the third gate layer G3. For example, the third anti-fuse structure AF3 includes first to fourth anti-fuses AFa to AFd respectively connected between the third anti-fuse transistor AT3 and the first to fourth gate layers G1 to G4. The third anti-fuse AFc of the third anti-fuse structure AF3 is in a state in which writing is performed and connects the third anti-fuse transistor AT3 to the third gate layer G3. The first, second, and fourth anti-fuses AFa, AFb, and AFd of the third anti-fuse structure AF3 are in a state in which writing is not performed, and thus, the third anti-fuse transistor AT3 is not connected to the first, second, and fourth gate layers G1, G2, and G4.

The fourth anti-fuse structure AF4 connects the fourth anti-fuse transistor AT4 to the fourth gate layer G4. For example, the fourth anti-fuse structure AF4 includes first to fourth anti-fuses AFa to AFd respectively connected between the fourth anti-fuse transistor AT4 and the first to fourth gate layers G1 to G4. The fourth anti-fuse AFd of the fourth anti-fuse structure AF4 is in a state in which writing is performed and connects the fourth anti-fuse transistor AT4 to the fourth gate layer G4. The first to third anti-fuses AFa to AFc of the fourth anti-fuse structure AF4 are in a state in which writing is not performed, and thus, the fourth anti-fuse transistor AT4 is not connected to the first to third gate layers G1 to G3.

The fifth anti-fuse structure AF5 connects the fifth anti-fuse transistor AT5 to the first gate layer G1. For example, the fifth anti-fuse structure AF5 includes first to fourth anti-fuses AFa to AFd respectively connected between the fifth anti-fuse transistor AT5 and the first to fourth gate layers G1 to G4. The first anti-fuse AFa of the fifth anti-fuse structure AF5 is in a state in which writing is performed and connects the fifth anti-fuse transistor AT5 to the first gate layer G1. The second to fourth anti-fuses AFb to AFd of the fifth anti-fuse structure AF5 are in a state in which writing is not performed, and thus, the fifth anti-fuse transistor AT5 is not connected to the second to fourth gate layers G2 to G4.

The sixth anti-fuse structure AF6 connects the sixth anti-fuse transistor AT6 to the second gate layer G2. For example, the sixth anti-fuse structure AF6 includes first to fourth anti-fuses AFa to AFd respectively connected between the sixth anti-fuse transistor AT6 and the first to fourth gate layers G1 to G4. The second anti-fuse AFb of the sixth anti-fuse structure AF6 is in a state in which writing is performed and connects the sixth anti-fuse transistor AT6 to the second gate layer G2. The first, third, and fourth anti-fuses AFa, AFc, and AFd of the sixth anti-fuse structure AF6 are in a state in which writing is not performed, and thus, the sixth anti-fuse transistor AT6 are not connected to the first, third, and fourth gate layers G1, G3, and G4.

The seventh anti-fuse structure AF7 connects the seventh anti-fuse transistor AT7 to the third gate layer G3. For example, the seventh anti-fuse structure AF7 includes first to fourth anti-fuses AFa to AFd respectively connected between the seventh anti-fuse transistor AT7 and the first to fourth gate layers G1 to G4. The third anti-fuse AFc of the seventh anti-fuse structure AF7 is in a state in which writing is performed and connects the seventh anti-fuse transistor AT7 to the third gate layer G3. The first, second, and fourth anti-fuses AFa, AFb, and AFd of the seventh anti-fuse structure AF7 are in a state in which writing is not performed, and thus, the seventh anti-fuse transistor AT7 is not connected to the first, second, and fourth gate layers G1, G2, and G4.

The eighth anti-fuse structure AF8 connects the eighth anti-fuse transistor AT8 to the fourth gate layer G4. For example, the eighth anti-fuse structure AF8 includes first to fourth anti-fuses AFa to AFd respectively connected between the eighth anti-fuse transistor AT8 and the first to fourth gate layers G1 to G4. The fourth anti-fuse AFd of the eighth anti-fuse structure AF8 is in a state in which writing is performed and connects the eighth anti-fuse transistor AT8 to the fourth gate layer G4. The first to third anti-fuses AFa to AFc of the eighth anti-fuse structure AF8 are in a state in which writing is not performed, and thus, the eighth anti-fuse transistor AT8 are not connected to the first to third gate layers G1 to G3.

The first to fourth step transistors ST1 to ST4 are respectively connected to the first to fourth gate layers G1 to G4. The first to fourth step transistors ST1 to ST4 and the first to eighth anti-fuse transistors AT1 to AT8 are connected to the row decoder 32 on the first substrate 110. The row decoder 32 selectively applies a voltage to the first to fourth step transistors ST1 to ST4 and the first to eighth anti-fuse transistors AT1 to AT8.

Gates of the first to fourth step transistors ST1 to ST4 and the first to eighth anti-fuse transistors AT1 to AT8 are connected to the pass circuit control circuit 33 on the first substrate 110. The pass circuit control circuit 33 selectively applies voltages to the gates of the first to fourth step transistors ST1 to ST4 and the first to eighth anti-fuse transistors AT1 to AT8.

The gates of the first step transistor ST1, the first anti-fuse transistor AT1, and the fifth anti-fuse transistor AT5 are connected to each other. Therefore, the pass circuit control circuit 33 can selectively apply the same voltage to the first step transistor ST1, the first anti-fuse transistor AT1, and the fifth anti-fuse transistor AT5. The gates of the second step transistor ST2, the second anti-fuse transistor AT2, and the sixth anti-fuse transistor AT6 are connected to each other. Therefore, the pass circuit control circuit 33 can selectively apply the same voltage to the second step transistor ST2, the second anti-fuse transistor AT2, and the sixth anti-fuse transistor AT6. The gates of the third step transistor ST3, the third anti-fuse transistor AT3, and the seventh anti-fuse transistor AT7 are connected to each other. Therefore, the pass circuit control circuit 33 can selectively apply the same voltage to the third step transistor ST3, the third anti-fuse transistor AT3, and the seventh anti-fuse transistor AT7. The gates of the fourth step transistor ST4, the fourth anti-fuse transistor AT4, and the eighth anti-fuse transistor AT8 are connected to each other. Therefore, the pass circuit control circuit 33 can selectively apply the same voltage to the fourth step transistor ST4, the fourth anti-fuse transistor AT4, and the eighth anti-fuse transistor AT8.

According to embodiments, the first gate layer G1 is connected to the row decoder 32 through the first anti-fuse transistor AT1 as well as the first step transistor ST1 and the fifth anti-fuse transistor AT5. Similarly, the second gate layer G2 is connected to the row decoder 32 through the second anti-fuse transistor AT2 as well as the second step transistor ST2 and the sixth anti-fuse transistor AT6. Similarly, the third gate layer G3 is connected to the row decoder 32 through the third anti-fuse transistor AT3 as well as the third step transistor ST3 and the seventh anti-fuse transistor AT7. Similarly, the fourth gate layer G4 is connected to the row decoder 32 through the fourth anti-fuse transistor AT4 as well as the fourth step transistor ST4 and the eighth anti-fuse transistor AT8. Accordingly, a signal transmission resistance is reduced, and thus, RC delay decreases and an operation speed of the non-volatile memory device 100 increases.

In addition, according to embodiments, the first to fourth gate layers G1 to G4 are connected to the first to eighth anti-fuse transistors AT1 to AT8 by using the first to eighth anti-fuse structures AF1 to AF8. A step region that respectively lands a plurality of contact plugs on the first to fourth gate layers G1 to G4 need not be formed. A sufficient margin distance is not needed between a plurality of contacts that respectively land a plurality of contact plugs on the first to fourth gate layers G1 to G4. For example, as illustrated in FIG. 3, a shortest distance D1 between the first to fourth anti-fuse structures AF1 to AF4 and a shortest distance D2 between the fifth to eighth anti-fuse structures AF5 to AF8 is less than a shortest distance DO between the first to fourth contact plugs 141 to 144. Therefore, a length L1 of the first anti-fuse region AFR1 in a first horizontal direction (an X direction) and a length L2 of the second anti-fuse region AFR2 in a second horizontal direction (an X direction) are each less than a length IL of the step region STR in the second horizontal direction (the X direction). Therefore, the first anti-fuse region AFR1 and the second anti-fuse region AFR2 do not occupy a two-dimensional area that is greater than that of the step region STR. Accordingly, a two-dimensional area of the non-volatile memory device 100 is reduced with respect to that of a non-volatile memory device that includes more step regions STR.

Figure 6:
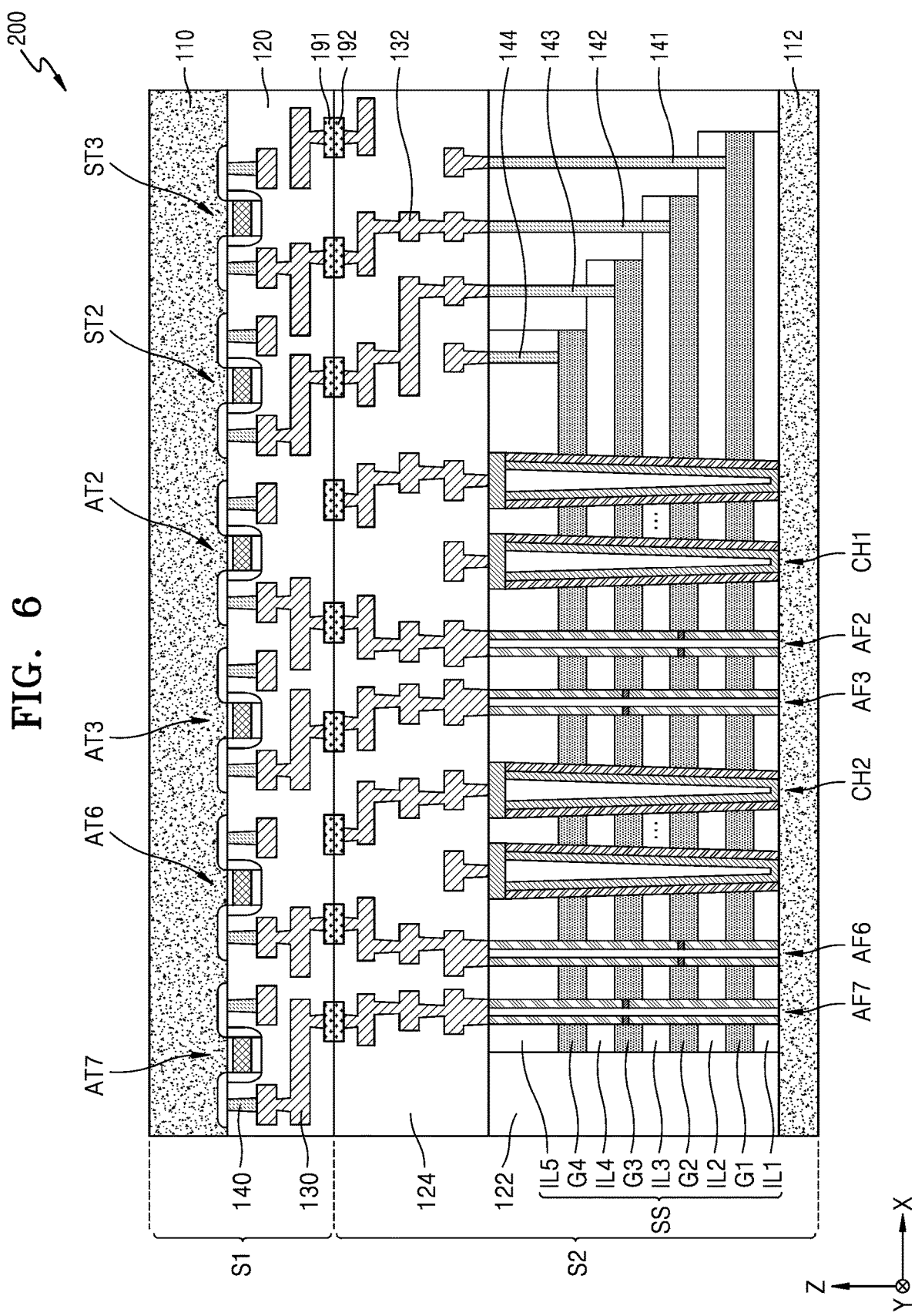
FIG. 6 is a cross-sectional view of a non-volatile memory device according to an embodiment.

FIG. 6 is a cross-sectional view of a non-volatile memory device 200 according to an embodiment. Hereinafter, a difference between the non-volatile memory device 100 illustrated in FIG. 4 and the non-volatile memory device 200 illustrated in FIG. 6 will be described.

Referring to FIG. 6, in an embodiment, the non-volatile memory device 200 includes a first structure S1 and a second structure S2 disposed on a bottom surface of the first structure S1. The first structure S1 includes a first substrate 110 and a peripheral circuit 30 (see FIG. 1) on the first substrate 110. For example, the peripheral circuit 30 includes a first step transistor, a second step transistor ST2, a third step transistor ST3, a fourth step transistor, a first anti-fuse transistor, a second anti-fuse transistor AT2, a third anti-fuse transistor AT3, a fourth anti-fuse transistor, a fifth anti-fuse transistor, a sixth anti-fuse transistor AT6, a seventh anti-fuse transistor AT7, an eighth anti-fuse transistor, a pass circuit control circuit 33 (see FIG. 1), a row decoder 32 (see FIG. 1), a page buffer 34 (see FIG. 1), a data I/O circuit 36 (see FIG. 1), and a control logic 38 (see FIG. 1). The first structure S1 further includes a first insulation layer 120 that covers the first substrate 110 and the peripheral circuit 30 (see FIG. 1). The first structure S1 further includes a plurality of first bonding pads 191 disposed on the first insulation layer 120. The plurality of first bonding pads 191 are disposed on a surface of the first insulation layer 120 that opposite to the first substrate 110. The plurality of first bonding pads 191 include Cu. The first structure S1 further includes a first interconnect structure 130 that connects the peripheral circuit 30 (see FIG. 1) to the plurality of first bonding pads 191. The first structure S1 further includes a contact 140 that connects the peripheral circuit 30 (see FIG. 1) to the first interconnect structure 130. The first insulation layer 120 surrounds the first interconnect structure 130 and the contact 140 and covers the first bonding pads 191.

The second structure S2 includes a second substrate 112, a stack structure SS disposed on the second substrate 112, a plurality of first channel structures CH1 that penetrate through a first channel region CHR1 (see FIG. 3) of the stack structure SS in a vertical direction (a Z direction), and a plurality of second channel structures CH2 that penetrate through a second channel region CHR2 (see FIG. 3) of the stack structure SS in the vertical direction (the Z direction). The second structure S2 further includes a first anti-fuse structure, a second anti-fuse structure AF2, a third anti-fuse structure AF3, and a fourth anti-fuse structure that penetrate through the first anti-fuse region AFR1 of the stack structure SS in the vertical direction (the Z direction). The second structure S2 further includes a fifth anti-fuse structure, a sixth anti-fuse structure AF6, a seventh anti-fuse structure AF7, and an eighth anti-fuse structure that penetrate through the second anti-fuse region AFR2 of the stack structure SS in the vertical direction (the Z direction). The second structure S2 further includes first to fourth contact plugs 141 to 144 that extend in the vertical direction (the Z direction) and respectively contact first to fourth gate layers G1 to G4. The second structure S2 further includes a second insulation layer 122 that covers a top surface of the second substrate 112 and a side surface of the stack structure SS. The second structure S2 further includes a third insulation layer 124 that covers the second insulation layer 122, the stack structure SS, the plurality of anti-fuse structures, the plurality of first channel structures CH1, and the plurality of second channel structures CH2. The second structure S2 further includes a plurality of second bonding pads 192 disposed on the third insulation layer 124. The plurality of second bonding pads 192 are disposed on a surface of the third insulation layer 124 that opposite to the second insulation layer 122. The plurality of second bonding pads 192 include Cu. The second structure S2 further includes a second interconnect structure 132 that connects the plurality of second bonding pads 192 to the plurality of first channel structures CH1, the plurality of second channel structures CH2, the first to eighth anti-fuse structures AF1 to AF8, and the first to fourth contact plugs 141 to 144. The third insulation layer 124 surrounds the second interconnect structure 132 and covers the second bonding pads 192.

The plurality of first bonding pads 191 respectively contact the plurality of second bonding pads 192. The first structure S1 id physically and electrically connected to the second structure S2 by Cu—Cu bonding between the plurality of first bonding pads 191 and the plurality of second bonding pads 192.

FIGS. 7A to 7E are cross-sectional views of a non-volatile memory device according to an embodiment. FIGS. 7F to 7J are circuit diagrams that illustrate a method of manufacturing a non-volatile memory device, according to an embodiment.

Figure 7A:
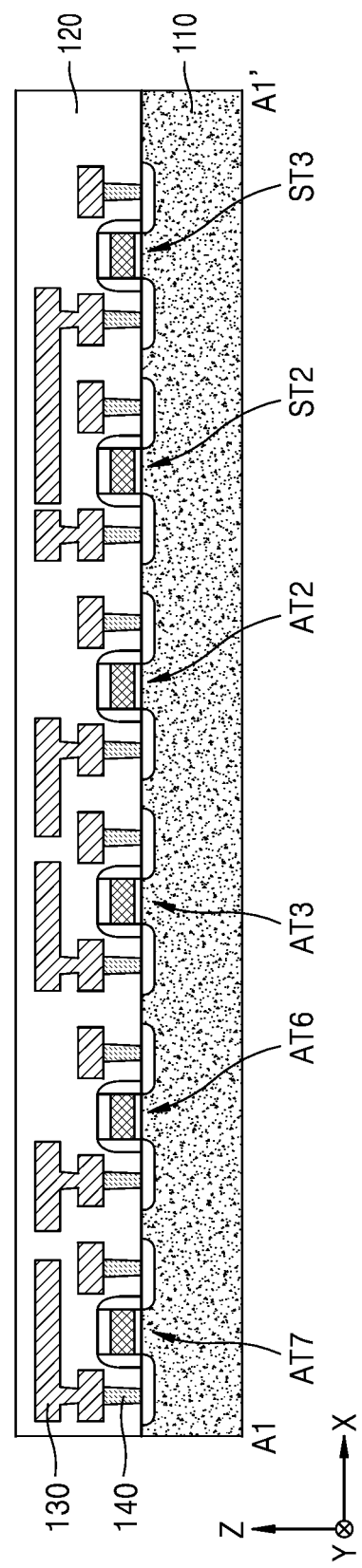

Referring to FIG. 7A, in an embodiment, the peripheral circuit 30 illustrated in FIG. 1 is formed on the first substrate 110. The peripheral circuit 30, as illustrated in FIG. 1, includes the pass circuit 31, the pass circuit control circuit 33, the row decoder 32, the control logic 38, the page buffer 34, and the data I/O circuit 36. The pass circuit 31 (see FIG. 1), as illustrated in FIG. 7A, includes second and third step transistors ST2 and ST3 and second, third, sixth, and seventh anti-fuse transistors AT2, AT3, AT6, and AT7. The pass circuit 31 (see FIG. 1) further includes first and fourth step transistors ST1 and ST4 and first, fourth, fifth, and eighth anti-fuse transistors AT1, AT4, AT5, and AT8, which are not illustrated in FIG. 7A but are illustrated in FIG. 5.

A first insulation layer 120, a contact 140, and a first interconnect structure 130 are formed. FIG. 7A shows the first insulation layer 120 is illustrated as one layer, but embodiments are not necessarily limited thereto, and in some embodiments, the first insulation layer 120 includes a plurality of layers.

Figure 7B:
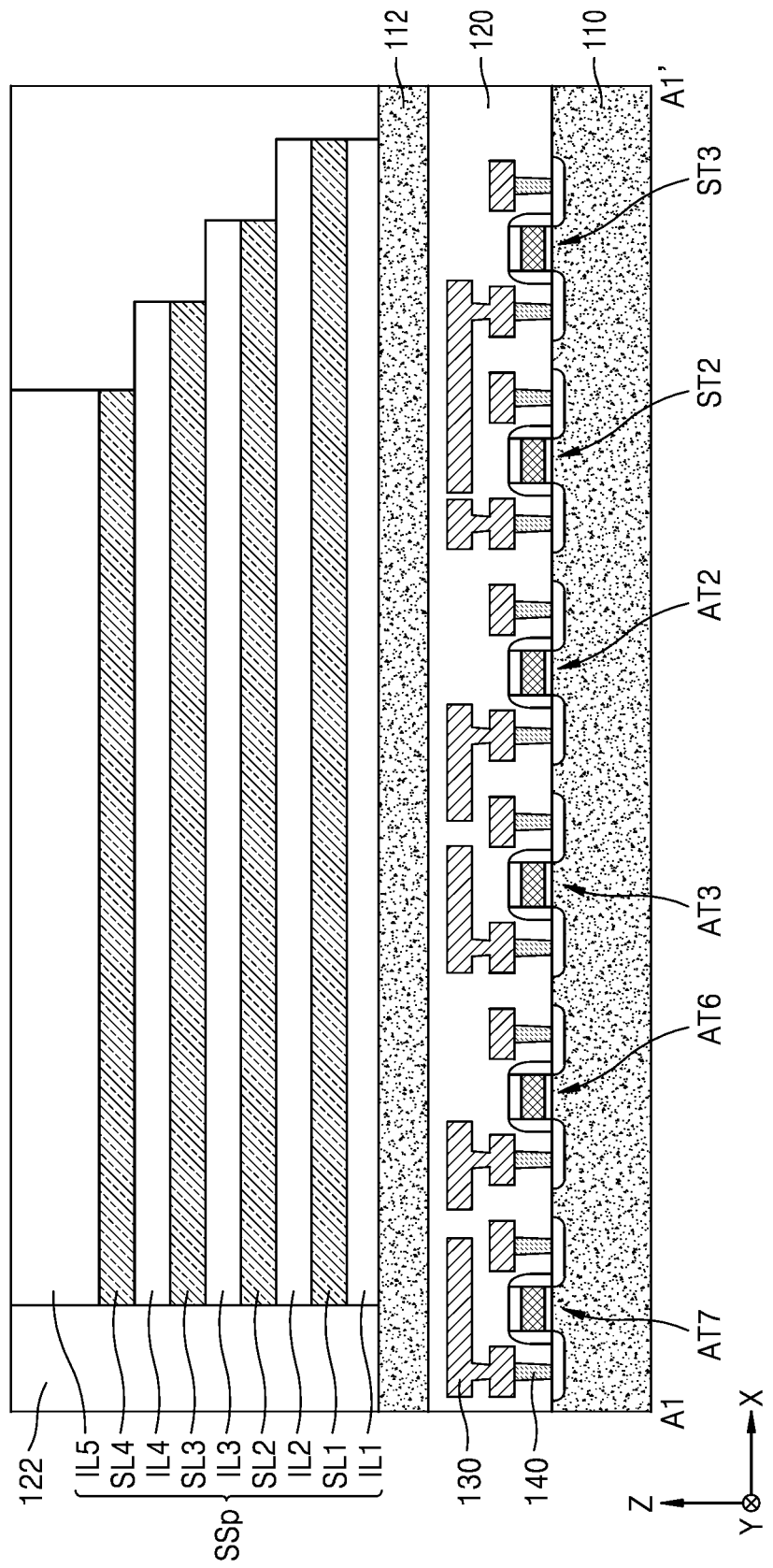

Referring to FIG. 7B, in an embodiment, a second substrate 112 is formed on the first insulation layer 120. A preliminary stack structure SSp is formed on the second substrate 112. The preliminary stack structure SSp includes first to fifth interlayer insulation layers IL1 to IL5 and first to fourth sacrifice layers SL1 to SL4 that are alternately stacked one-by-one. In some embodiments, the first to fifth interlayer insulation layers IL1 to IL5 include silicon oxide, and the first to fourth sacrifice layers SL1 to SL4 include silicon nitride. An edge portion of the preliminary stack structure SSp is patterned into a stepped or staircase shape. A second insulation layer 122 is formed that covers a top surface of the second substrate 112 and side surfaces of the preliminary stack structure SSp.

Referring to FIG. 7C, in an embodiment, a plurality of first channel structures CH1 and a plurality of second channel structures CH2 are formed that penetrate through the preliminary stack structure SSp in a vertical direction (a Z direction). For example, a plurality of first channel holes CHH1 and a plurality of second channel holes CHH2 are formed that penetrate through the preliminary stack structure SSp. A gate dielectric layer 182 is formed on sidewalls of the plurality of first channel holes CHH1 and the plurality of second channel holes CHH2. A channel layer 184 is formed on the gate dielectric layer 182 and the second substrate 112. A buried insulation layer 186 is formed in a space surrounded by the channel layer 184. In addition, a pad 188 is formed in a space formed by removing an upper portion of each of the gate dielectric layer 182, the channel layer 184, and the buried insulation layer 186.

A plurality of anti-fuse structures, such as a first anti-fuse structure, a second anti-fuse structure AF2, a third anti-fuse structure AF3, a fourth anti-fuse structure, a fifth anti-fuse structure, a sixth anti-fuse structure AF6, a seventh anti-fuse structure AF7, and an eighth anti-fuse structure, are formed that penetrate through the preliminary stack structure SSp in the vertical direction (the Z direction) and contact the first interconnect structure 130. For example, a plurality of anti-fuse holes, such as a first anti-fuse hole, a second anti-fuse hole AFH2, a third anti-fuse hole AFH3, a fourth anti-fuse hole, a fifth anti-fuse hole, a sixth anti-fuse hole AFH6, a seventh anti-fuse hole AFH7, and an eighth anti-fuse hole, are formed that penetrate through the preliminary stack structure SSp in the vertical direction (the Z direction) and expose the first interconnect structure 130. A first anti-fuse insulator, a second anti-fuse insulator AI2, a third anti-fuse insulator AI3, a fourth anti-fuse insulator, a fifth anti-fuse insulator, a sixth anti-fuse insulator AI6, a seventh anti-fuse insulator AI7, and an eighth anti-fuse insulator are respectively formed on sidewalls of the first anti-fuse hole, the second anti-fuse hole AFH2, the third anti-fuse hole AFH3, the fourth anti-fuse hole, the fifth anti-fuse hole, the sixth anti-fuse hole AFH6, the seventh anti-fuse hole AFH7, and the eighth anti-fuse hole. A first anti-fuse conductor, a second anti-fuse conductor AC2, a third anti-fuse conductor AC3, a fourth anti-fuse conductor, a fifth anti-fuse conductor, a sixth anti-fuse conductor AC6, a seventh anti-fuse conductor AC7, and an eighth anti-fuse conductor are respectively formed in spaces surrounded by the first anti-fuse insulator, the second anti-fuse insulator AI2, the third anti-fuse insulator AI3, the fourth anti-fuse insulator, the fifth anti-fuse insulator, the sixth anti-fuse insulator AI6, the seventh anti-fuse insulator AI7, and the eighth anti-fuse insulator.

Figure 7D:
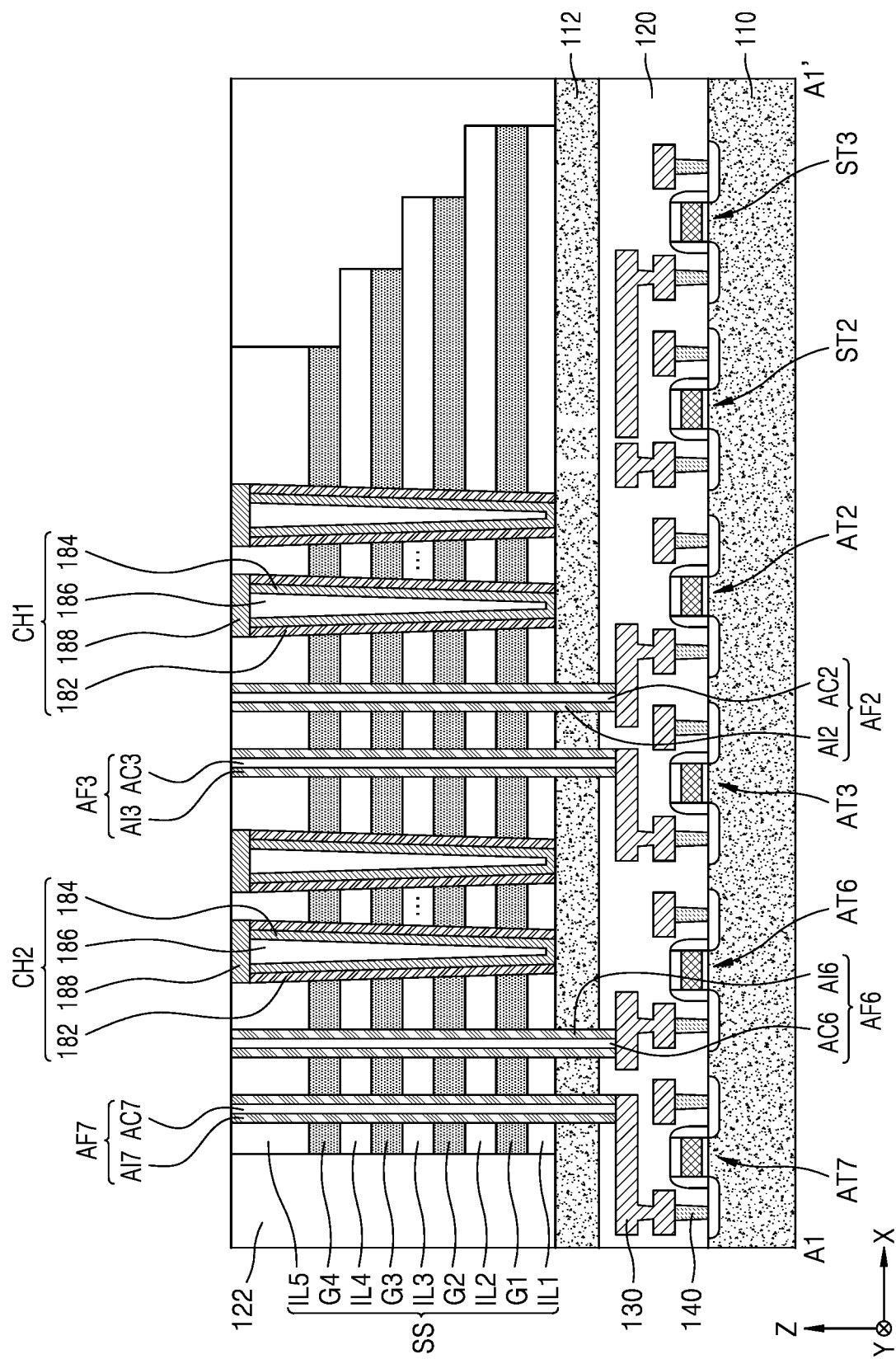

Referring to FIGS. 7C and 7D, in an embodiment, first to fourth sacrificial layers SL1 to SL4 are replaced with first to fourth gate layers G1 to G4. For example, a word line cut is formed that passes through the preliminary stack structure SSp in the vertical direction (the Z direction). The first to fourth sacrificial layers SL1 to SL4 are removed by, for example, wet-etching, through the word line cut. The first to fourth gate layers G1 to G4 are formed in a space formed by removing the first to fourth sacrificial layers SL1 to SL4, so that the stack structure SS is formed.

Figure 7E:
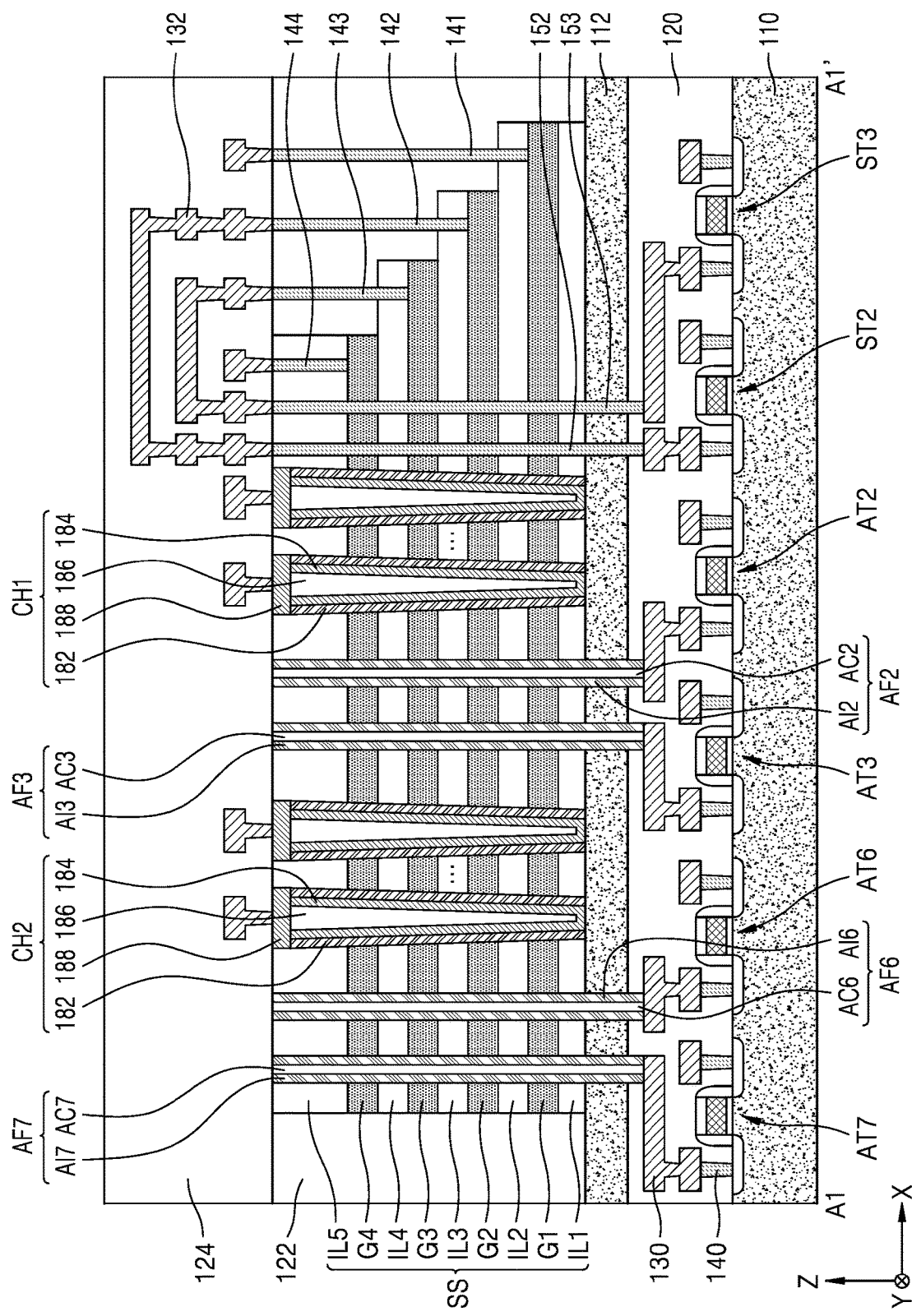

Referring to FIG. 7E, in an embodiment, first to fourth contact plugs 141 to 144 that respectively contact the first to fourth gate layers G1 to G4, a first connection via that connects the second interconnect structure 132 to the first step transistor, a second connection via 152 that connects the second interconnect structure 132 to the second step transistor ST2, a third connection via 153 that connects the second interconnect structure 132 to the third step transistor ST3, and a fourth connection via that connects the second interconnect structure 132 to the fourth step transistor, are formed. In some embodiments, the first connection via, the second connection via 152, the third connection via 153, and the fourth connection via are formed in a step illustrated in FIG. 7C. A third insulation layer 124 and a second interconnect structure 132 are formed. FIG. 7E shows the third insulation layer 124 as one layer, but embodiments are not necessarily limited thereto, and some embodiments include a plurality of layers.

Figure 7F:
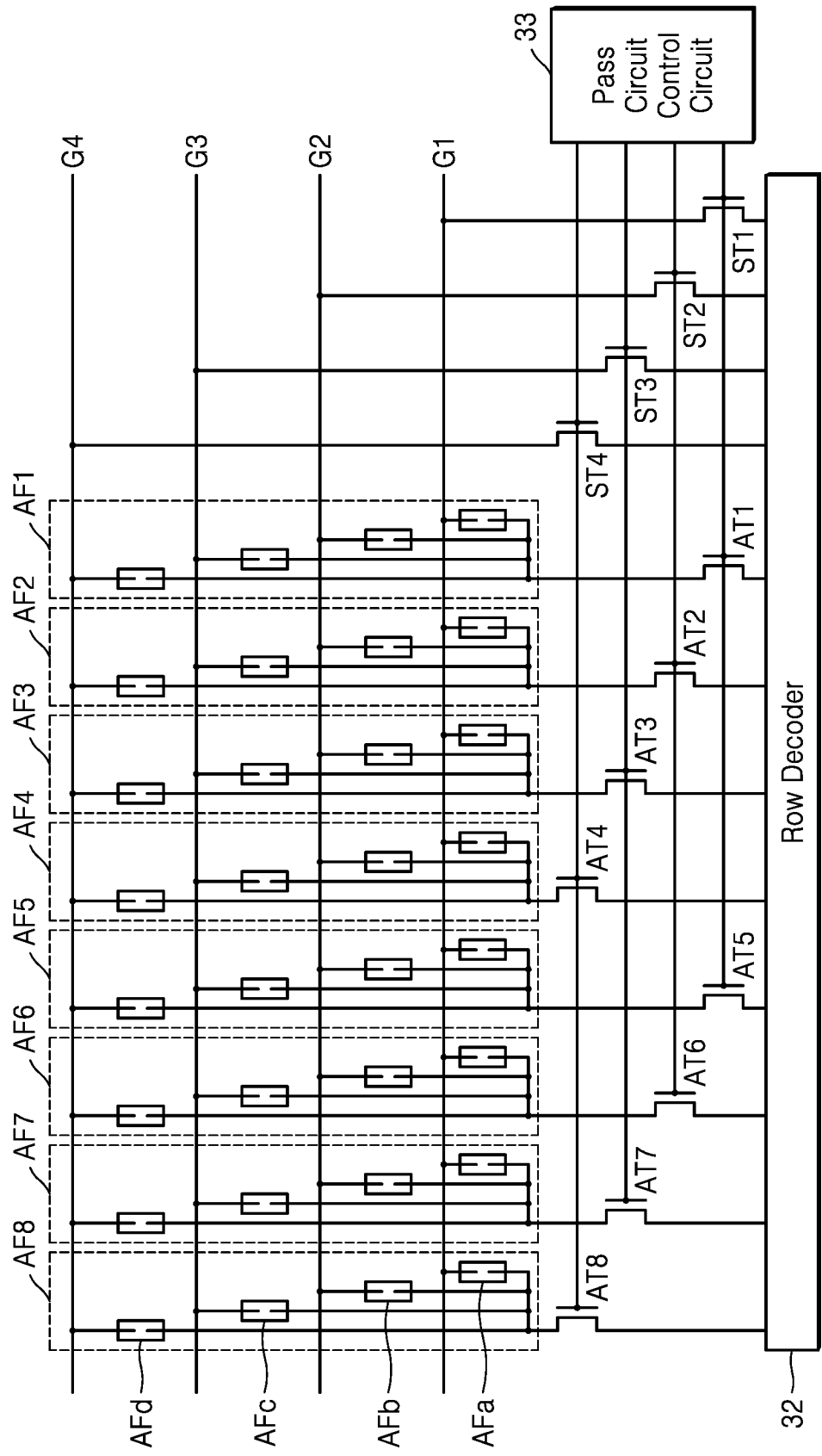

Referring to FIG. 7F, in an embodiment, a circuit diagram is shown before programming the first to eighth anti-fuse structures AF1 to AF8. The first to eighth anti-fuse structures AF1 to AF8 are not connected to the first to fourth gate layers G1 to G4.

Referring to FIG. 7G, in an embodiment, the first anti-fuse structure AF1 and the fifth anti-fuse structure AF5 are programmed. The row decoder 32 applies a set voltage $V_{SET}$ to the first step transistor ST1 and applies $V_{SET}/2$ to the second, third, and fourth step transistors ST2, ST3, and ST4. The row decoder 32 may apply 0 V to the first and fifth anti-fuse transistors AT1 and AT5 and may apply $V_{SET}/2$ to the second, third, fourth, sixth, seventh, and eighth anti-fuse transistors AT2, AT3, AT4, AT6, AT7, and AT8.

The pass circuit control circuit 33 applies $V_{SET}+V_{TH}$ to gates of the first step transistor ST1, the first anti-fuse transistor AT1, and the fifth anti-fuse transistor AT5 to turn on the first step transistor ST1, the first anti-fuse transistor AT1, and the fifth anti-fuse transistor AT5. The pass circuit control circuit 33 may apply $V_{SET}/2+V_{TH}$ to gates of the second, third, and fourth step transistors ST2, ST3, and ST4 and the second, third, fourth, sixth, seventh, and eighth anti-fuse transistors AT2, AT3, AT4, AT6, AT7, and AT8 to turn on the second, third, and fourth step transistors ST2, ST3, and ST4 and the second, third, fourth, sixth, seventh, and eighth anti-fuse transistors AT2, AT3, AT4, AT6, AT7, and AT8.

Therefore, $V_{SET}$ is applied to the first gate layer G1, and $V_{SET}/2$ is applied to the second, third, and fourth gate layers G2, G3, and G4. An electrical potential difference $V_{SET}$ is applied between the first anti-fuse transistor AT1 and the first gate layer G1, and thus, a first anti-fuse AFa of the first anti-fuse structure AF1 is programmed to connect the first anti-fuse transistor AT1 to the first gate layer G1. For example, a first conductive path that connects the first anti-fuse conductor to the first gate layer G1 is formed in the first anti-fuse structure AF1. In addition, an electrical potential difference $V_{SET}$ is applied between the fifth anti-fuse transistor AT5 and the first gate layer G1, and thus, a first anti-fuse AFa of the fifth anti-fuse structure AF5 is programmed to connect the fifth anti-fuse transistor AT5 to the first gate layer G1. For example, a fifth conductive path that connects the fifth anti-fuse conductor to the first gate layer G1 is formed in the fifth anti-fuse structure AF5.

Figure 7H:
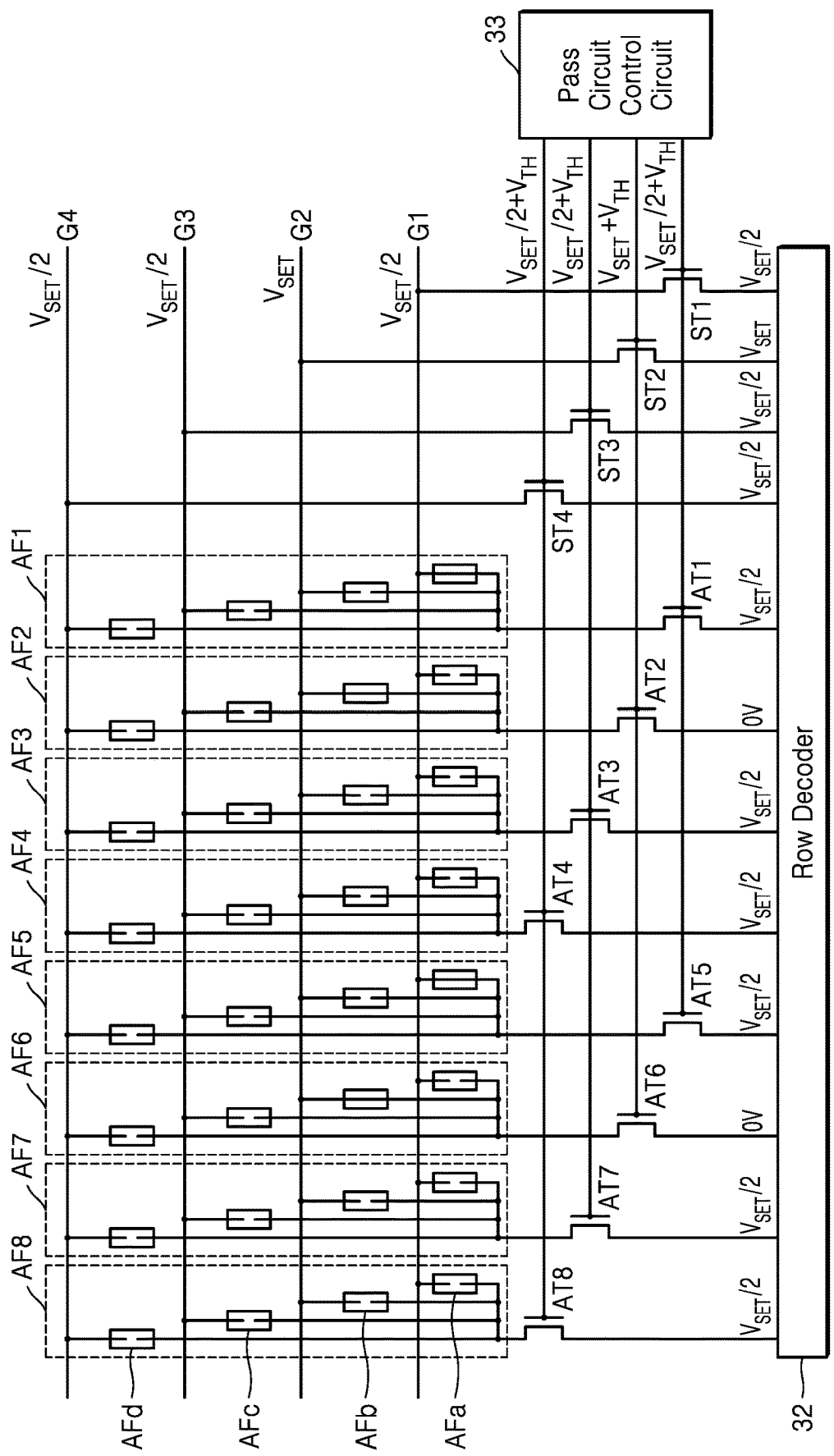

Referring to FIG. 7H, in an embodiment, the second anti-fuse structure AF2 and the sixth anti-fuse structure AF6 are programmed. The row decoder 32 applies $V_{SET}$ to the second step transistor ST2 and applies $V_{SET}/2$ to the first, third, and fourth step transistors ST1, ST3, and ST4. The row decoder 32 applies 0 V to the second and sixth anti-fuse transistors AT2 and AT6 and applies $V_{SET}/2$ to the first, third, fourth, fifth, seventh, and eighth anti-fuse transistors AT1, AT3, AT4, AT5, AT7, and AT8.

The pass circuit control circuit 33 applies $V_{SET}+V_{TH}$ to gates of the second step transistor ST2, the second anti-fuse transistor AT2, and the sixth anti-fuse transistor AT6 to turn on the second step transistor ST2, the second anti-fuse transistor AT2, and the sixth anti-fuse transistor AT6. The pass circuit control circuit 33 applies $V_{SET}/2+V_{TH}$ to gates of the first, third, and fourth step transistors ST1, ST3, and ST4 and the first, third, fourth, fifth, seventh, and eighth anti-fuse transistors AT1, AT3, AT4, AT5, AT7, and AT8 to turn on the first, third, and fourth step transistors ST1, ST3, and ST4 and the first, third, fourth, fifth, seventh, and eighth anti-fuse transistors AT1, AT3, AT4, AT5, AT7, and AT8.

Therefore, $V_{SET}$ is applied to the second gate layer G2, and $V_{SET}/2$ is applied to the first, third, and fourth gate layers G1, G3, and G4. An electrical potential difference $V_{SET}$ is applied between the second anti-fuse transistor AT2 and the second gate layer G2, and thus, a second anti-fuse AFb of the second anti-fuse structure AF2 is programmed to connect the second anti-fuse transistor AT2 to the second gate layer G2. For example, a second conductive path CP2 (see FIG. 4) that connects the second anti-fuse conductor AC2 (see FIG. 4) to the second gate layer G2 is formed in the second anti-fuse structure AF2. In addition, an electrical potential difference $V_{SET}$ is applied between the sixth anti-fuse transistor AT6 and the second gate layer G2, and thus, a second anti-fuse AFb of the sixth anti-fuse structure AF6 is programmed to connect the sixth anti-fuse transistor AT6 to the second gate layer G2. For example, a sixth conductive path CP6 (see FIG. 4) that connects the sixth anti-fuse conductor AC6 (see FIG. 4) to the second gate layer G2 is formed in the sixth anti-fuse structure AF6.

Figure 7I:
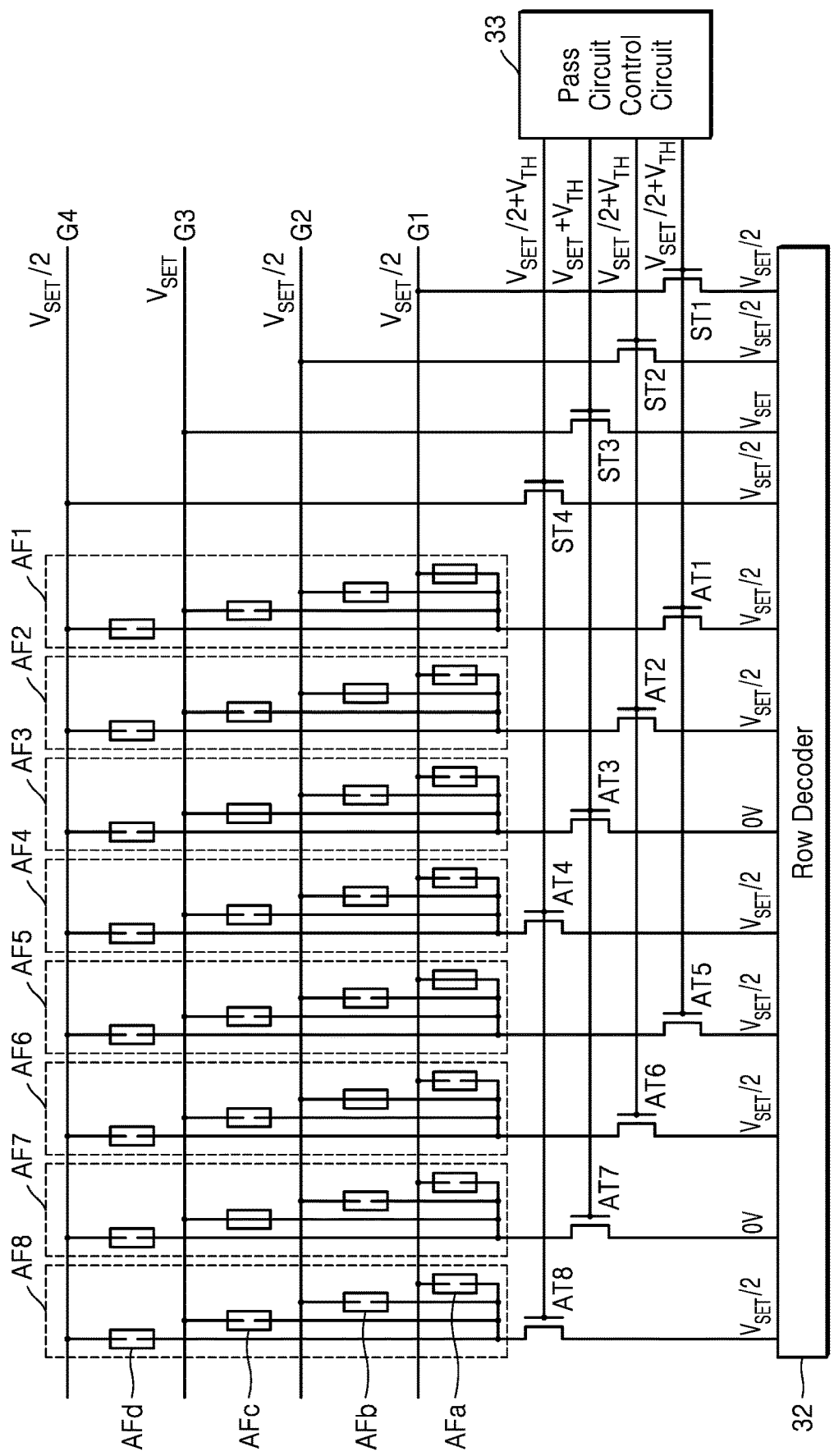

Referring to FIG. 7I, in an embodiment, the third anti-fuse structure AF3 and the seventh anti-fuse structure AF7 are programmed. The row decoder 32 applies $V_{SET}$ to the third step transistor ST3 and applies $V_{SET}/2$ to the first, second, and fourth step transistors ST1, ST2, and ST4. The row decoder 32 applies 0 V to the third and seventh anti-fuse transistors AT3 and AT7 and applies $V_{SET}/2$ to the first, second, fourth, fifth, sixth, and eighth anti-fuse transistors AT1, AT2, AT4, AT5, AT6, and AT8.

The pass circuit control circuit 33 applies $V_{SET}+V_{TH}$ to gates of the third step transistor ST3, the third anti-fuse transistor AT3, and the seventh anti-fuse transistor AT7 to turn on the third step transistor ST3, the third anti-fuse transistor AT3, and the seventh anti-fuse transistor AT7. The pass circuit control circuit 33 applies $V_{SET}/2+V_{TH}$ to gates of the first, second, and fourth step transistors ST1, ST2, and ST4 and the first, second, fourth, fifth, sixth, and eighth anti-fuse transistors AT1, AT2, AT4, AT5, AT6, and AT8 to turn on the first, second, and fourth step transistors ST1, ST2, and ST4 and the first, second, fourth, fifth, sixth, and eighth anti-fuse transistors AT1, AT2, AT4, AT5, AT6, and AT8.

Therefore, $V_{SET}$ is applied to the third gate layer G3, and $V_{SET}/2$ is applied to the first, second, and fourth gate layers G1, G2, and G4. An electrical potential difference $V_{SET}$ is applied between the third anti-fuse transistor AT3 and the third gate layer G3, and thus, a third anti-fuse AFc of the third anti-fuse structure AF3 is programmed to connect the third anti-fuse transistor AT3 to the third gate layer G3. For example, a third conductive path CP3 (see FIG. 4) that connects the third anti-fuse conductor AC3 (see FIG. 4) to the third gate layer G3 is formed in the third anti-fuse structure AF3. In addition, an electrical potential difference $V_{SET}$ is applied between the seventh anti-fuse transistor AT7 and the third gate layer G3, and thus, a third anti-fuse AFc of the seventh anti-fuse structure AF7 is programmed to connect the seventh anti-fuse transistor AT7 to the third gate layer G3. For example, a seventh conductive path CP7 (see FIG. 4) that connects the seventh anti-fuse conductor AC7 (see FIG. 4) to the third gate layer G3 is formed in the seventh anti-fuse structure AF7.

Figure 7J:
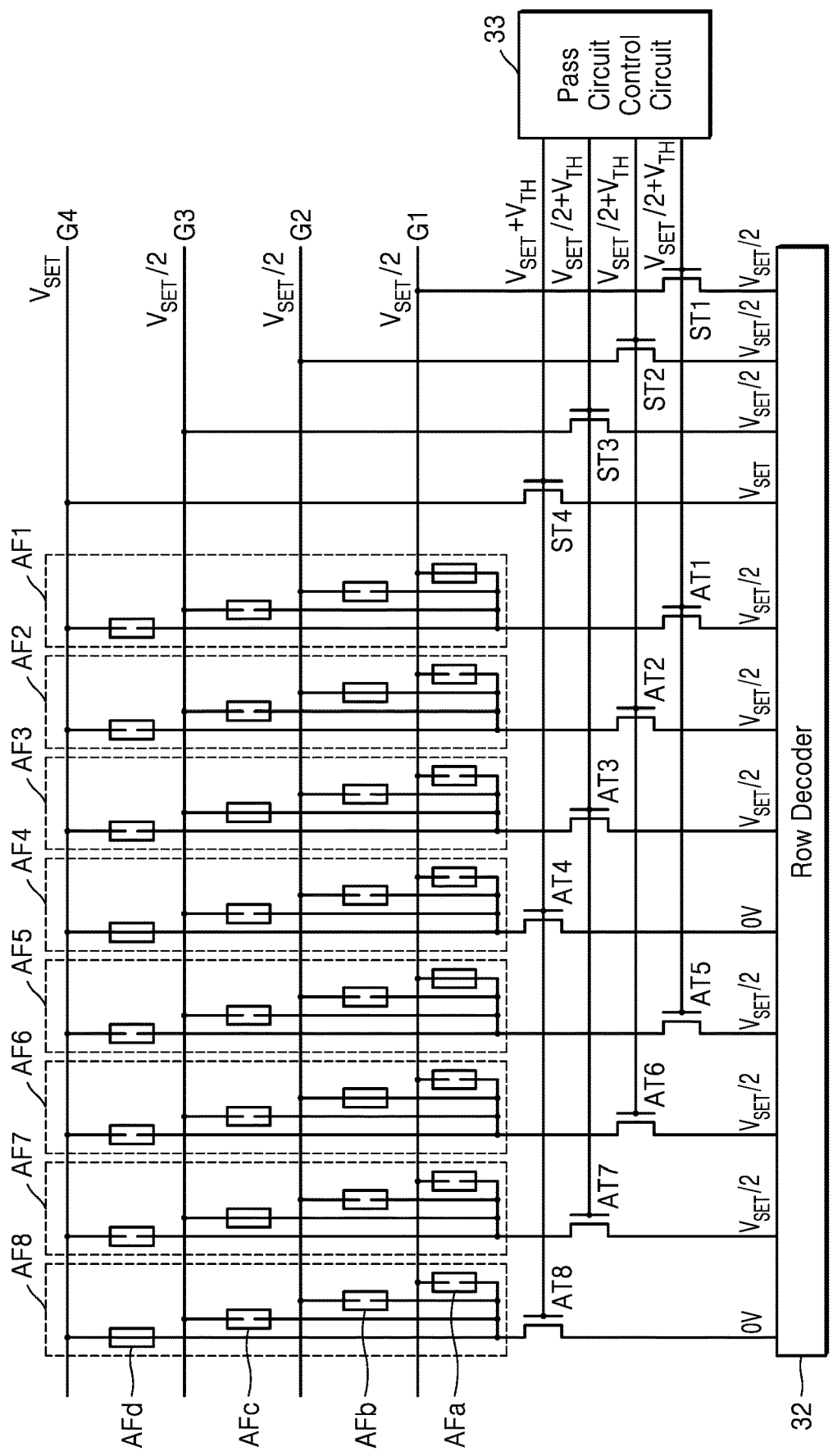

Referring to FIG. 7J, in an embodiment, the fourth anti-fuse structure AF4 and the eighth anti-fuse structure AF8 are programmed. The row decoder 32 applies $V_{SET}$ to the fourth step transistor ST4 and applies $V_{SET}/2$ to the first, second, and third step transistors ST1, ST2, and ST3. The row decoder 32 applies 0 V to the fourth and eighth anti-fuse transistors AT4 and AT8 and applies $V_{SET}/2$ to the first, second, third, fifth, sixth, and seventh anti-fuse transistors AT1, AT2, AT3, AT5, AT6, and AT7.

The pass circuit control circuit 33 applies $V_{SET}+V_{TH}$ to gates of the fourth step transistor ST4, the fourth anti-fuse transistor AT4, and the eighth anti-fuse transistor AT8 to turn on the fourth step transistor ST4, the fourth anti-fuse transistor AT4, and the eighth anti-fuse transistor AT8. The pass circuit control circuit 33 applies $V_{SET}/2+V_{TH}$ to gates of the first, second, and third step transistors ST1, ST2, and ST3 and the first, second, third, fifth, sixth, and seventh anti-fuse transistors AT1, AT2, AT3, AT5, AT6, and AT7 to turn on the first, second, and third step transistors ST1, ST2, and ST3 and the first, second, third, fifth, sixth, and seventh anti-fuse transistors AT1, AT2, AT3, AT5, AT6, and AT7.

Therefore, $V_{SET}$ is applied to the fourth gate layer G4, and $V_{SET}/2$ is applied to the first, second, and third gate layers G1, G2, and G3. An electrical potential difference $V_{SET}$ is applied between the fourth anti-fuse transistor AT4 and the fourth gate layer G4, and thus, a fourth anti-fuse AFd of the fourth anti-fuse structure AF4 is programmed to connect the fourth anti-fuse transistor AT4 to the fourth gate layer G4. For example, a fourth conductive path that connects the fourth anti-fuse conductor to the fourth gate layer G4 is formed in the fourth anti-fuse structure AF4. In addition, an electrical potential difference $V_{SET}$ is applied between the eighth anti-fuse transistor AT8 and the fourth gate layer G4, and thus, a fourth anti-fuse AFd of the eighth anti-fuse structure AF8 is programmed to connect the eighth anti-fuse transistor AT8 to the fourth gate layer G4. For example, an eighth conductive path that connects the eighth anti-fuse conductor to the fourth gate layer G4 is formed in the eighth anti-fuse structure AF8.

Figure 8:
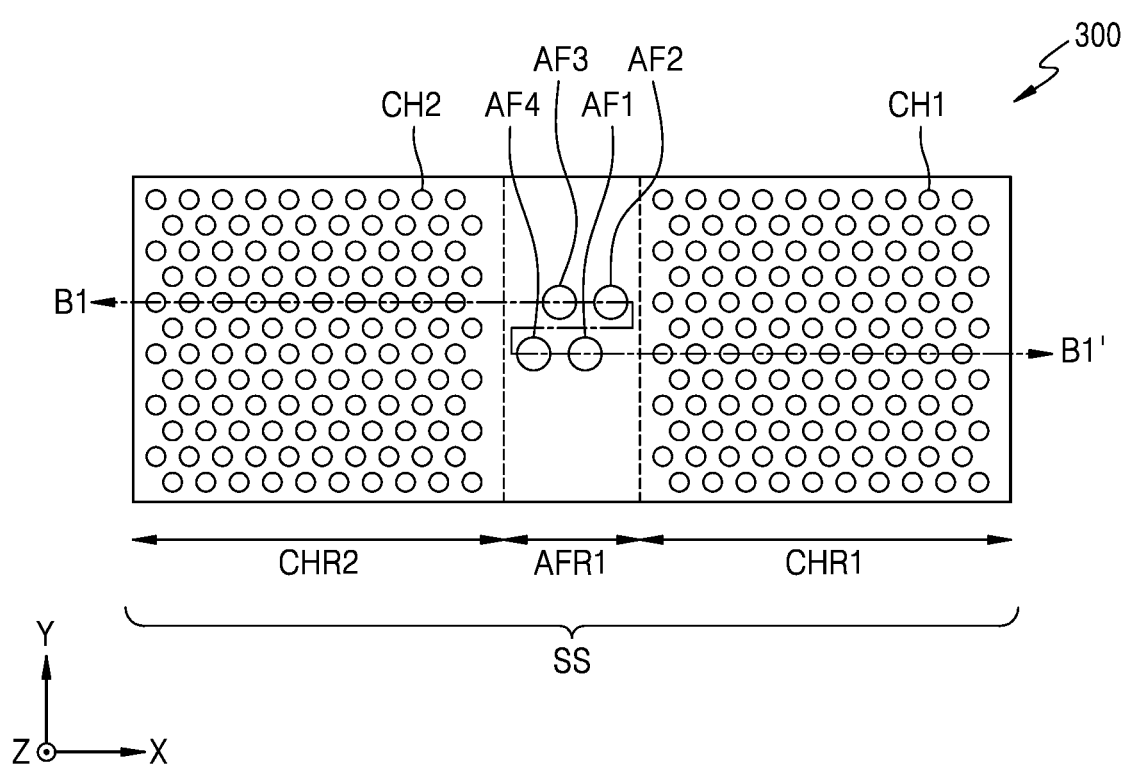
FIG. 8 is a plan view of a non-volatile memory device according to an embodiment.
Figure 9:
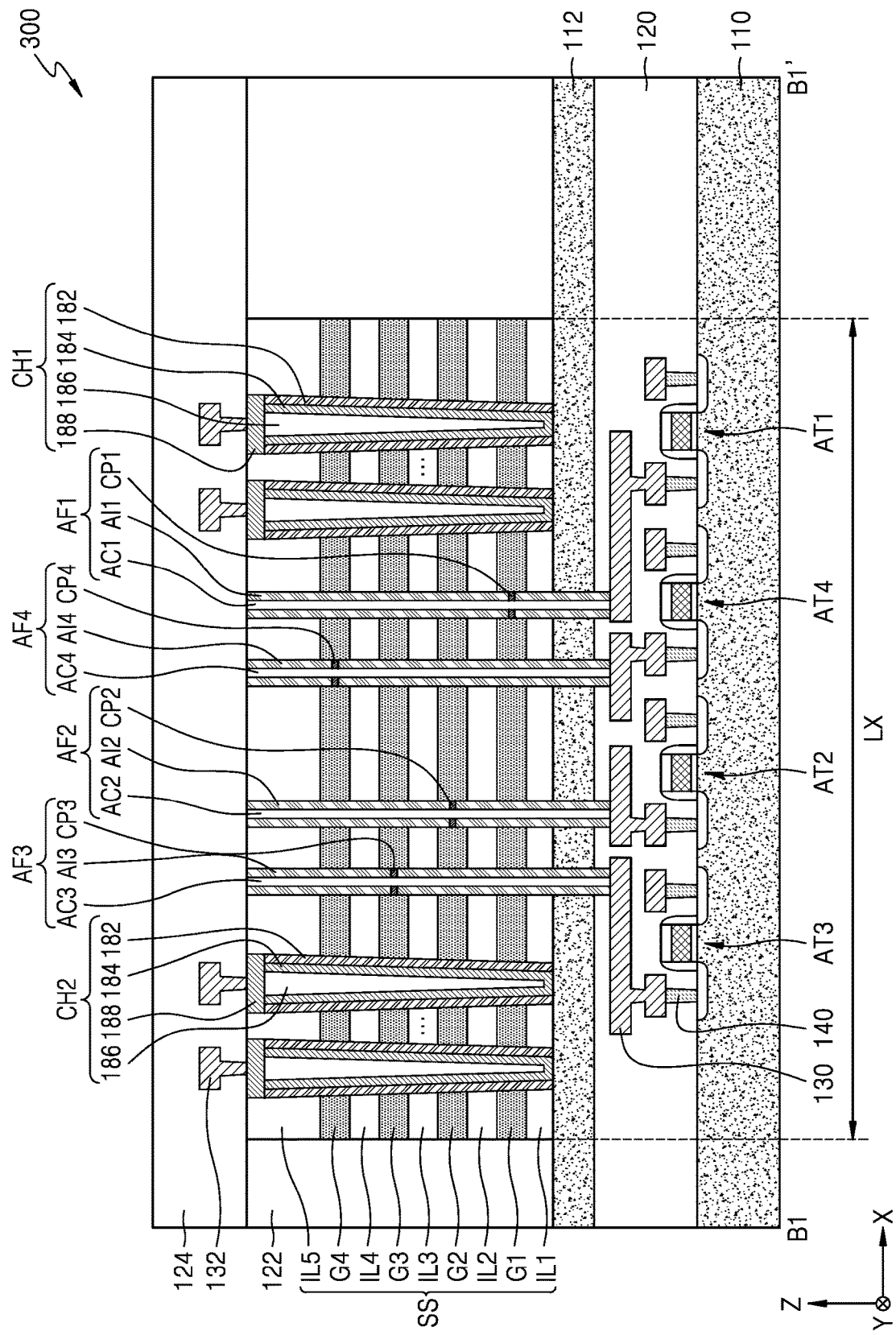
FIG. 9 is a cross-sectional view taken along line B1-B1' of FIG. 8 of a non-volatile memory device according to an embodiment.
Figure 10:
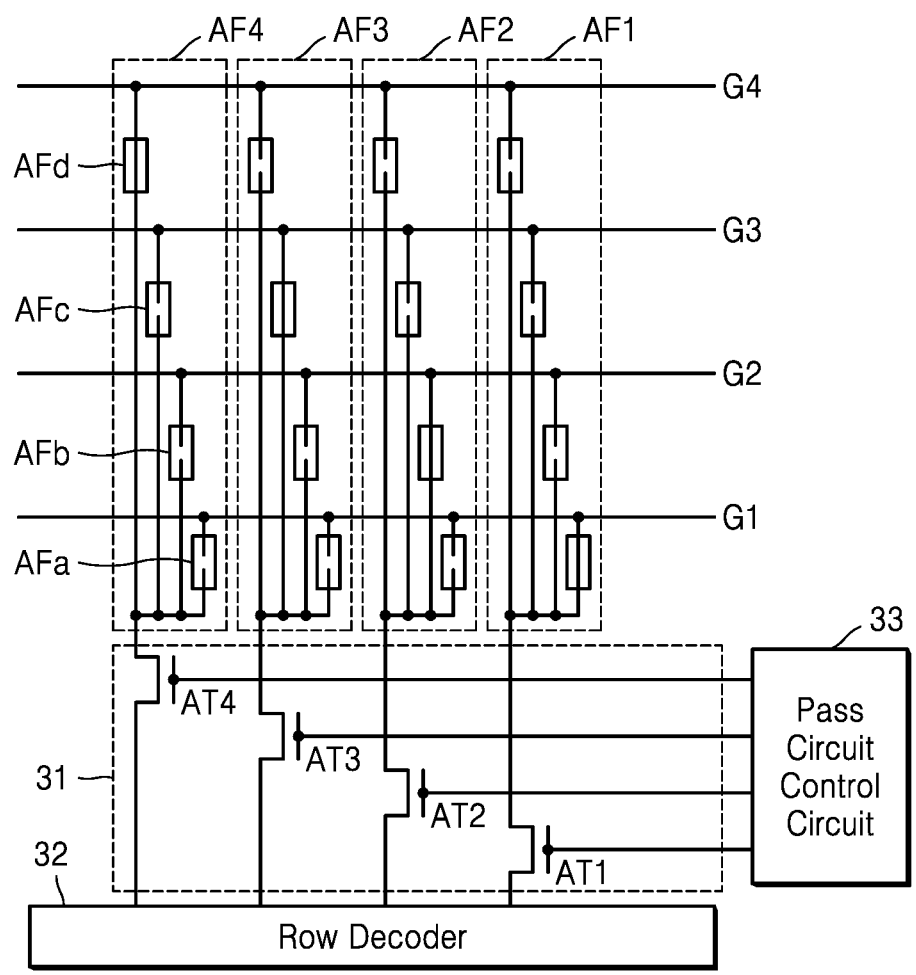
FIG. 10 is a circuit diagram of a portion of a non-volatile memory device according to an embodiment.

FIG. 8 is a plan view of a non-volatile memory device 300 according to an embodiment. FIG. 9 is a cross-sectional view taken along line B1-B1' of FIG. 8 of the non-volatile memory device 300 according to an embodiment. FIG. 10 is a circuit diagram of a portion of the non-volatile memory device 300 according to an embodiment. Hereinafter, a difference between the non-volatile memory device 100 illustrated in FIGS. 3 to 5 and the non-volatile memory device 300 illustrated in FIGS. 8 to 10 will be described.

Referring to FIGS. 8 to 10, in an embodiment, a stack structure SS include a first channel region CHR1, a second channel region CHR2, and a first anti-fuse region AFR1. The first channel region CHR1 is spaced apart from the second channel region CHR2 in a first horizontal direction (an X direction). The first anti-fuse region AFR1 is located between the first channel region CHR1 and the second channel region CHR2. In some embodiments, the stack structure SS further includes a second anti-fuse region located at an end portion of the stack structure SS, such as at a side of the second channel region CHR2. The stack structure SS does not include the step region STR illustrated in FIG. 3. For example, lengths LX of first to fourth gate layers G1 to G4 and first to fifth interlayer insulation layers IL1 to IL5 in the first horizontal direction (the X direction) are equal. The non-volatile memory device 300 does not include the second and third step transistors ST2 and ST3, the first to fourth contact plugs 141 to 144, or the connection vias 152 and 153 illustrated in FIG. 4.

Because the stack structure SS does not include the step region STR illustrated in FIG. 3, a two-dimensional area of the non-volatile memory device 300 decreases. In addition, because the first anti-fuse region AFR1 is disposed between the first channel region CHR1 and the second channel region CHR2, a signal transfer distance decreases, and thus, RC delay decreases and an operation speed of the non-volatile memory device 300 increases.

Similar to the embodiment of FIG. 3, as illustrated in FIG. 8, a plurality of first channel structures CH1 penetrate through the first channel region CHR1 in a vertical direction (a Z direction), a plurality of second channel structures CH2 penetrate through the second channel region CHR2 in the vertical direction (the Z direction), and first to fourth anti-fuse structures AF1 to AF4 penetrate through the first anti-fuse region AFR1 in the vertical direction (the Z direction). Similar to the embodiments of FIGS. 4 and 5, as illustrated in FIGS. 9 and 10, the first to fourth anti-fuse structures AF1 to AF4 respectively connect first to fourth gate layers G1 to G4 to first to fourth anti-fuse transistors AT1 to AT4.

Similar to the embodiments of FIGS. 4 and 5, as illustrated in FIGS. 9 and 10, the first to fourth anti-fuse transistors AT1 to AT4 are connected to a row decoder 32 on a first substrate 110. The row decoder 32 can selectively apply a voltage to the first to fourth anti-fuse transistors AT1 to AT4. Gates of the first to fourth anti-fuse transistors AT1 to AT4 are connected to a pass circuit control circuit 33 on the first substrate 110. The pass circuit control circuit 33 can selectively apply voltages to the gates of the first to fourth anti-fuse transistors AT1 to AT4.

FIG. 11 is a cross-sectional view of a non-volatile memory device 400 according to an embodiment. Hereinafter, a difference between the non-volatile memory device 400 illustrated in FIG. 11 and the non-volatile memory device 300 illustrated in FIGS. 8 to 10 will be described.

Referring to FIG. 11, in an embodiment, the non-volatile memory device 400 includes a first structure S1 and a second structure S2 disposed on a bottom surface of the first structure S1. The first structure S1 includes a first substrate 110 and a peripheral circuit 30 (see FIG. 1) disposed on the first substrate 110, For example, the peripheral circuit 30 includes a first anti-fuse transistor AT1, a second anti-fuse transistor AT2, a third anti-fuse transistor AT3, a fourth anti-fuse transistor AT4, a pass circuit control circuit 33 (see FIG. 1), a row decoder 32 (see FIG. 1), a page buffer 34 (see FIG. 1), a data I/O circuit 36 (see FIG. 1), and a control logic 38 (see FIG. 1). The first structure S1 further includes a first insulation layer 120 that covers the first substrate 110 and the peripheral circuit 30 (see FIG. 1). The first structure S1 further includes a plurality of first bonding pads 191 on the first insulation layer 120. The plurality of first bonding pads 191 are disposed on a bottom surface of the insulation layer 120, opposite to the first substrate 110. The plurality of first bonding pads 191 include Cu. The first structure S1 further includes a first interconnect structure 130 that connects the peripheral circuit 30 (see FIG. 1) to the plurality of first bonding pads 191. The first structure S1 further includes a contact 140 that connects the peripheral circuit 30 (see FIG. 1) to the first interconnect structure 130. The first insulation layer 120 surrounds the first interconnect structure 130 and the contact 140 and covers the first bonding pads 191.

The second structure S2 includes a second substrate 112, a stack structure SS disposed on the second substrate 112, a plurality of first channel structures CH1 that penetrate through a first channel region CHR1 (see FIG. 8) of the stack structure SS in a vertical direction (a Z direction), and a plurality of second channel structures CH2 that penetrate through a second channel region CHR2 (see FIG. 8) of the stack structure SS in the vertical direction (the Z direction). The second structure S2 further includes a first anti-fuse structure AF1, a second anti-fuse structure AF2, a third anti-fuse structure AF3, and a fourth anti-fuse structure AF4 that penetrate through the first anti-fuse region AFR1 of the stack structure SS in the vertical direction (the Z direction). The second structure S2 further includes a second insulation layer 122 that covers a top surface of the second substrate 112 and a side surface of the stack structure SS. The second structure S2 further includes a third insulation layer 124 that covers the second insulation layer 122, the stack structure SS, the first to fourth anti-fuse structures AF1 to AF4, the plurality of first channel structures CH1, and the plurality of second channel structures CH2. The second structure S2 further includes a plurality of second bonding pads 192 disposed on the third insulation layer 124. The plurality of second bonding pads 192 are disposed on a surface of the third insulation layer 124 that opposite to the second insulation layer 122. The plurality of second bonding pads 192 include Cu. The second structure S2 further includes a second interconnect structure 132 that connects the plurality of second bonding pads 192 to the plurality of first channel structures CH1, the plurality of second channel structures CH2, the first to fourth anti-fuse structures AF1 to AF4. The third insulation layer 124 surrounds the second interconnect structure 132 and covers the second bonding pads 192.

The plurality of first bonding pads 191 respectively contact the plurality of second bonding pads 192. The first structure S1 is physically and electrically connected to the second structure S2 by Cu—Cu bonding between the plurality of first bonding pads 191 and the plurality of second bonding pads 192.

Figure 12A:
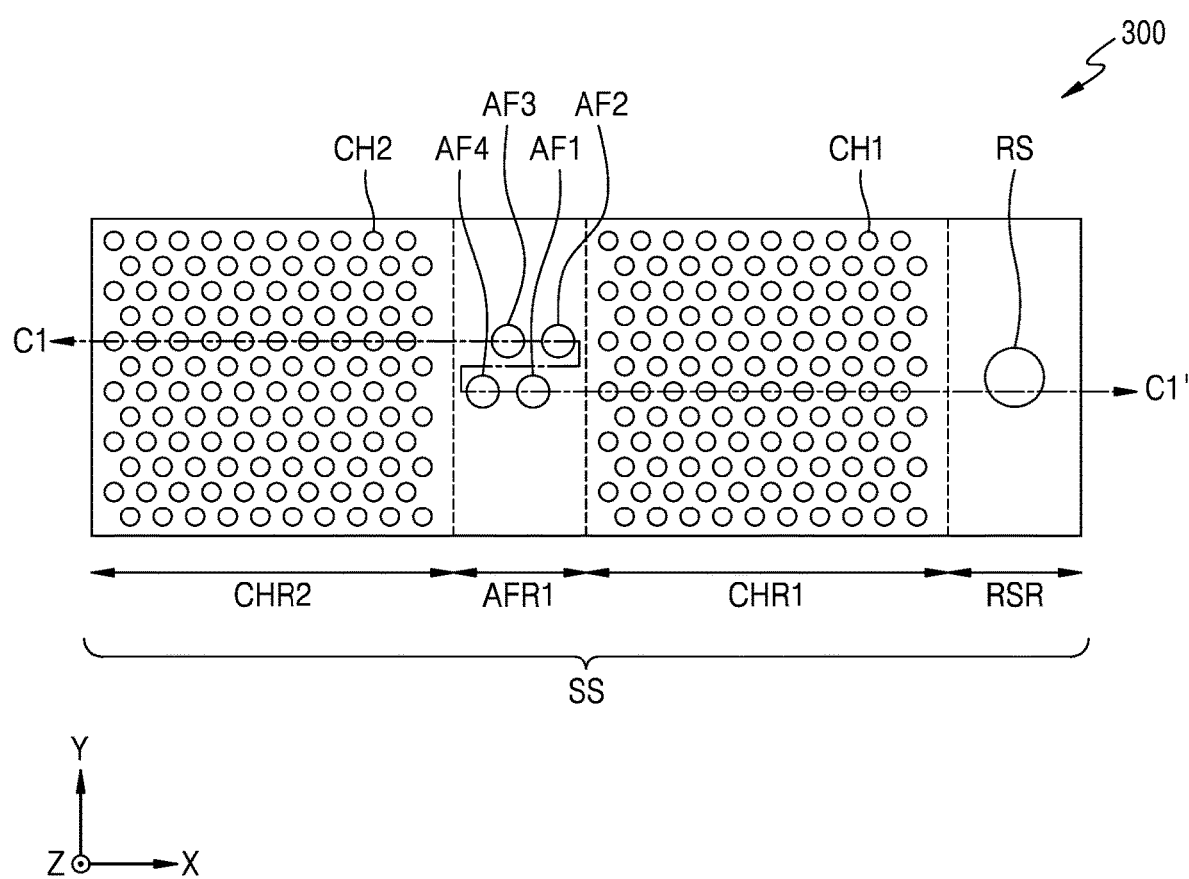
FIG. 12A is a plan view that illustrates a method of manufacturing a non-volatile memory device according to an embodiment.
Figure 12B:
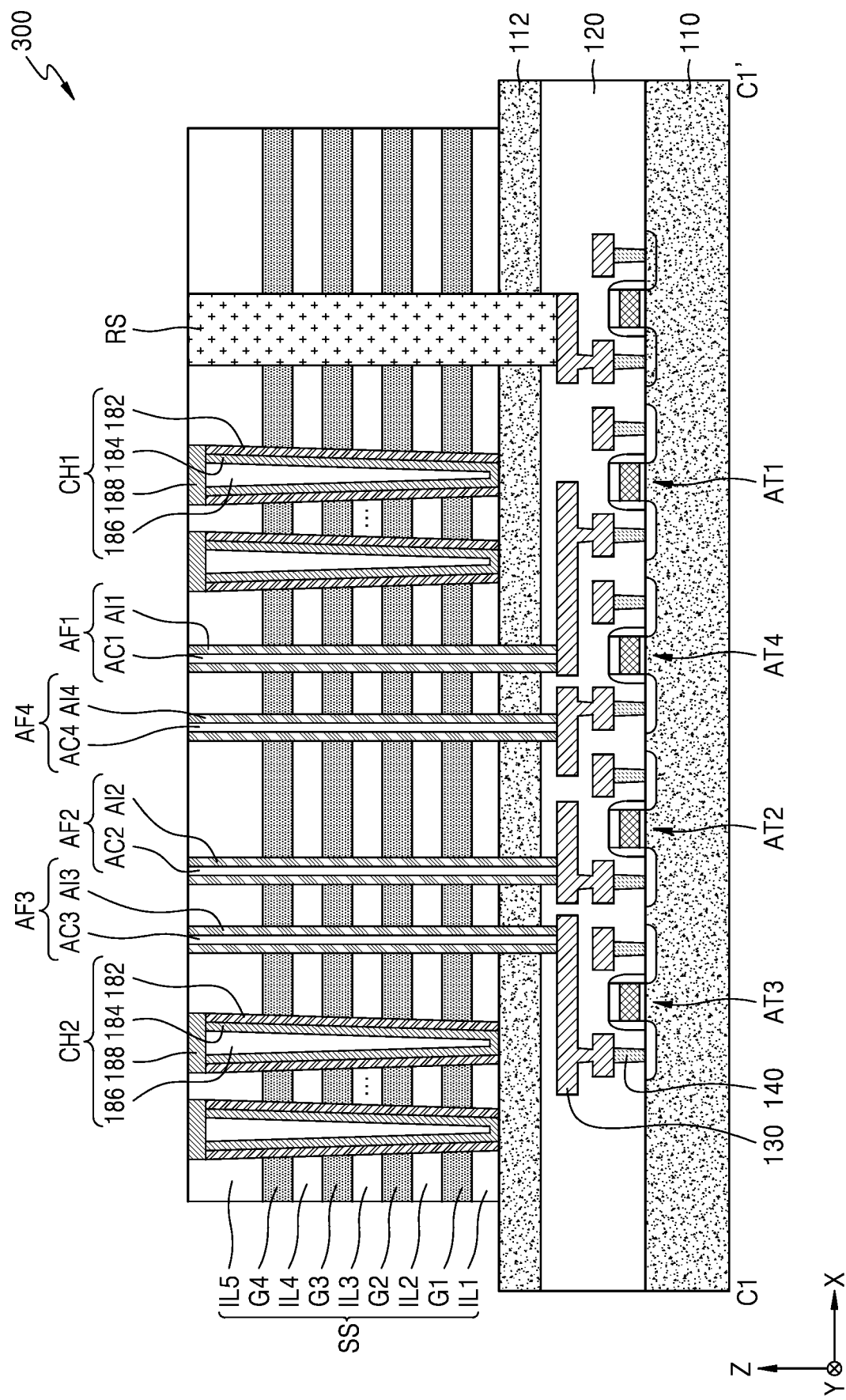
FIG. 12B is a cross-sectional view taken along line C1-C1' of FIG. 12A that illustrates a method of manufacturing a non-volatile memory device, according to an embodiment

FIG. 12A is a plan view that illustrates a method of manufacturing a non-volatile memory device, according to an embodiment. FIG. 12B is a cross-sectional view taken along line C1-C1' of FIG. 12A that illustrates a method of manufacturing a non-volatile memory device, according to an embodiment. FIGS. 12C to 12G are circuit diagrams that illustrate a method of manufacturing a non-volatile memory device, according to an embodiment.

Figure 12C:
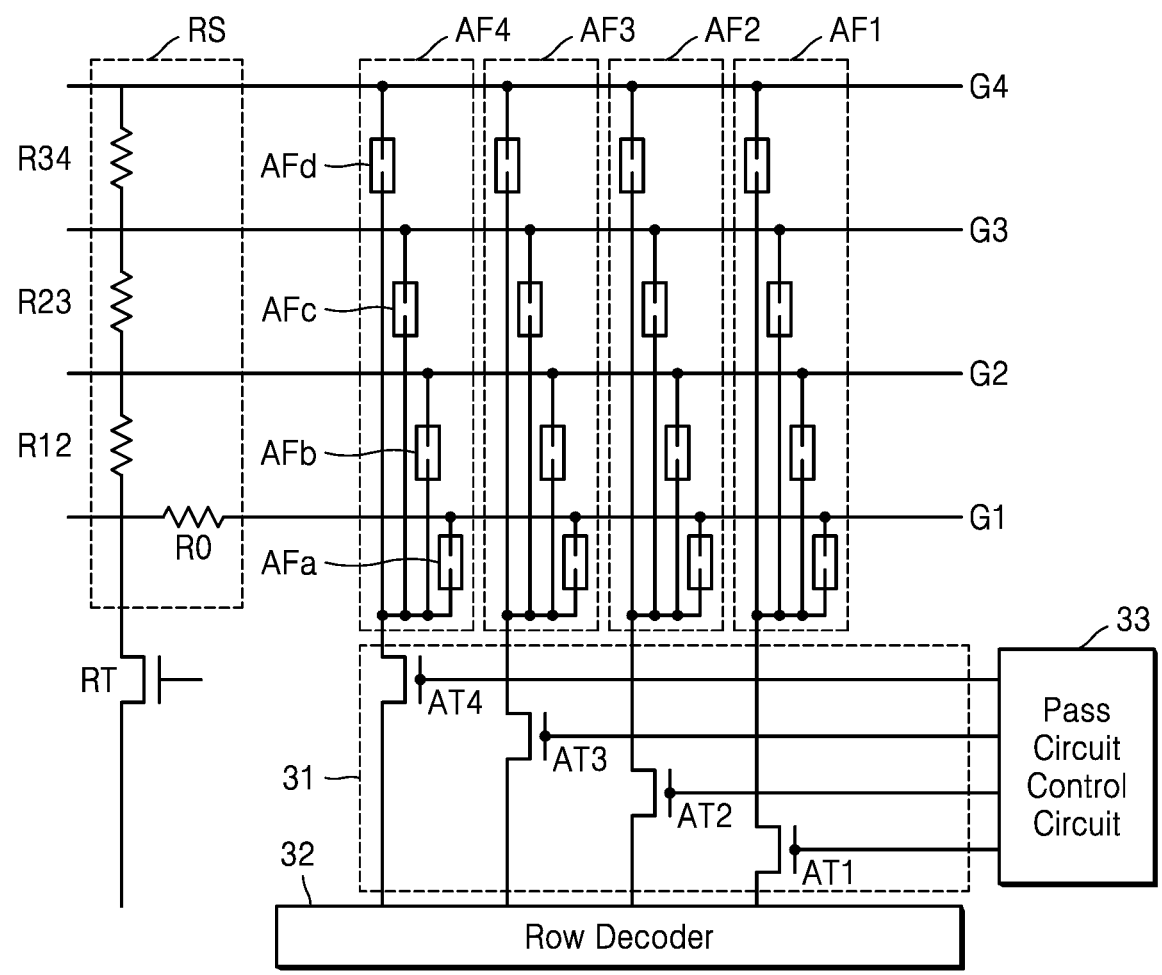
FIGS. 12C to 12G are circuit diagrams that illustrate a method of manufacturing a non-volatile memory device, according to an embodiment.

Referring to FIGS. 12A to 12C, in an embodiment, a non-volatile memory device 300 and a resistance structure RS are formed. The non-volatile memory device 300 includes the elements described above with reference to FIGS. 8 to 10. However, none of first to fourth anti-fuse structures AF1 to AF4 includes first to fourth conductive paths CP1 to CP4 (see FIG. 9). The stack structure SS further includes a resistance region RSR, and the resistance structure RS penetrates through the resistance region RSR of the stack structure SS in a vertical direction (a Z direction). The resistance structure RS includes, for example, polysilicon.

The resistance structure RS is electrically connected to first to fourth gate layers G1 to G4. The resistance structure RS, as illustrated in FIG. 12C, may be expressed as a first length resistor R12 between the first gate layer G1 and the second gate layer G2, a second length resistor R23 between the second gate layer G2 and the third gate layer G3, a third length resistor R34 between the third gate layer G3 and the fourth gate layer G4, and a radius resistor RO. The resistance structure RS is connected to a resistance transistor RT on the first substrate 110. The resistance transistor RT applies a voltage to a lower end of the resistance structure RS. The first to third length resistors R12, R23, and R34 and the radius resistor RO cause a voltage drop.

Figure 12D:
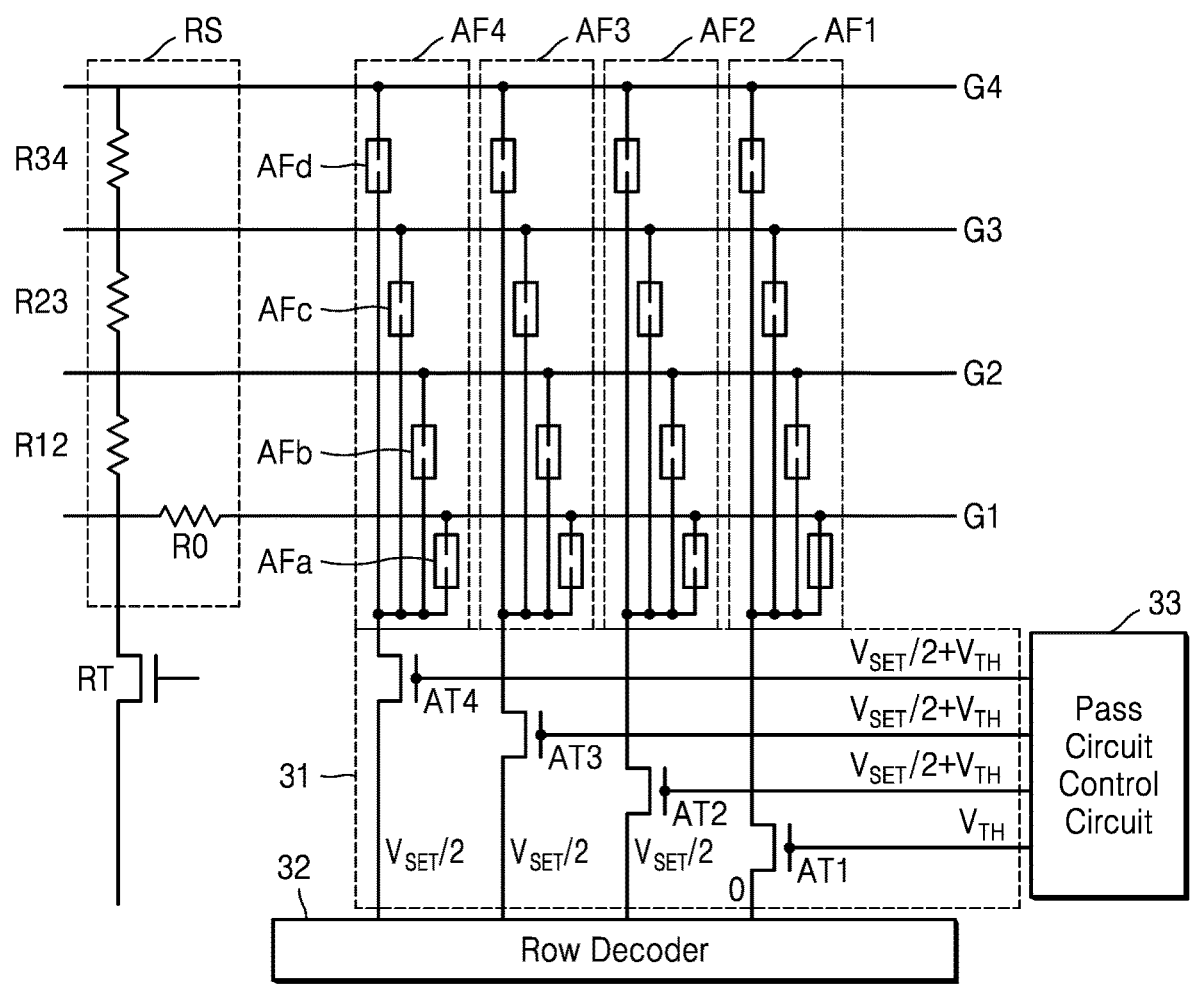

Referring to FIG. 12D, in an embodiment, a first anti-fuse AFa of the first anti-fuse structure AF1 is programmed to connect the first gate layer G1 to the first anti-fuse transistor AT1. For example, a first conductive path CP1 (see FIG. 9) of the first anti-fuse structure AF1 is formed.

A row decoder 32 applies 0 V to the first anti-fuse transistor AT1 and applies $V_{SET}/2$ to second to fourth anti-fuse transistors AT2 to AT4. A pass circuit control circuit 33 applies $V_{TH}$ to a gate of the first anti-fuse transistor AT1 to turn on the first anti-fuse transistor AT1. In addition, the pass circuit control circuit 33 applies $V_{SET}/2+V_{TH}$ to the second to fourth anti-fuse transistors AT2 to AT4 to turn on the second to fourth anti-fuse transistors AT2 to AT4. The resistance transistor RT applies a voltage to a lower end of the resistance structure RS.

When the first anti-fuse transistor AT1 is turned on, 0 V is applied to a first anti-fuse conductor AC1 of the first anti-fuse structure AF1. A voltage that is greater than or equal to a setting voltage $V_{SET}$ is applied to the first gate layer G1 through the resistance structure RS. Therefore, a voltage that is greater than or equal to the setting voltage $V_{SET}$ is applied to a first anti-fuse AFa of the first anti-fuse structure AF1. For example, because the first conductive path CP1 (see FIG. 9) of the first anti-fuse structure AF1 is formed, the first anti-fuse AFa of the first anti-fuse structure AF1 is programmed to electrically connect the first anti-fuse structure AF1 to the first gate layer G1.

Due to voltage drop caused by the first to third length resistors R12, R23, and R34, a voltage that is lower than the setting voltage $V_{SET}$ is applied to the second to fourth gate layers G2 to G4. Therefore, a difference voltage that is lower than the setting voltage $V_{SET}$ is applied to second to fourth anti-fuses AFb to AFd of the first anti-fuse structure AF1. Therefore, the second to fourth anti-fuses AFb to AFd of the first anti-fuse structure AF1 are not programmed, and the second to fourth gate layers G2 to G4 are not connected to the first anti-fuse structure AF1.

When the second to fourth anti-fuse transistors AT2 to AT4 are turned on, $V_{SET}/2$ is applied to second to fourth anti-fuse conductors AC2 to AC4 of the second to fourth anti-fuse transistors AT2 to AT4. Therefore, a difference voltage that is lower than the setting voltage $V_{SET}$ is applied to first to fourth anti-fuses AFa to AFd of the second to fourth anti-fuse structures AF2 to AF4. Therefore, while the first anti-fuse structure AF1 is being connected to the first gate layer G1, the second to fourth anti-fuse transistors AT2 to AT4 are not connected to the first to fourth gate layers G1 to G4.

Figure 12E:
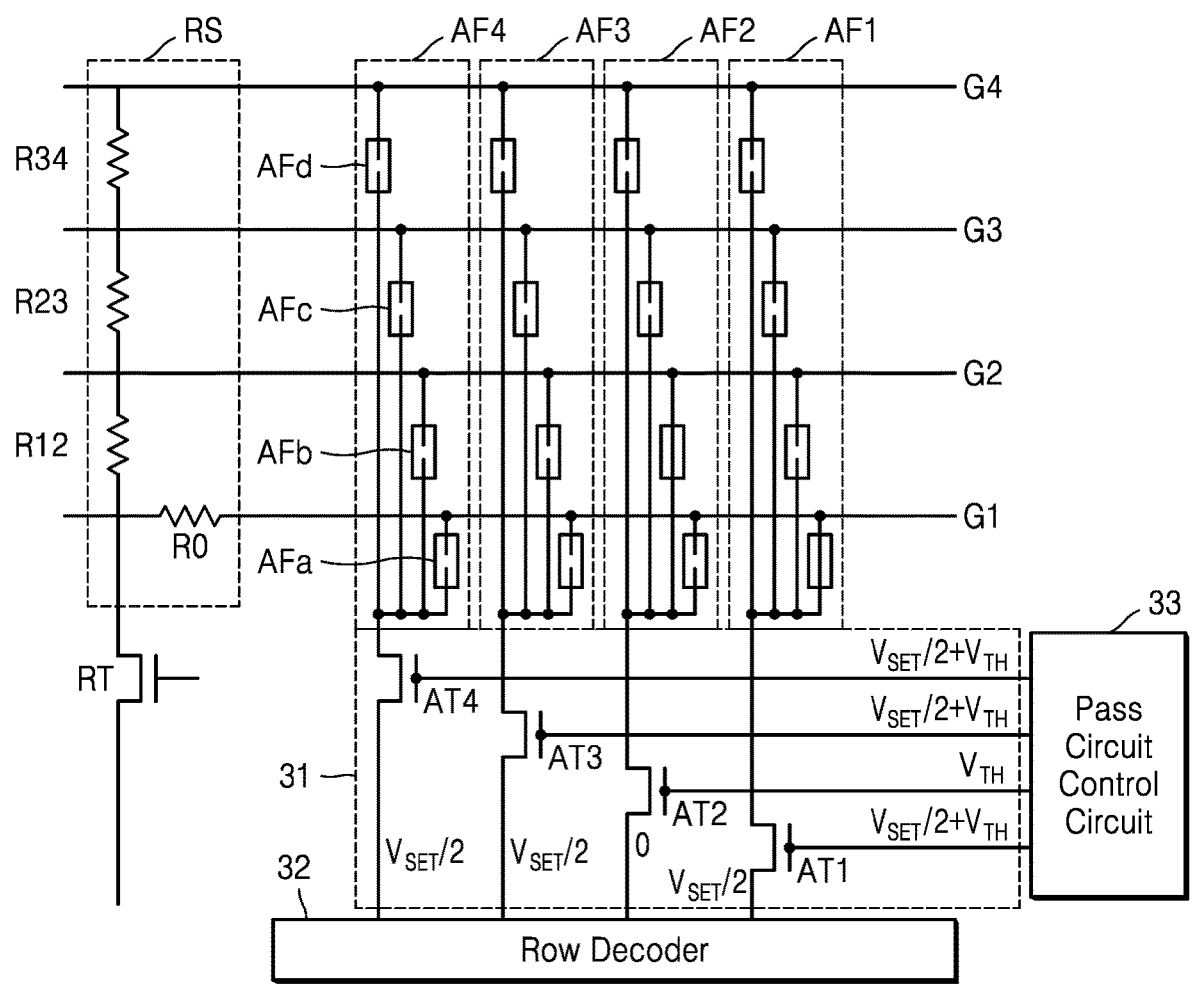

Referring to FIG. 12E, in an embodiment, a second anti-fuse AFb of the second anti-fuse structure AF2 is programmed to connect the second gate layer G2 to the second anti-fuse transistor AT2. For example, a second conductive path CP2 (see FIG. 9) of the second anti-fuse structure AF2 is formed.

The row decoder 32 applies 0 V to the second anti-fuse transistor AT2 and applies $V_{SET}/2$ to the first, third, and fourth anti-fuse transistors AT1, AT3, and AT4. The pass circuit control circuit 33 applies $V_{TH}$ to a gate of the second anti-fuse transistor AT2 to turn on the second anti-fuse transistor AT2. In addition, the pass circuit control circuit 33 applies $V_{SET}/2+V_{TH}$ to the first, third, and fourth anti-fuse transistors AT1, AT3, and AT4 to turn on the first, third, and fourth anti-fuse transistors AT1, AT3, and AT4. The resistance transistor RT applies a voltage to a lower end of the resistance structure RS.

When the second anti-fuse transistor AT2 is turned on, 0 V is applied to a second anti-fuse conductor AC2 of the second anti-fuse structure AF2. A voltage that is greater than or equal to the setting voltage $V_{SET}$ is applied to the second gate layer G2 through the resistance structure RS. Therefore, a voltage which is greater than or equal to the setting voltage $V_{SET}$ is applied to a second anti-fuse AFb of the second anti-fuse structure AF2. For example, because the second conductive path CP2 (see FIG. 9) of the second anti-fuse structure AF2 is formed, the second anti-fuse AFb of the second anti-fuse structure AF2 is programmed to electrically connect the second anti-fuse structure AF2 to the second gate layer G2.

When the first anti-fuse transistor AT1 is turned on, $V_{SET}/2$ is applied to the first gate layer G1. Due to voltage drop caused by the second and third length resistors R23 and R34, a voltage that is lower than the setting voltage $V_{SET}$ is applied to the third and fourth gate layers G3 and G4. Therefore, a difference voltage that is lower than the setting voltage $V_{SET}$ is applied to first, third, and fourth anti-fuses AFa, AFc, and AFd of the second anti-fuse structure AF2, and the first, third, and fourth gate layers G1, G3, and G4 are not connected to the second anti-fuse structure AF2.

When the first, third, and fourth anti-fuse transistors AT1, AT3, and AT4 are turned on, $V_{SET}/2$ is applied to first, third, and fourth anti-fuse conductors AC1, AC3, and AC4 of the first, third, and fourth anti-fuse structures AF1, AF3, and AF4. Therefore, a difference voltage that is lower than the setting voltage $V_{SET}$ is applied to first to fourth anti-fuses AFa to AFd of the first, third, and fourth anti-fuse structures AF1, AF3, and AF4. Therefore, while the first anti-fuse structure AF1 is being connected to the first gate layer G1, and the second anti-fuse structure AF2 is being connected to the second gate layer G2, the first anti-fuse structure AF1 is not connected to the second to fourth gate layers G2 to G4, and the third and fourth anti-fuse structures AF3 and AF4 are not connected to the first to fourth gate layers G1 to G4.

Figure 12F:
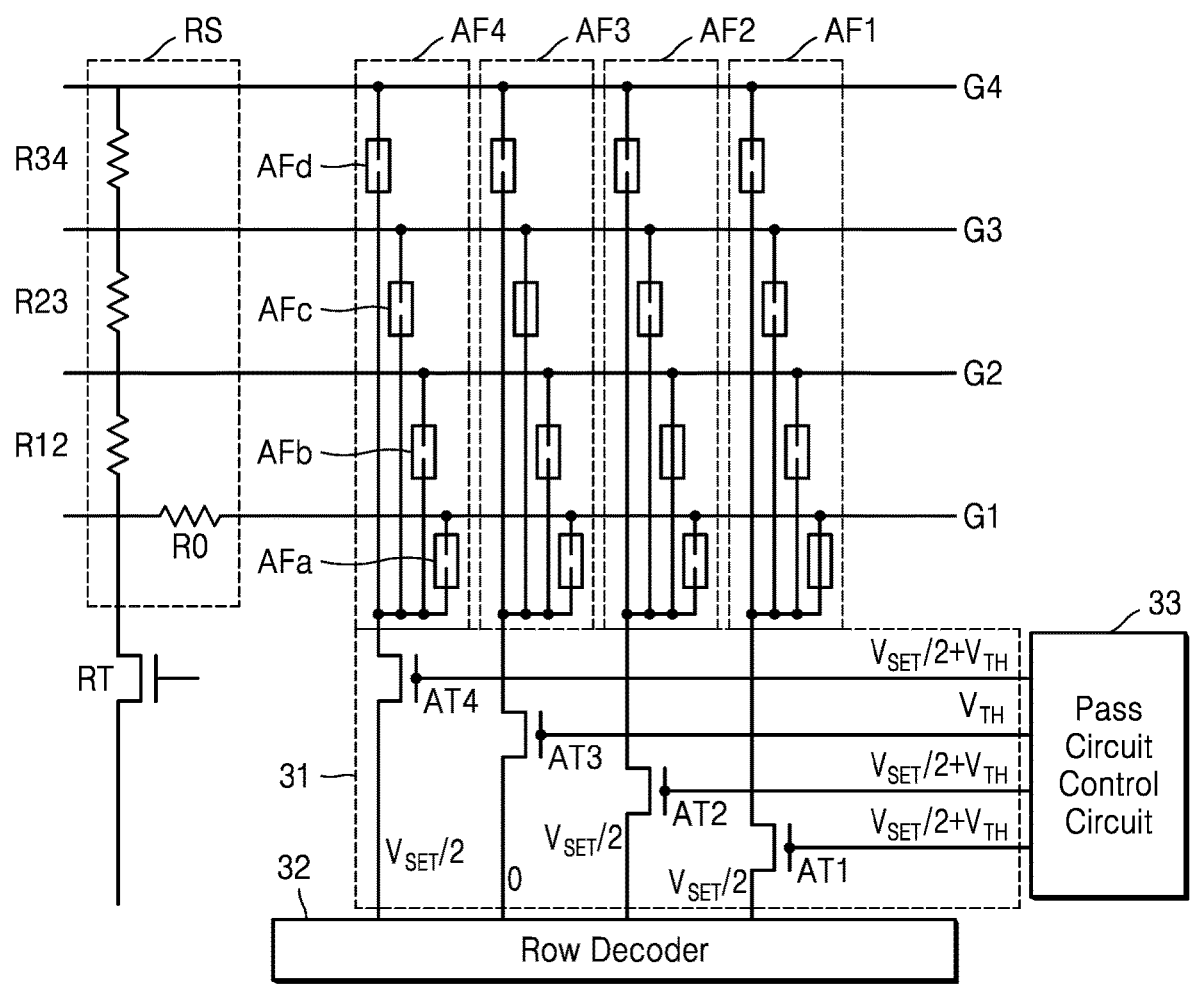

Referring to FIG. 12F, in an embodiment, a third anti-fuse AFc of the third anti-fuse structure AF3 is programmed to connect the third gate layer G3 to the third anti-fuse transistor AT3. For example, a third conductive path CP3 (see FIG. 9) of the third anti-fuse structure AF3 is formed.

The row decoder 32 applies 0 V to the third anti-fuse transistor AT3 and applies $V_{SET}/2$ to the first, second, and fourth anti-fuse transistors AT1, AT2, and AT4. The pass circuit control circuit 33 applies $V_{TH}$ to a gate of the third anti-fuse transistor AT3 to turn on the third anti-fuse transistor AT3. In addition, the pass circuit control circuit 33 applies $V_{SET}/2+V_{TH}$ to the first, second, and fourth anti-fuse transistors AT1, AT2, and AT4 to turn on the first, second, and fourth anti-fuse transistors AT1, AT2, and AT4. The resistance transistor RT applies a voltage to a lower end of the resistance structure RS.

When the third anti-fuse transistor AT3 is turned on, 0 V is applied to a third anti-fuse conductor AC3 of the third anti-fuse structure AF3. A voltage that is greater than or equal to the setting voltage $V_{SET}$ is applied to the third gate layer G3 through the resistance structure RS. Therefore, a voltage that is greater than or equal to the setting voltage $V_{SET}$ is applied to a third anti-fuse AFc of the third anti-fuse structure AF3. For example, because the third conductive path CP3 (see FIG. 9) of the third anti-fuse structure AF3 is formed, the third anti-fuse AFc of the third anti-fuse structure AF3 is programmed to electrically connect the third anti-fuse structure AF3 to the third gate layer G3.

When the first and second anti-fuse transistors AT1 and AT2 are turned on, $V_{SET}/2$ is applied to the first and second gate layers G1 and G2. Due to voltage drop caused by the third length resistor R34, a voltage that is lower than the setting voltage $V_{SET}$ is applied to the fourth gate layer G4. Therefore, a difference voltage that is lower than the setting voltage $V_{SET}$ is applied to first, second, and fourth anti-fuses AFa, AFb, and AFd of the third anti-fuse structure AF3, and the first, second, and fourth gate layers G1, G2, and G4 are not connected to the third anti-fuse structure AF3.

When the first, second, and fourth anti-fuse transistors AT1, AT2, and AT4 are turned on, $V_{SET}/2$ is applied to first, second, and fourth anti-fuse conductors AC1, AC2, and AC4 of the first, second, and fourth anti-fuse structures AF1, AF2, and AF4. Therefore, a difference voltage that is lower than the setting voltage $V_{SET}$ is applied to first to fourth anti-fuses AFa to AFd of the first, second, and fourth anti-fuse structures AF1, AF2, and AF4. Therefore, while the first anti-fuse structure AF1 is being connected to the first gate layer G1, the second anti-fuse structure AF2 is being connected to the second gate layer G2, and the third anti-fuse structure AF3 is being connected to the third gate layer G3, the first anti-fuse structure AF1 is not connected to the second to fourth gate layers G2 to G4, the second anti-fuse structure AF1 is not connected to the first, third and fourth gate layers G1, G3 and G4, and fourth anti-fuse structure AF4 is not connected to the first to fourth gate layers G1 to G4.

Figure 12G:
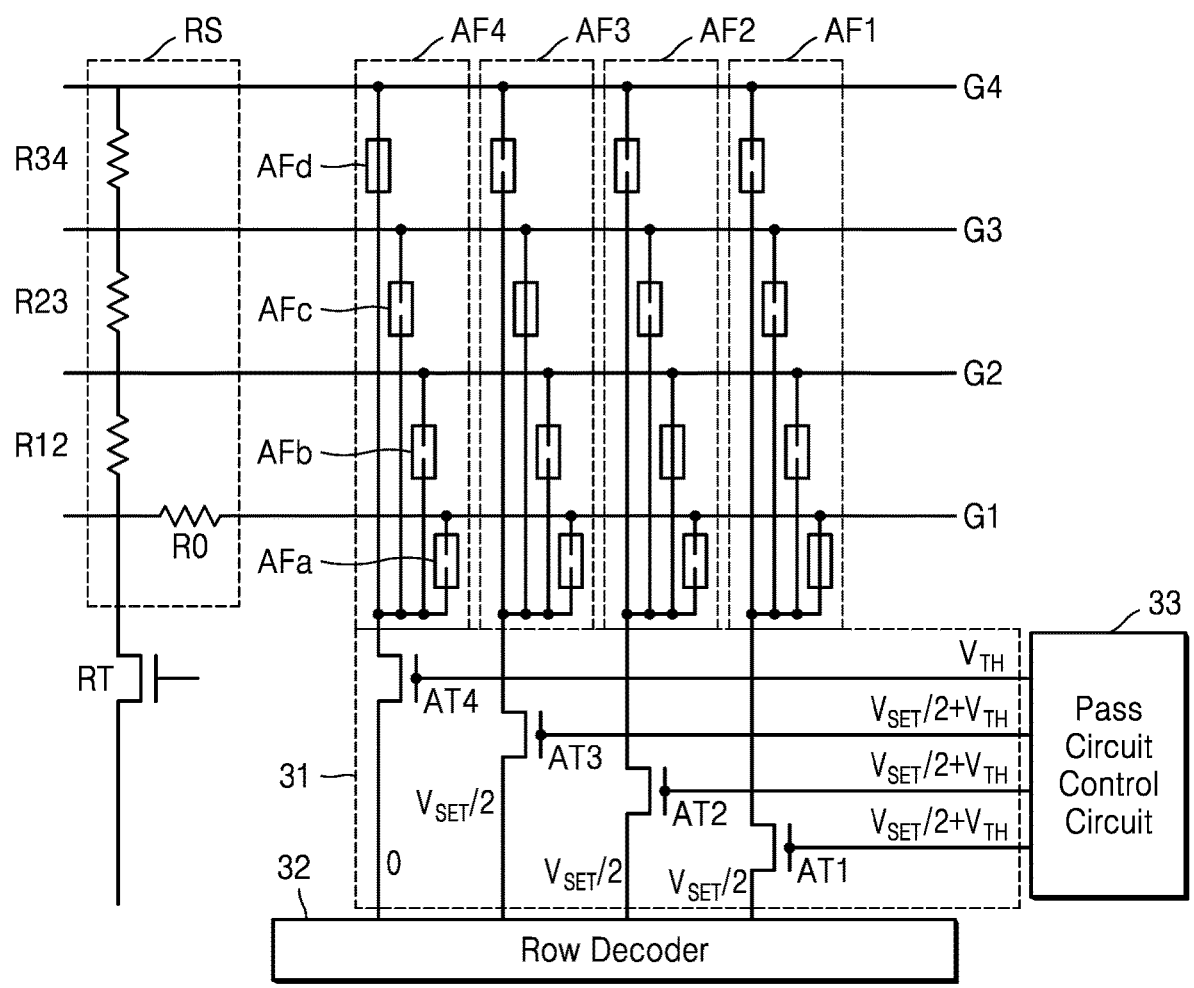

Referring to FIG. 12G, in an embodiment, a fourth anti-fuse AFd of the fourth anti-fuse structure AF4 is programmed to connect the fourth gate layer G4 to the fourth anti-fuse transistor AT4. For example, a fourth conductive path CP4 (see FIG. 9) of the fourth anti-fuse structure AF4 is formed.

The row decoder 32 applies 0 V to the fourth anti-fuse transistor AT4 and applies $V_{SET}/2$ to the first to third anti-fuse transistors AT1 to AT3. The pass circuit control circuit 33 applies $V_{TH}$ to a gate of the fourth anti-fuse transistor AT4 to turn on the fourth anti-fuse transistor AT4. In addition, the pass circuit control circuit 33 applies $V_{SET}/2+V_{TH}$ to the first to third anti-fuse transistors AT1 to AT3 to turn on the first to third anti-fuse transistors AT1 to AT3. The resistance transistor RT applies a voltage to a lower end of the resistance structure RS.

When the fourth anti-fuse transistor AT4 is turned on, 0 V is applied to a fourth anti-fuse conductor AC4 of the fourth anti-fuse structure AF4. A voltage that is greater than or equal to the setting voltage $V_{SET}$ is applied to the fourth gate layer G4 through the resistance structure RS. Therefore, a voltage which is greater than or equal to the setting voltage $V_{SET}$ is applied to a fourth anti-fuse AFd of the fourth anti-fuse structure AF4. For example, because the fourth conductive path CP4 (see FIG. 9) of the fourth anti-fuse structure AF4 is formed, the fourth anti-fuse AFd of the fourth anti-fuse structure AF4 is programmed to electrically connect the fourth anti-fuse structure AF4 to the fourth gate layer G4.

When the first to third anti-fuse transistors AT1 to AT3 are turned on, $V_{SET}/2$ is applied to the first to third gate layers G1 to G3. Therefore, a difference voltage that is lower than the setting voltage $V_{SET}$ is applied to first to third anti-fuses AFa to AFc of the fourth anti-fuse structure AF4, and the first to third gate layers G1 to G3 are not connected to the fourth anti-fuse structure AF4.

When the first to third anti-fuse transistors AT1 to AT3 are turned on, $V_{SET}/2$ is applied to first to third anti-fuse conductors AC1 to AC3 of the first to third anti-fuse structures AF1 to AF3. Therefore, a difference voltage that is lower than the setting voltage $V_{SET}$ is applied to first to fourth anti-fuses AFa to AFd of the first to third anti-fuse structures AF1 to AF3. Therefore, while the first anti-fuse structure AF1 is being connected to the first gate layer G1, the second anti-fuse structure AF2 is being connected to the second gate layer G2, the third anti-fuse structure AF3 is being connected to the third gate layer G3, and the fourth anti-fuse structure AF4 is being connected to the fourth gate layer G4, the first anti-fuse structure AF1 is not connected to the second to fourth gate layers G2 to G4, the second anti-fuse structure AF2 is not connected to the first, third and fourth gate layers G1, G3 and G4, and the third anti-fuse structure AF3 is not connected to the first, second, and fourth gate layers G1, G2 and G4.

Referring to FIGS. 12A and 12B, in an embodiment, the resistance structure RS is removed. For example, the resistance structure RS is removed together with the resistance region RSR of the stack structure SS. In some embodiments, the resistance transistor RT is also removed. Accordingly, the non-volatile memory device 300 illustrated in FIGS. 8 and 9 is completed.

Figure 13:
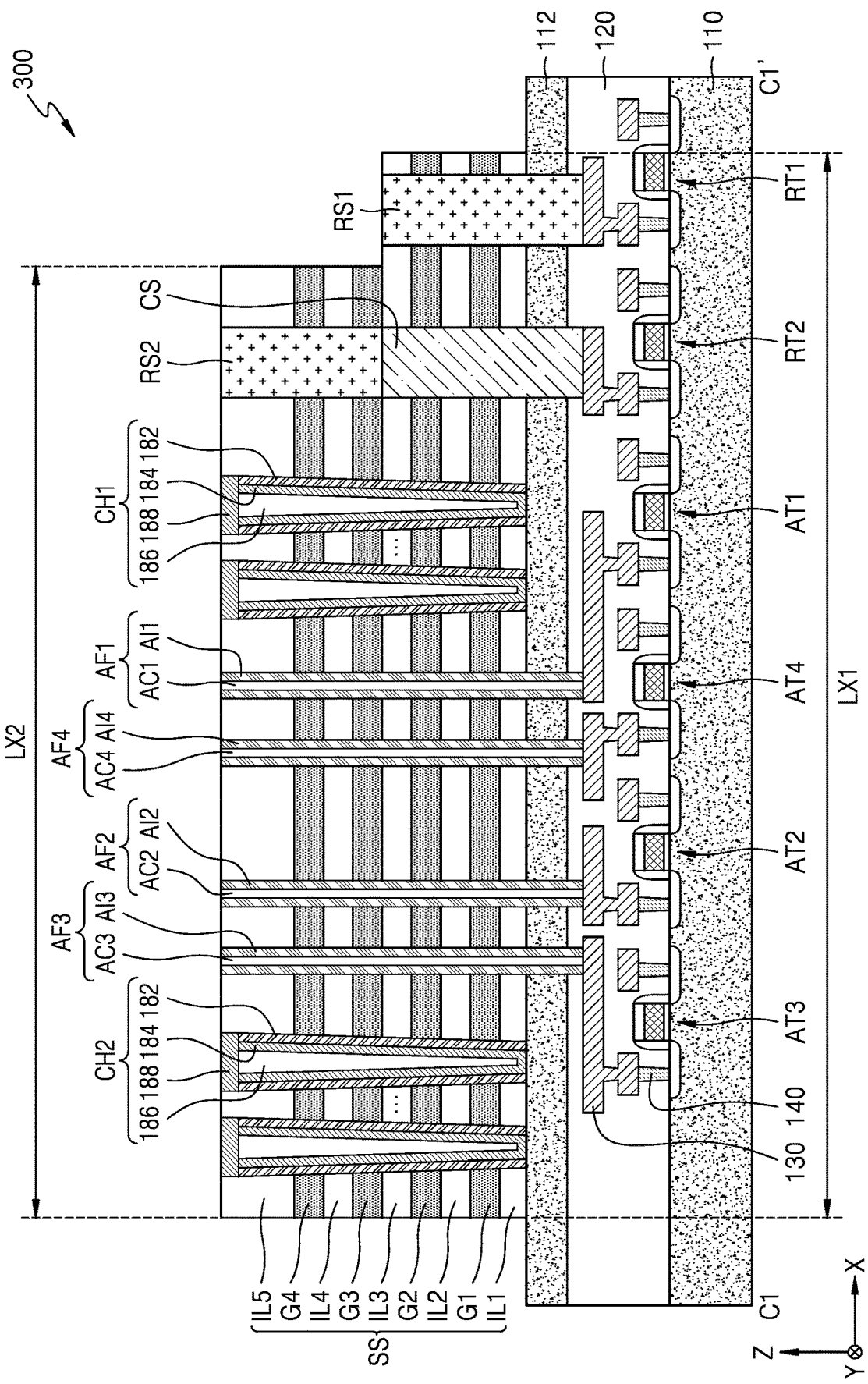
FIG. 13 is a cross-sectional view that illustrates a method of manufacturing a non-volatile memory device, according to an embodiment.

FIG. 13 is a cross-sectional view that illustrates a method of manufacturing a non-volatile memory device 300, according to an embodiment. Hereinafter, a difference between a method of manufacturing the non-volatile memory device illustrated in FIGS. 12A to 12G and a method of manufacturing the non-volatile memory device illustrated in FIG. 13 will be described.

Referring to FIG. 13, in an embodiment, a non-volatile memory device 300, a first partial resistance structure RS1, and a second partial resistance structure RS2 are formed. The first partial resistance structure RS1 penetrates through a first gate layer G1 and a second gate layer G2 in a vertical direction (a Z direction) and is electrically connected to the first gate layer G1 and the second gate layer G2. The first partial resistance structure RS1 electrically connects a first anti-fuse structure AF1 and a second anti-fuse structure AF2 to the first gate layer G1 and the second gate layer G2, respectively. The first partial resistance structure RS1 includes polysilicon. The first partial resistance structure RS1 is electrically connected to a first resistance transistor RT1. The first resistance transistor RT1 applies a voltage to the first partial resistance structure RS1.

The second partial resistance structure RS2 penetrates through a third gate layer G3 and a fourth gate layer G4 in the vertical direction (the Z direction) and is electrically connected to the third gate layer G3 and the fourth gate layer G4. The second partial resistance structure RS2 electrically connects a third anti-fuse structure AF3 and a fourth anti-fuse structure AF4 to the third gate layer G3 and the fourth gate layer G4, respectively. The second partial resistance structure RS2 includes polysilicon.

In some embodiments, a conductive structure CS that electrically connects the second partial resistance structure RS2 to a second resistance transistor RT2 is further formed. The conductive structure CS penetrates through the first gate layer G1 and the second gate layer G2 in the vertical direction (the Z direction). In some embodiments, the conductive structure CS is electrically insulated from the first gate layer G1 and the second gate layer G2. For example, an insulation layer is further formed between a stack structure SS and a sidewall of the conductive structure CS. The second resistance transistor RT2 applies a voltage to the second partial resistance structure RS2.

In some embodiments, a length LX1 of each of the first gate layer G1 and the second gate layer G2 in a first horizontal direction (an X direction) is greater than a length LX2 of each of the third gate layer G3 and the fourth gate layer G4 in the first horizontal direction (the X direction).

The first to fourth anti-fuse structures AF1 to AF4 are connected to the first to fourth gate layers G1 to G4, and then, the first partial resistance structure RS1, the second partial resistance structure RS2, and the conductive structure CS are removed. In some embodiments, an end portion of the stack structure SS is removed. In some embodiments, the first resistance transistor RT1 and the second resistance transistor RT2 are also removed.

Figure 14:
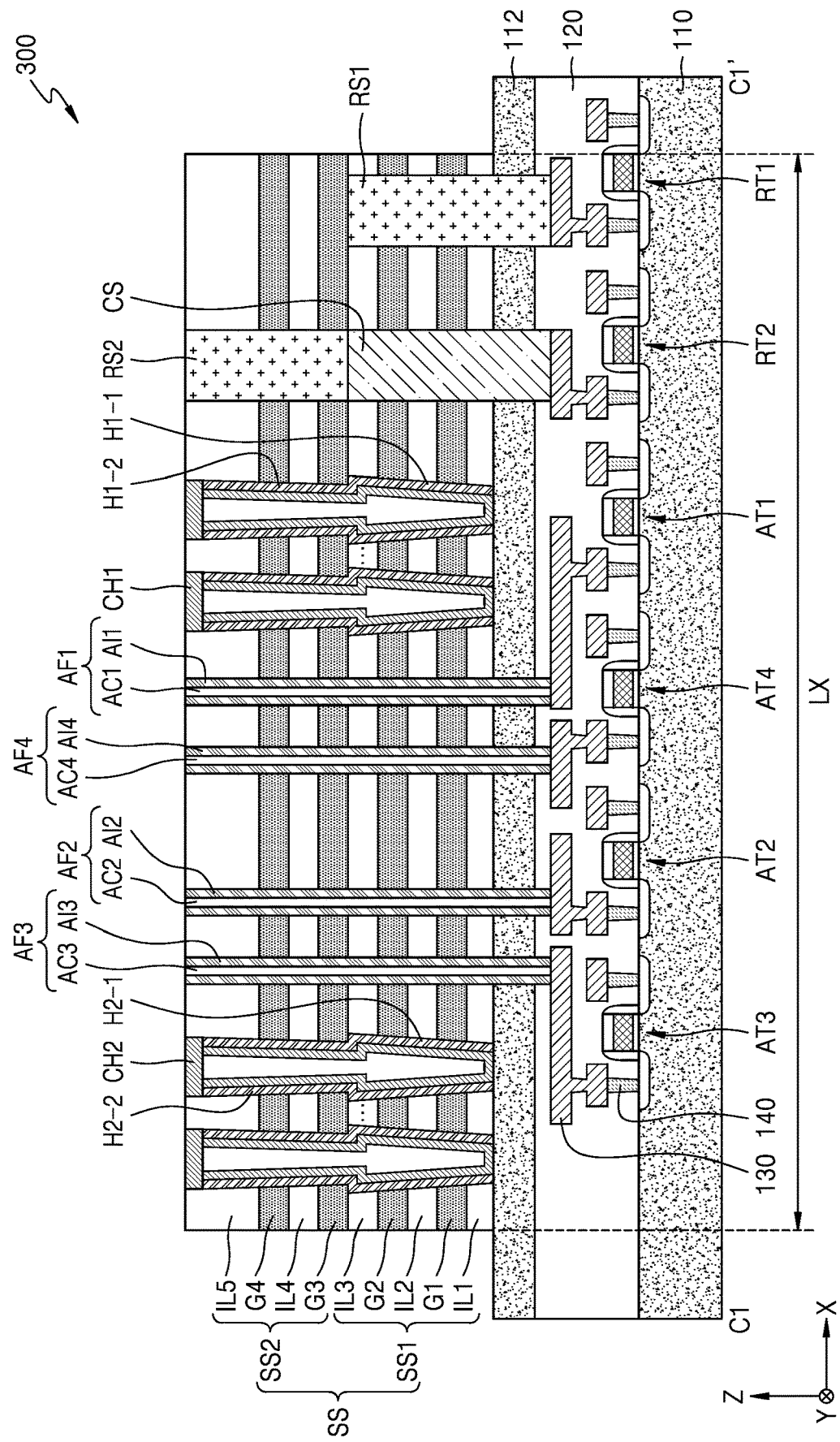
FIG. 14 is a cross-sectional view that illustrates a method of manufacturing a non-volatile memory device, according to an embodiment.

FIG. 14 is a cross-sectional view that illustrates a method of manufacturing a non-volatile memory device, according to an embodiment. Hereinafter, a difference between a method of manufacturing the non-volatile memory device illustrated in FIG. 13 and a method of manufacturing the non-volatile memory device illustrated in FIG. 14 will be described.

Referring to FIG. 14, in an embodiment, a stack structure SS includes a first stack structure SS1 and a second stack structure SS2. The first stack structure SS1 includes first to third interlayer insulation layers 11 to 113 and first and second gate layers G1 and G2. The second stack structure SS2 includes fourth and fifth interlayer insulation layers IL4 and IL5 and third and fourth gate layers G3 and G4. A first channel structure CH1 is formed in a first channel hole H1-1 that penetrates through the first stack structure SS1 and in a second channel hole H1-2 that penetrates through the second stack structure SS2. A second channel structure CH2 is formed in a third channel hole H2-1 that penetrates through the first stack structure SS1 and in a fourth channel hole H2-2 that penetrates through the second stack structure SS2.

In some embodiments, lengths LX of the first to fourth gate layers G1 to G4 in a first horizontal direction (an X direction) are equal. Accordingly, an upper end of the first partial resistance structure RS1 is covered by the second stack structure SS2.

Figure 15:
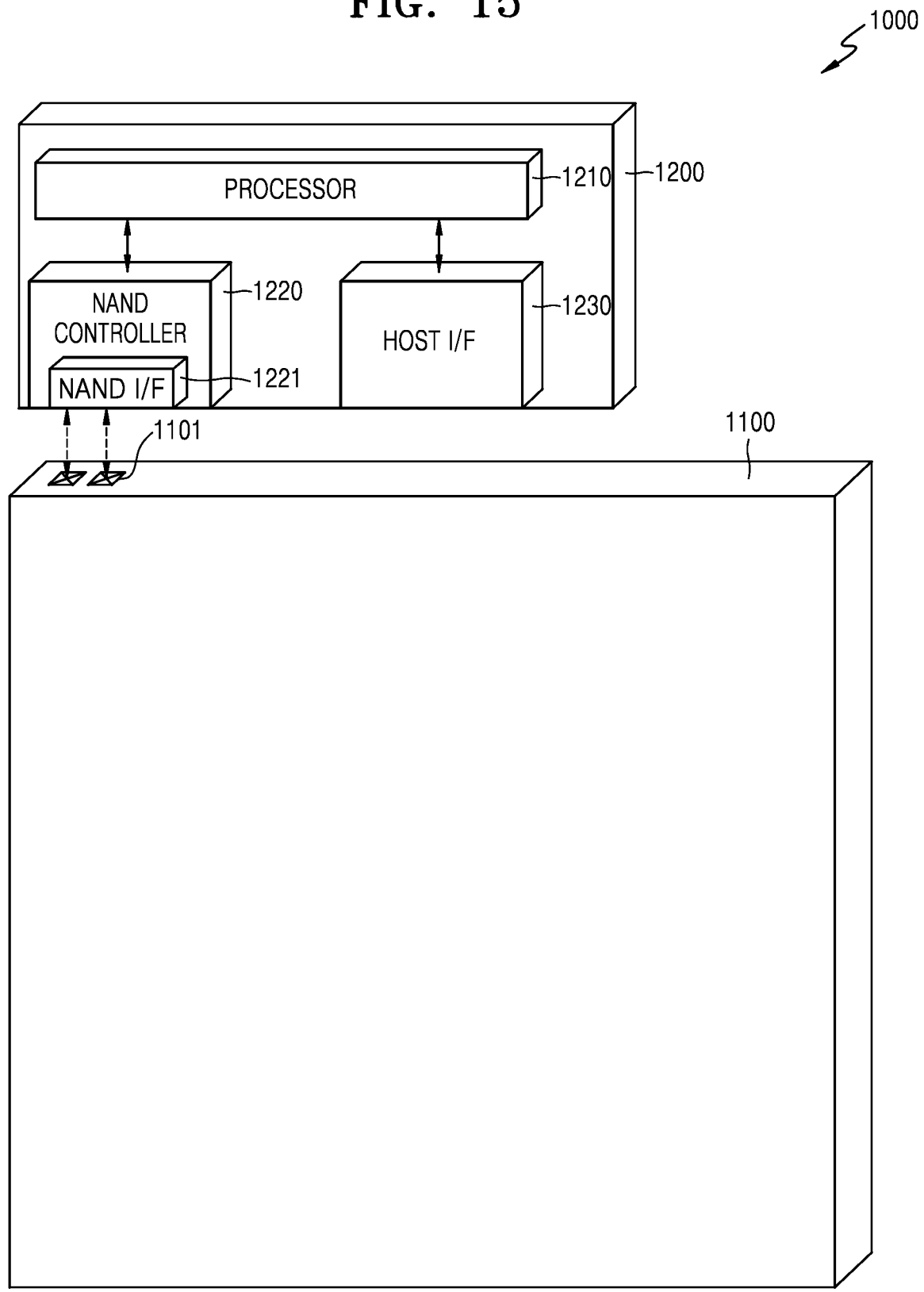
FIG. 15 is a schematic diagram of an electronic system that includes a non-volatile memory device, according to an embodiment.

FIG. 15 is a schematic diagram of an electronic system 1000 that includes a non-volatile memory device 1100, according to an embodiment.

Referring to FIG. 15, the electronic system 1000 according to embodiments includes a non-volatile memory device 1100 and a controller 1200 connected to the non-volatile memory device 1100. The electronic system 1000 includes a storage device that includes one or a plurality of non-volatile memory devices 1100, or an electronic device that includes the storage device. For example, the electronic system 1000 includes a solid state drive (SSD) device, a universal serial bus (USB), a computing system, a medical device, or a communication device that includes at least one semiconductor device 1100.

The non-volatile memory device 1100 includes a flash memory device. For example, the non-volatile memory device 1100 includes at least one of the non-volatile memory device 100 illustrated in FIGS. 1, 3, and 4, the non-volatile memory device 200 illustrated in FIG. 6, the non-volatile memory device 300 illustrated in FIGS. 8 to 10, or the non-volatile memory device 400 illustrated in FIG. 11. The non-volatile memory device 1100 communicates with the controller 1200 through an I/O pad 1101 electrically connected to a control logic 38 (see FIG. 1).

The controller 1200 includes a processor 1210, a NAND controller 1220, and a host interface 1230. According to embodiments, the electronic system 1000 includes a plurality of semiconductor devices 1100, and the controller 1200 controls the plurality of semiconductor devices 1100.

The processor 1210 controls an overall operation of the electronic system 1000 that includes the controller 1200. The processor 1210 operates based on firmware and accesses the non-volatile memory device 1100 under control of the NAND controller 1220. The NAND controller 1220 includes a NAND interface 1221 that communicates with the non-volatile memory device 1100. A control command that controls the non-volatile memory device 1100, data to be written in the non-volatile memory device 1100, and data to be read from the non-volatile memory device 1100 are transmitted through the NAND interface 1221. The host interface 1230 provides a communication function between the electronic system 1000 and an external host. When the control command is received from an external host through the host interface 1230, the processor 1210 controls the non-volatile memory device 1100 in response to the control command.

Figure 16:
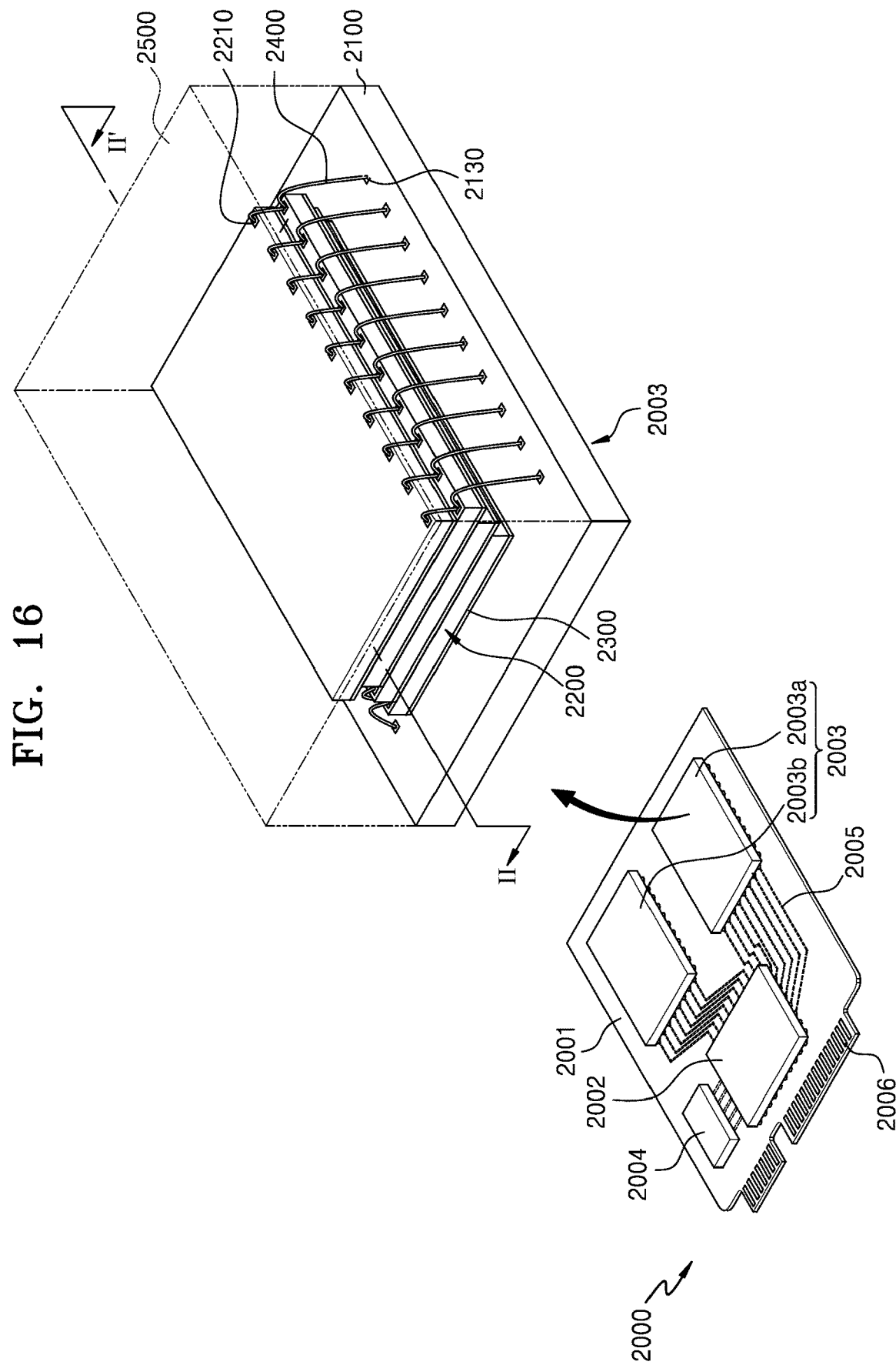
FIG. 16 is a schematic diagram of an electronic system that includes a non-volatile memory device, according to an embodiment.

FIG. 16 is a schematic diagram of an electronic system 2000 that includes a non-volatile memory device, according to an embodiment.

Referring to FIG. 16, in an embodiment, the electronic system 2000 includes a main board 2001, a controller 2002 on the main board 2001, one or more semiconductor packages 2003, and dynamic random access memory (DRAM) 2004. The semiconductor package 2003 and the DRAM 2004 are connected to the controller 2002 by a plurality of wiring patterns 2005 formed in the main board 2001.

The main board 2001 includes a connector 2006 that includes a plurality of pins coupled to the external host. In the connector 2006, the number and arrangement of pins can change based on a communication interface between the electronic system 2000 and the external host. In embodiments, the electronic system 2000 communicates with the external host on the basis of of an interface such as one of a USB, a peripheral component interconnect express (PCI-Express), a serial advanced technology attachment (SATA), or a universal flash storage (UFS) M-Phy. In embodiments, the electronic system 2000 operates with power received from the external host through the connector 2006. The electronic system 2000 further includes a power management integrated circuit (PMIC) that distributes the power received from the external host to the controller 2002 and the semiconductor package 2003.

The controller 2002 can record data in the semiconductor package 2003, or can read data from the semiconductor package 2003, thereby increasing an operation speed of the electronic system 2000.

The DRAM 2004 includes a buffer memory that reduces a speed difference between the external host and the semiconductor package 2003, which is a data storage space. The DRAM 2004 in the electronic system 2000 may operate as a cache memory, or may temporarily store data for a control operation performed on the semiconductor package 2003. When the electronic system 2000 includes the DRAM 2004, the controller 2002 further includes a DRAM controller that controls the DRAM 2004, in addition to a NAND controller that controls the semiconductor package 2003.

The semiconductor package 2003 includes first and second semiconductor packages 2003a and 2003b that are spaced apart from each other. Each of the first and second semiconductor packages 2003a and 2003b includes a semiconductor package that includes a plurality of semiconductor chips. Each of the first and second semiconductor packages 2003a and 2003b includes a package substrate 2100, a plurality of semiconductor chips 2200 on the package substrate 2100, an adhesive layer 2300 on a bottom surface of each of the plurality of semiconductor chips 2200, a connection structure 2400 that electrically connects the plurality of semiconductor chips 2200 to the package substrate 2100, and a molding layer 2500 that covers the plurality of semiconductor chips 2200 and the connection structure 2400 on the package substrate 2100.

The package substrate 2100 includes a printed circuit board (PCB) that includes a plurality of package upper pads 2130. Each of the plurality of semiconductor chips 2200 includes an I/O pad 2210. The I/O pad 2210 corresponds to the I/O pad 1101 of FIG. 15. Each of the plurality of semiconductor chips 2200 includes at least one of the non-volatile memory device 100 illustrated in FIGS. 1, 3, and 4, the non-volatile memory device 200 illustrated in FIG. 6, the non-volatile memory device 300 illustrated in FIGS. 8 to 10, or the non-volatile memory device 400 illustrated in FIG. 11.

In embodiments, the connection structure 2400 is a bonding wire that electrically connects the I/O pad 2210 to the package upper pad 2130. Therefore, in the first and second semiconductor packages 2003a and 2003b, the plurality of semiconductor chips 2200 are electrically connected to each other by a bonding wire scheme and are connected to the package upper pad 2130 of the package substrate 2100. According to embodiments, in the first and second semiconductor packages 2003a and 2003b, the plurality of semiconductor chips 2200 are electrically connected to each other by a connection structure that includes a through silicon via (TSV) instead of the bonding wire scheme.

In embodiments, the controller 2002 and the plurality of semiconductor chips 2200 are included in one package. In embodiments, the controller 2002 and the plurality of semiconductor chips 2200 are mounted on a separate interposer board that differs from the main board 2001, and the controller 2002 and the plurality of semiconductor chips 2200 are electrically connected to each other by a wiring formed in the interposer board.

Figure 17:
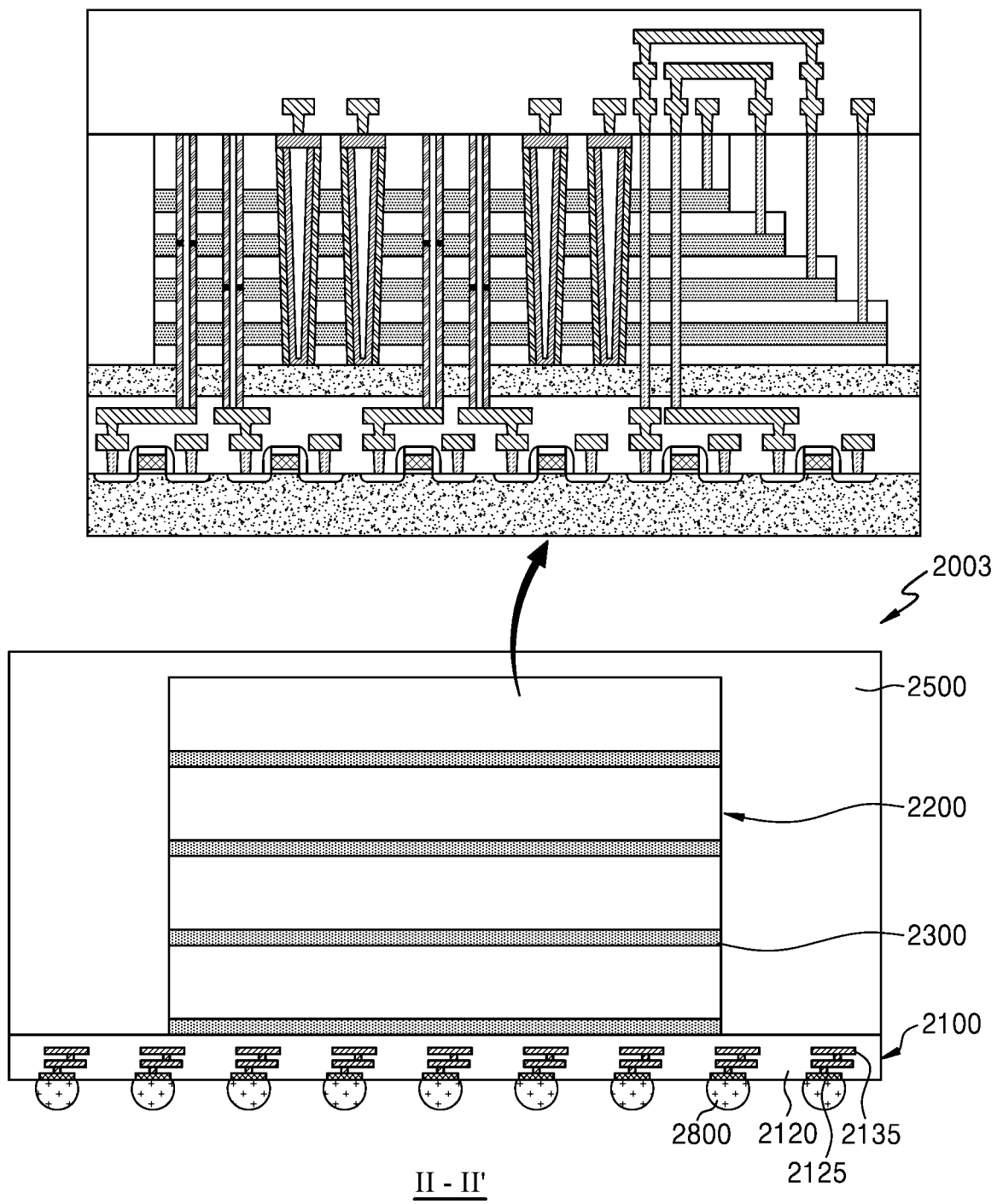
FIG. 17 is a cross-sectional view taken along line II-II' of FIG. 16 of a semiconductor package that includes a non-volatile memory device, according to an embodiment.

FIG. 17 is a cross-sectional view taken along line II-II' of FIG. 16 of a semiconductor package 2003 that includes a non-volatile memory device, according to an embodiment.

Referring to FIG. 17, in an embodiment, in the semiconductor package 2003, a package substrate 2100 is a PCB.

The package substrate 2100 includes a package substrate body portion 2120, a plurality of package upper pads 2130 (see FIG. 16) disposed on a top surface of the package substrate body portion 2120, a plurality of lower pads 2125 disposed on or exposed through a bottom surface of the package substrate body portion 2120, and a plurality of internal wirings 2135 that electrically connect the plurality of package upper pads 2130 to the plurality of lower pads 2125 in the package substrate body portion 2120. The plurality of lower pads 2125 are connected through a plurality of conductive connection portions 2800 to the plurality of wiring patterns 2005 on the main board 2001 of the electronic system 2000 illustrated in FIG. 16. Each of the plurality of semiconductor chips 2200 includes at least one of the non-volatile memory device 100 illustrated in FIGS. 1, 3, and 4, the non-volatile memory device 200 illustrated in FIG. 6, the non-volatile memory device 300 illustrated in FIGS. 8 to 10, or the non-volatile memory device 400 illustrated in FIG. 11.

Embodiments are not for limiting but for describing the inventive concept, and the scope of the inventive concept is not limited by embodiments. The scope of the inventive concept is construed by the appended claims, and all equivalents are construed as being included in the scope of the inventive concept.

While embodiments of the inventive concept has been particularly shown and described with reference to drawings thereof, it will be understood that various changes in form and details may be made therein without departing from the spirit and scope of the following claims.

What is claimed is:

1. A non-volatile memory device, comprising:
a substrate;
a stack structure that includes a first gate layer that extends in a horizontal direction and a second gate layer that extends in the horizontal direction and is disposed apart from the first gate layer in a vertical direction;
a plurality of first channel structures that penetrate in the vertical direction through a first channel region of the stack structure;
a plurality of second channel structures that penetrate in the vertical direction through a second channel region of the stack structure;
a first anti-fuse structure and a second anti-fuse structure that each penetrates in the vertical direction through an anti-fuse region of the stack structure;
a first anti-fuse transistor that is electrically connected to the first gate layer through the first anti-fuse structure; and
a second anti-fuse transistor that is electrically connected to the second gate layer through the second anti-fuse structure, wherein
the first channel region of the stack structure is spaced apart from the second channel region of the stack structure in the horizontal direction, and the anti-fuse region of the stack structure is disposed between the first channel region and the second channel region of the stack structure.

2. The non-volatile memory device of claim 1, further comprising:
a row decoder electrically connected to the first anti-fuse transistor and the second anti-fuse transistor.

3. The non-volatile memory device of claim 1, wherein the first anti-fuse structure comprises a first anti-fuse conductor that penetrates in the vertical direction through the anti-fuse region of the stack structure and is electrically connected to the first anti-fuse transistor, a first anti-fuse insulator that surrounds the first anti-fuse conductor, and a first conductive path that electrically connects the first anti-fuse conductor to the first gate layer across the first anti-fuse insulator, and the second anti-fuse structure comprises a second anti-fuse conductor that penetrates in the vertical direction through the anti-fuse region of the stack structure and is electrically connected to the second anti-fuse transistor, a second anti-fuse insulator that surrounds the second anti-fuse conductor, and a second conductive path that electrically connects the second anti-fuse conductor to the second gate layer across the second anti-fuse insulator.

4. The non-volatile memory device of claim 3, wherein the first conductive path comprises a same material as the material of at least one of the first anti-fuse conductor or the first gate layer, and the second conductive path comprises a same material as the material of at least one of the second anti-fuse conductor or the second gate layer.

5. The non-volatile memory device of claim 3, wherein each of the first conductive path and the second conductive path comprises an oxygen vacancy filament.

6. The non-volatile memory device of claim 1, wherein the stack structure further comprises a step region that includes end portions of the first gate layer and the second gate layer, and the end portions of the first gate layer and the second gate layer have a staircase shape.

7. The non-volatile memory device of claim 1, wherein a length of the first gate layer in the horizontal direction is the same as a length of the second gate layer in the horizontal direction.

8. A non-volatile memory device, comprising:

a substrate;

a stack structure that includes a first gate layer that extends in a horizontal direction on the substrate, a second gate layer that extends in the horizontal direction and is disposed above the first gate layer in a vertical direction, an edge portion where ends of the first gate layer and the second gate layer have a staircase shape, a first channel region next to the edge portion, and a first anti-fuse region next to the first channel region;

a plurality of first channel structures that penetrate in the vertical direction through the first channel region of the stack structure;

a first anti-fuse structure that includes a first anti-fuse conductor that penetrates in the vertical direction through the first anti-fuse region of the stack structure, a first anti-fuse insulator that surrounds the first anti-fuse conductor, and a first conductive path that electrically connects the first anti-fuse conductor to the first gate layer across the first anti-fuse insulator; and a second anti-fuse structure that includes a second anti-fuse conductor that penetrates in the vertical direction through the first anti-fuse region of the stack structure, a second anti-fuse insulator that surrounds the second anti-fuse conductor, and a second conductive path that electrically connects the second anti-fuse conductor to the second gate layer across the second anti-fuse insulator.

9. The non-volatile memory device of claim 8, further comprising:

a first anti-fuse transistor that is electrically connected to the first gate layer through the first anti-fuse structure; and a second anti-fuse transistor that is electrically connected to the second gate layer through the second anti-fuse structure.

10. The non-volatile memory device of claim 9, further comprising:

a first contact plug that extends in the vertical direction and contacts an end portion of the first gate layer;

a second contact plug that extends in the vertical direction and contacts an end portion of the second gate layer;

a first step transistor that is electrically connected to the first gate layer through the first contact plug; and a second step transistor that is electrically connected to the second gate layer through the second contact plug.

11. The non-volatile memory device of claim 10, wherein, in a plan view, a distance between the first anti-fuse structure and the second anti-fuse structure is less than a distance between the first contact plug and the second contact plug.

12. The non-volatile memory device of claim 10, further comprising:

a row decoder that is electrically connected to the first anti-fuse transistor, the second anti-fuse transistor, the first step transistor, and the second step transistor.

13. The non-volatile memory device of claim 10, further comprising:

a pass circuit control circuit that is electrically connected to gates of the first anti-fuse transistor, the second anti-fuse transistor, the first step transistor, and the second step transistor.

14. The non-volatile memory device of claim 10, wherein a gate of the first step transistor is electrically connected to a gate of the first anti-fuse transistor.

15. The non-volatile memory device of claim 10, wherein a gate of the second step transistor is electrically connected to a gate of the second anti-fuse transistor.

16. The non-volatile memory device of claim 10, further comprising:

a third anti-fuse structure that includes a third anti-fuse conductor that penetrates in the vertical direction through a second anti-fuse region of the stack structure, a third anti-fuse insulator that surrounds the third anti-fuse conductor, and a third conductive path that electrically connects the third anti-fuse conductor to the first gate layer across the third anti-fuse insulator;

a fourth anti-fuse structure that includes a fourth anti-fuse conductor that penetrates in the vertical direction through the second anti-fuse region of the stack structure, a fourth anti-fuse insulator that surrounds the fourth anti-fuse conductor, and a fourth conductive path that electrically connects the fourth anti-fuse conductor to the second gate layer across the fourth anti-fuse insulator;

a third anti-fuse transistor that is electrically connected to the first gate layer through the third anti-fuse structure; and a fourth anti-fuse transistor that is electrically connected to the second gate layer through the fourth anti-fuse structure.

17. The non-volatile memory device of claim 16, further comprising:

a plurality of second channel structures that penetrate in the vertical direction through a second channel region of the stack structure, wherein the second channel region of the stack structure is disposed between the second anti-fuse region and the first anti-fuse region of the stack structure.

18. The non-volatile memory device of claim 16, further comprising:
a row decoder that is electrically connected to the first anti-fuse transistor, the second anti-fuse transistor, the third anti-fuse transistor, the fourth anti-fuse transistor, the first step transistor, and the second step transistor.

19. A non-volatile memory device, comprising:
a substrate;
a stack structure that includes a first gate layer that extends in a horizontal direction, a second gate layer that extends in the horizontal direction and is disposed apart from the first gate layer in a vertical direction, a first channel region, a second channel region spaced apart from the first channel region in the horizontal direction, and an anti-fuse region disposed between the first channel region and the second channel region, wherein a length of the first gate layer in the horizontal direction is the same as a length of the second gate layer in the horizontal direction;
a plurality of first channel structures that penetrate in the vertical direction through the first channel region of the stack structure;
a plurality of second channel structures that penetrate in the vertical direction through the second channel region of the stack structure;
a first anti-fuse structure that includes a first anti-fuse conductor that penetrates in the vertical direction through a anti-fuse region of the stack structure, a first anti-fuse insulator that surrounds the first anti-fuse conductor, and a first conductive path that electrically connects the first anti-fuse conductor to the first gate layer across the first anti-fuse insulator;
a second anti-fuse structure that includes a second anti-fuse conductor that penetrates in the vertical direction through the anti-fuse region of the stack structure, a second anti-fuse insulator that surrounds the second anti-fuse conductor, and a second conductive path that electrically connects the second anti-fuse conductor to the second gate layer across the second anti-fuse insulator;
a first anti-fuse transistor that is electrically connected to the first gate layer through the first anti-fuse structure; and
a second anti-fuse transistor that is electrically connected to the second gate layer through the second anti-fuse structure.

* * * * *